(12) United States Patent
Lius et al.

(10) Patent No.: US 11,394,001 B2
(45) Date of Patent: Jul. 19, 2022

(54) DISPLAY DEVICE

(71) Applicant: InnoLux Corporation, Miao-Li County (TW)

(72) Inventors: Chandra Lius, Miao-Li County (TW); Yu-Sheng Tsai, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 81 days.

(21) Appl. No.: 16/924,439

(22) Filed: Jul. 9, 2020

(65) Prior Publication Data

US 2020/0343471 A1    Oct. 29, 2020

Related U.S. Application Data

(63) Continuation of application No. 15/649,701, filed on Jul. 14, 2017, now Pat. No. 10,763,451.

(60) Provisional application No. 62/382,281, filed on Sep. 1, 2016.

(30) Foreign Application Priority Data

Feb. 9, 2017    (CN) .......................... 201710071011.2

(51) Int. Cl.
| | |
|---|---|
| *H01L 27/12* | (2006.01) |
| *H01L 51/52* | (2006.01) |
| *H01L 51/05* | (2006.01) |
| *H01L 27/32* | (2006.01) |
| *H01L 51/42* | (2006.01) |

(52) U.S. Cl.
CPC ...... *H01L 51/5203* (2013.01); *H01L 27/3262* (2013.01); *H01L 27/3265* (2013.01); *H01L 27/3272* (2013.01); *H01L 51/0508* (2013.01); *H01L 51/5296* (2013.01); *H01L 51/05* (2013.01); *H01L 51/4273* (2013.01)

(58) Field of Classification Search
None
See application file for complete search history.

(56) References Cited

U.S. PATENT DOCUMENTS

| | | | | |
|---|---|---|---|---|
| 2003/0156084 A1* | 8/2003 | Tsuchiya | .............. | G09G 3/3233 345/84 |
| 2014/0299842 A1* | 10/2014 | Kim | .................... | H01L 27/3262 257/40 |
| 2015/0055051 A1* | 2/2015 | Osawa | ................ | H01L 27/3262 349/48 |

* cited by examiner

*Primary Examiner* — Joseph C. Nicely
*Assistant Examiner* — Lamont B Koo
(74) *Attorney, Agent, or Firm* — McClure, Qualey & Rodack, LLP

(57) ABSTRACT

A display device including a substrate, a first transistor, a second transistor, and a first capacitor electrode is provided. The first transistor is disposed above the substrate and includes a first semiconductor layer, a first gate electrode, and a first gate insulator layer. The first semiconductor layer includes a silicon semiconductor layer. The first gate electrode overlaps the first semiconductor layer. The first gate insulator layer is disposed between the first semiconductor layer and the first gate electrode. The second transistor is disposed above the substrate and includes a second semiconductor layer and a second gate electrode. The second semiconductor layer includes an oxide semiconductor layer. The second gate electrode overlaps the second semiconductor layer. The first capacitor electrode overlaps the second gate electrode. The first gate insulator is disposed above the first capacitor electrode.

8 Claims, 34 Drawing Sheets

DISPLAY DEVICE

CROSS REFERENCE TO RELATED APPLICATIONS

This application is a Continuation application of U.S. patent application Ser. No. 15/649,701, filed on Jul. 14, 2017, now U.S. Pat. No. 10,763,451, which claims priority to U.S. Provisional Application Ser. No. 62/382,281, filed on Sep. 1, 2016, and China Patent Application No. 201710071011.2, filed on Feb. 9, 2017, the entirety of which are incorporated by reference herein.

BACKGROUND OF THE DISCLOSURE

Field of the Disclosure

The disclosure relates to a semiconductor structure, and more particularly to a semiconductor structure of a display device.

DESCRIPTION OF THE RELATED ART

Flat-panel displays have become widely used in recent years as they possess such favorable advantages as having a thin profile, light weight, and low radiation. The thin-film transistors (TFTs) in these displays can be polysilicon TFTs, which have high carrier mobility, or they can be metal oxide TFTs, which have low leakage current. However, polysilicon TFTs and the metal oxide TFTs cannot be combined in a display. Additionally, no related circuits are provided.

BRIEF SUMMARY OF THE DISCLOSURE

In accordance with an embodiment, a display device comprises a substrate, a first transistor, a second transistor, and a first capacitor electrode. The first transistor is disposed above the substrate and comprises a first semiconductor layer, a first gate electrode, and a first gate insulator layer. The first semiconductor layer comprises a silicon semiconductor layer. The first gate electrode overlaps the first semiconductor layer. The first gate insulator layer is disposed between the first semiconductor layer and the first gate electrode. The second transistor is disposed above the substrate and comprises a second semiconductor layer and a second gate electrode. The second semiconductor layer comprises an oxide semiconductor layer. The second gate electrode overlaps the second semiconductor layer. The first capacitor electrode overlaps the second gate electrode. The first gate insulator is disposed above the first capacitor electrode.

In accordance with another embodiment, a display device comprises a substrate, a first transistor, a second transistor, and a first capacitor electrode. The first transistor is disposed above the substrate and comprises a first semiconductor layer and a first gate electrode. The first gate electrode is disposed above the first semiconductor layer. The second transistor is disposed above the substrate and comprises a second semiconductor layer. The first capacitor electrode is disposed above the first semiconductor layer. The first capacitor electrode overlaps the first gate electrode. One of the first semiconductor layer and the second semiconductor layer comprises a silicon semiconductor layer and the other of the first semiconductor layer and the second semiconductor layer comprises an oxide semiconductor layer.

In accordance with another embodiment, a display device comprises a substrate, a first transistor, a second transistor, an electrode, and a capacitor. The first transistor comprises a first semiconductor layer and a first gate electrode. The first semiconductor layer is formed on the substrate and comprises a first source electrode and a first drain electrode. The first gate electrode overlaps the first semiconductor layer. The second transistor comprises a second semiconductor layer and a second gate electrode. The second semiconductor layer is formed on the substrate and comprises a second source electrode and a second drain electrode. The second gate electrode and the second semiconductor layer overlap. The electrode is formed on the first semiconductor layer and the second semiconductor layer and serves as an anode of a light-emitting diode. The capacitor is coupled between a specific metal layer and a capacitor electrode. The capacitor electrode and the specific electrode are different from the electrode.

BRIEF DESCRIPTION OF THE DRAWINGS

The disclosure can be more fully understood by referring to the following detailed description and examples with references made to the accompanying drawings, wherein.

DETAILED DESCRIPTION OF THE DISCLOSURE

Figure 1:
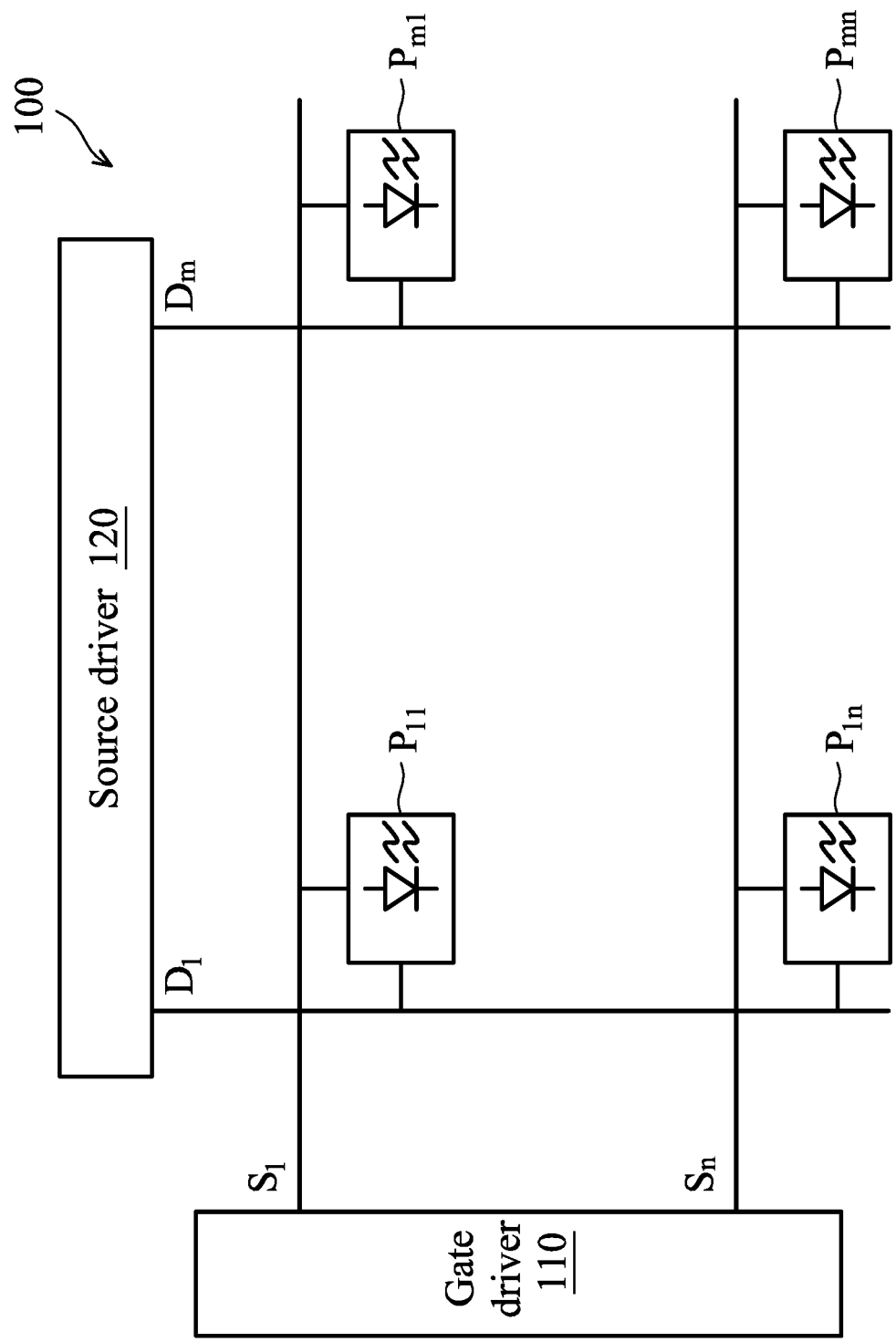
FIG. 1 is a schematic diagram of an exemplary embodiment of a display device, according to various aspects of the present disclosure.

The present disclosure will be described with respect to particular embodiments and with reference to certain drawings, but the disclosure is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the disclosure.

Furthermore, the ordinals recited in the specification and the claims such as "first", "second" and so on are intended only to describe the elements claimed and imply or represent neither that the claimed elements have any proceeding ordinals, nor that sequence between one claimed element and another claimed element or between steps of a manufacturing method. The use of these ordinals is merely to differentiate one claimed element having a certain designation from another claimed element having the same designation.

Furthermore, the ordinals recited in the specification and the claims such as "above", "over", or "on" are intended not only directly contact with the other substrate or film, but also intended indirectly contact with the other substrate or film.

FIG. 1 is a schematic diagram of an exemplary embodiment of a display device, according to various aspects of the present disclosure. The display device 100 comprises a gate driver 110, a source driver 120 and a plurality of pixels $P_{11} \sim P_{mn}$. The gate driver 110 is configured to provide scan signals $S_1 \sim S_n$. The source driver 120 is configured to provide data signals $D_1 \sim D_m$. Each of the pixels $P_{11} \sim P_{mn}$ receives a corresponding scan signal and a corresponding data signal. For example, the pixel $P_{11}$ receives the scan signal $S_1$ and the data signal $D_1$. In this embodiment, each of the pixels $P_{11} \sim P_{mn}$ comprises an organic light-emitting diode (OLED).

Figure 2A:
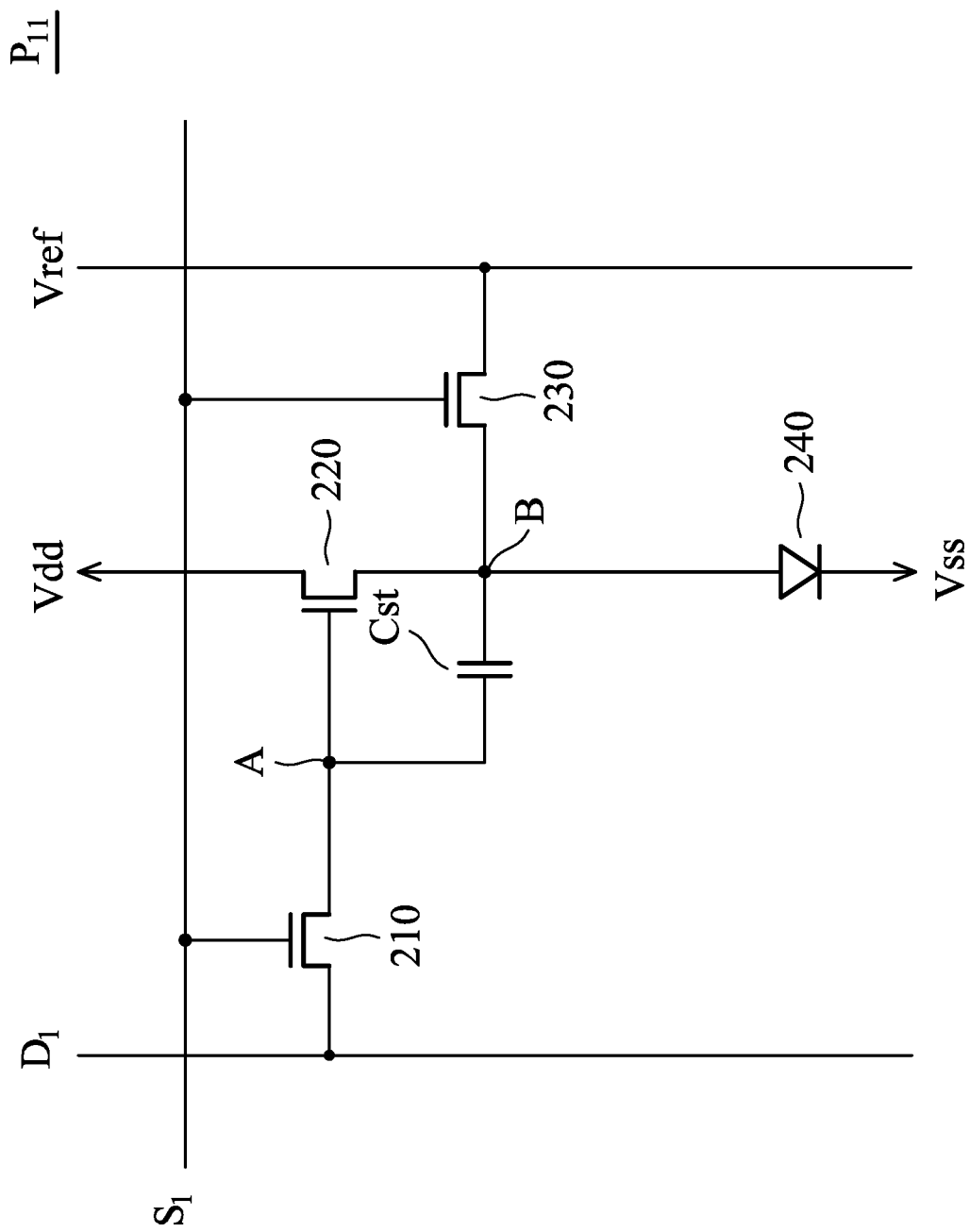
FIG. 2A is a schematic diagram of an exemplary embodiment of a pixel, according to various aspects of the present disclosure.

The disclosure is not limited by the circuit structure of the pixels $P_{11} \sim P_{mn}$. In one embodiment, each of the pixels $P_{11} \sim P_{mn}$ comprises a storage capacitor to store a driving voltage. The driving voltage is utilized to light a corresponding OLED. FIG. 2A is a schematic diagram of an exemplary embodiment of a pixel, according to various aspects of the present disclosure. Since the circuit structures of the pixels $P_{11} \sim P_{mn}$ are the same, only the circuit structure of the pixel $P_{11}$ is shown in FIG. 2A. As shown in FIG. 2A, the pixel $P_{11}$ comprises a switching transistor 210, a driving transistor 220, a reset transistor 230, a storage capacitor Cst, and an OLED 240.

The gate electrode of the switching transistor 210 receives the scan signal $S_1$. The drain of the switching transistor 210 receives the data signal $D_1$. The source of the switching transistor 210 is coupled to the node A. The gate electrode of the driving transistor 220 is coupled to the node A. The drain of the driving transistor 220 receives the operation voltage Vdd. The source of the driving transistor 220 is coupled to the node B. The storage capacitor Cst is coupled between the node A and the node B. The gate electrode of the reset transistor 230 receives the scan signal $S_1$. The drain of the reset transistor 230 receives the reference voltage Vref. The source of the reset transistor 230 is coupled to the node B. The anode of the OLED 240 is coupled to the node B. The cathode of the OLED 240 receives the operation voltage Vss.

The gap between the gate and the source of the driving transistor 220 is reduced as the size of the display panel reduces. Therefore, the capacitance of the storage capacitor is reduced. In this case, at least one capacitor electrode and a specific metal layer are utilized to form a storage capacitor or an auxiliary capacitor to increase the capacitance of the storage capacitor Cst. In one embodiment, the absolute value of the electrical potential of the capacitor electrode is greater than 0. The disclosure is not limited by the kind of specific metal layer. In one embodiment, the specific metal layer is the gate electrode of the driving transistor 220 or the anode of the OLED 240. Furthermore, the disclosure is not limited by the position of the capacitor electrode. The position of the capacitor electrode is described in greater detail with reference to FIG. 4A, FIG. 4B, FIG. 4C, FIG. 4D, FIG. 5, FIG. 6, FIG. 7, FIG. 8A, FIG. 8B, FIG. 9, FIG. 10A, FIG. 10B, FIG. 10C, FIG. 10D, FIG. 10E, FIG. 10F, FIG. 11A, FIG. 11B, FIG. 11C, FIG. 12, FIG. 13, FIG. 14, FIG. 15, FIG. 16A, and FIG. 16B.

Figure 2B:
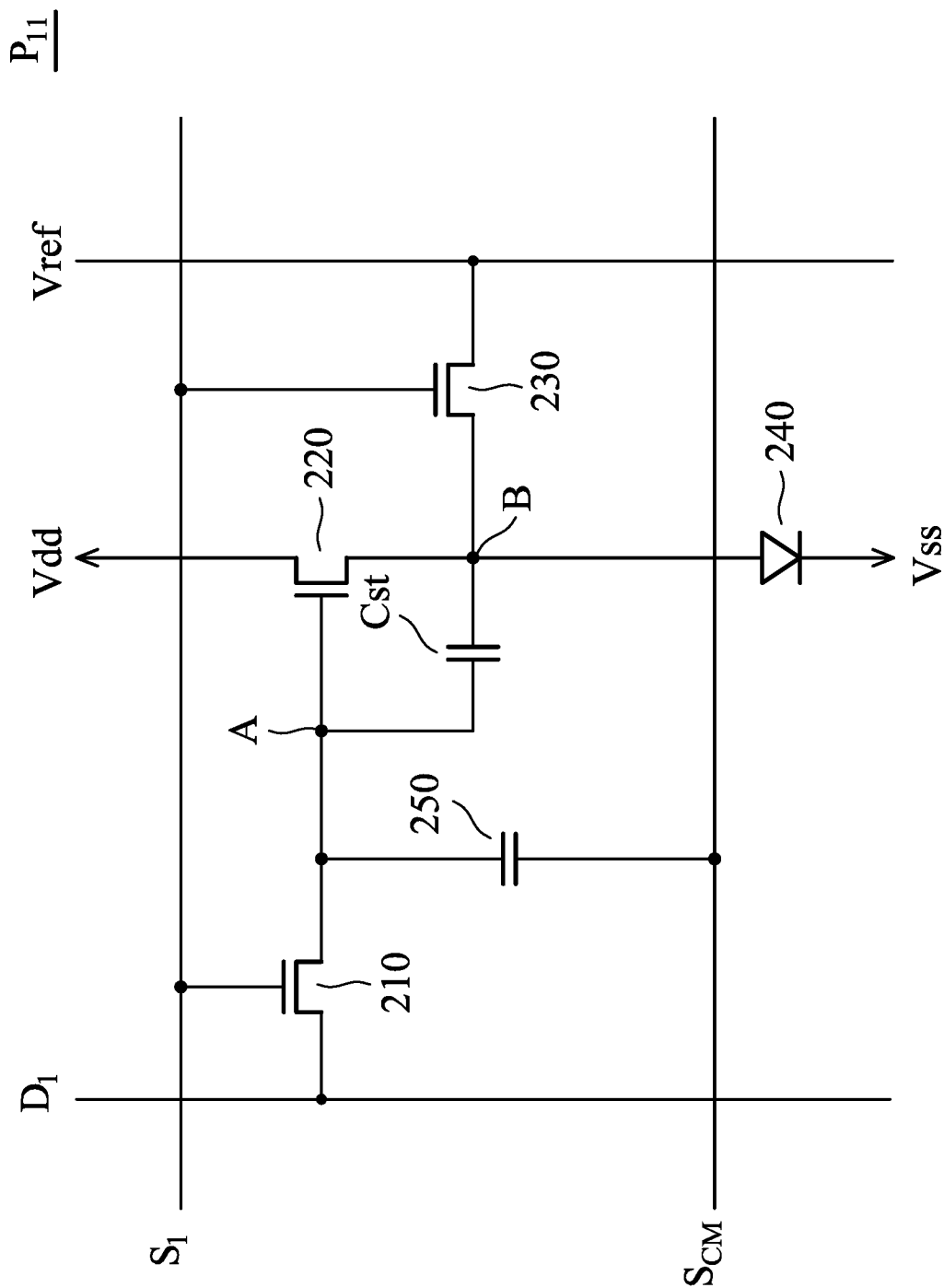
FIG. 2B is a schematic diagram of another exemplary embodiment of the pixel, according to various aspects of the present disclosure.

FIG. 2B is a schematic diagram of another exemplary embodiment of the pixel, according to various aspects of the present disclosure. FIG. 2B is similar to FIG. 2A except for the addition of the auxiliary capacitor 250. One terminal of the auxiliary capacitor 250 receives a predetermined voltage $S_{CM}$ and the other terminal of the auxiliary capacitor 250 is coupled to the node A. The auxiliary capacitor 250 is configured to stabilize or adjust the voltage level of the node A. In this embodiment, at least one capacitor electrode is added to form the auxiliary capacitor 250 in the pixel $P_{11}$. If a predetermined voltage $S_{CM}$ is provided to the capacitor electrode, the voltage of the node A can be stabilized or adjusted. In one embodiment, the absolute value of the level of the predetermined voltage $S_{CM}$ is greater than 0.

Figure 2C:
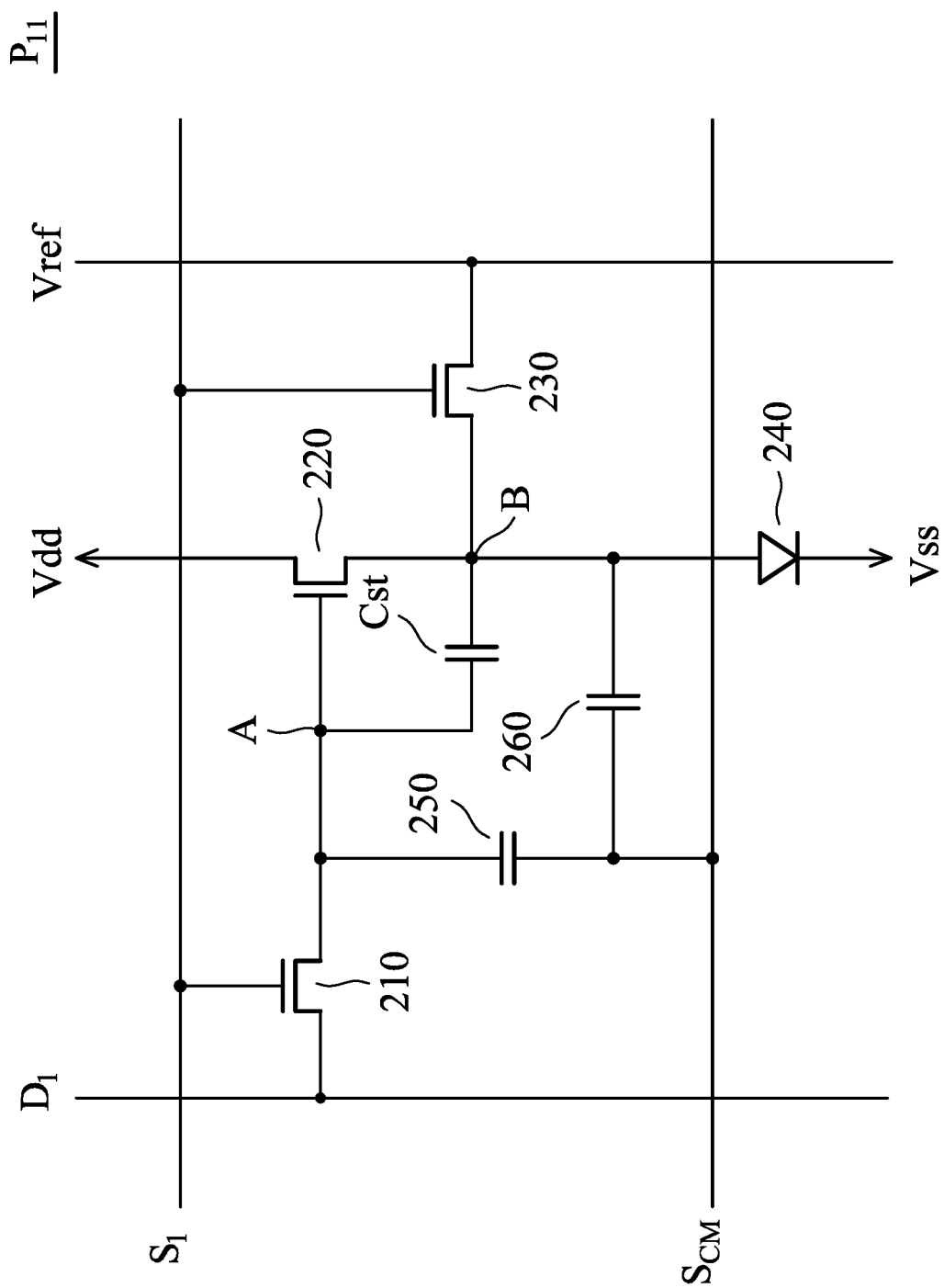
FIG. 2C is a schematic diagram of another exemplary embodiment of the pixel, according to various aspects of the present disclosure.

FIG. 2C is a schematic diagram of another exemplary embodiment of the pixel, according to various aspects of the present disclosure. FIG. 2C is similar to FIG. 2B except for the addition of the auxiliary capacitor 260. One terminal of the auxiliary capacitor 260 receives the predetermined voltage $S_{CM}$. The other terminal of the auxiliary capacitor 260 is coupled to the node B to stabilize or adjust the voltage level of the node B. In such cases, at least one capacitor electrode is added in the pixel $P_{11}$ to form the capacitor electrode auxiliary capacitor 250 and the auxiliary capacitor 260. When the capacitor electrode receives the predetermined voltage $S_{CM}$, the voltage level of the node A and the voltage level of the node B can be stabilized or adjusted. In one embodiment, the operation voltage Vdd, the operation voltage Vss, the reference voltage Vref, and the predetermined voltage $S_{CM}$ may be provided by the gate driver 110, the source driver 120 or other chips.

Figure 2D:
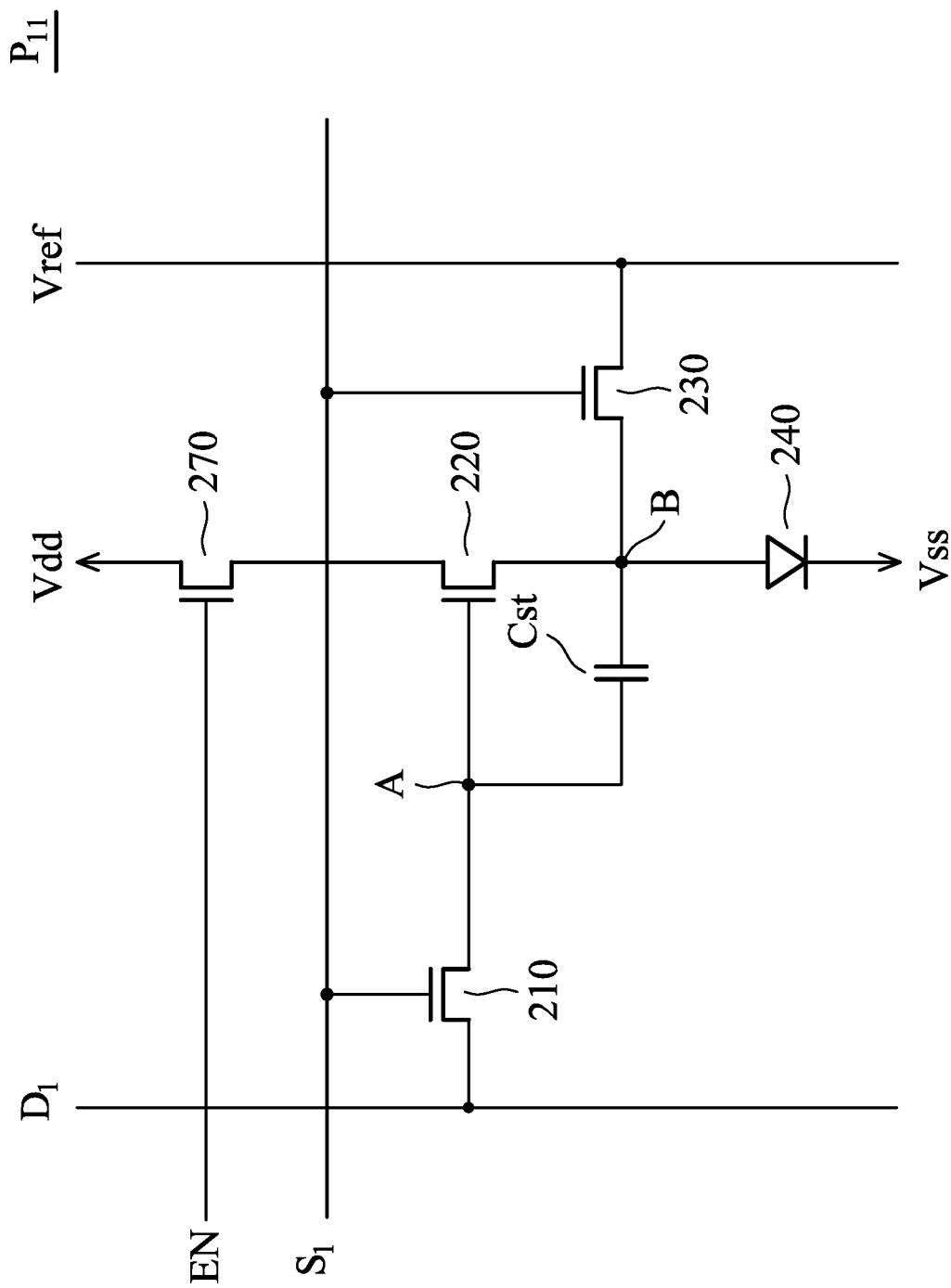
FIG. 2D is a schematic diagram of another exemplary embodiment of the pixel, according to various aspects of the present disclosure.

FIG. 2D is a schematic diagram of another exemplary embodiment of the pixel, according to various aspects of the present disclosure. FIG. 2D is similar to FIG. 2A except that the pixel shown in FIG. 2D further comprises an emitting transistor 270. The gate electrode of the emitting transistor 270 receives an emitting signal EN. The drain of the emitting transistor 270 receives the operation voltage Vdd. The source of the emitting transistor 270 is coupled to the drain of the driving transistor 220. In other embodiments, the emitting transistor 270 shown in FIG. 2D can be applied to FIG. 2B or FIG. 2C.

Figure 3A:
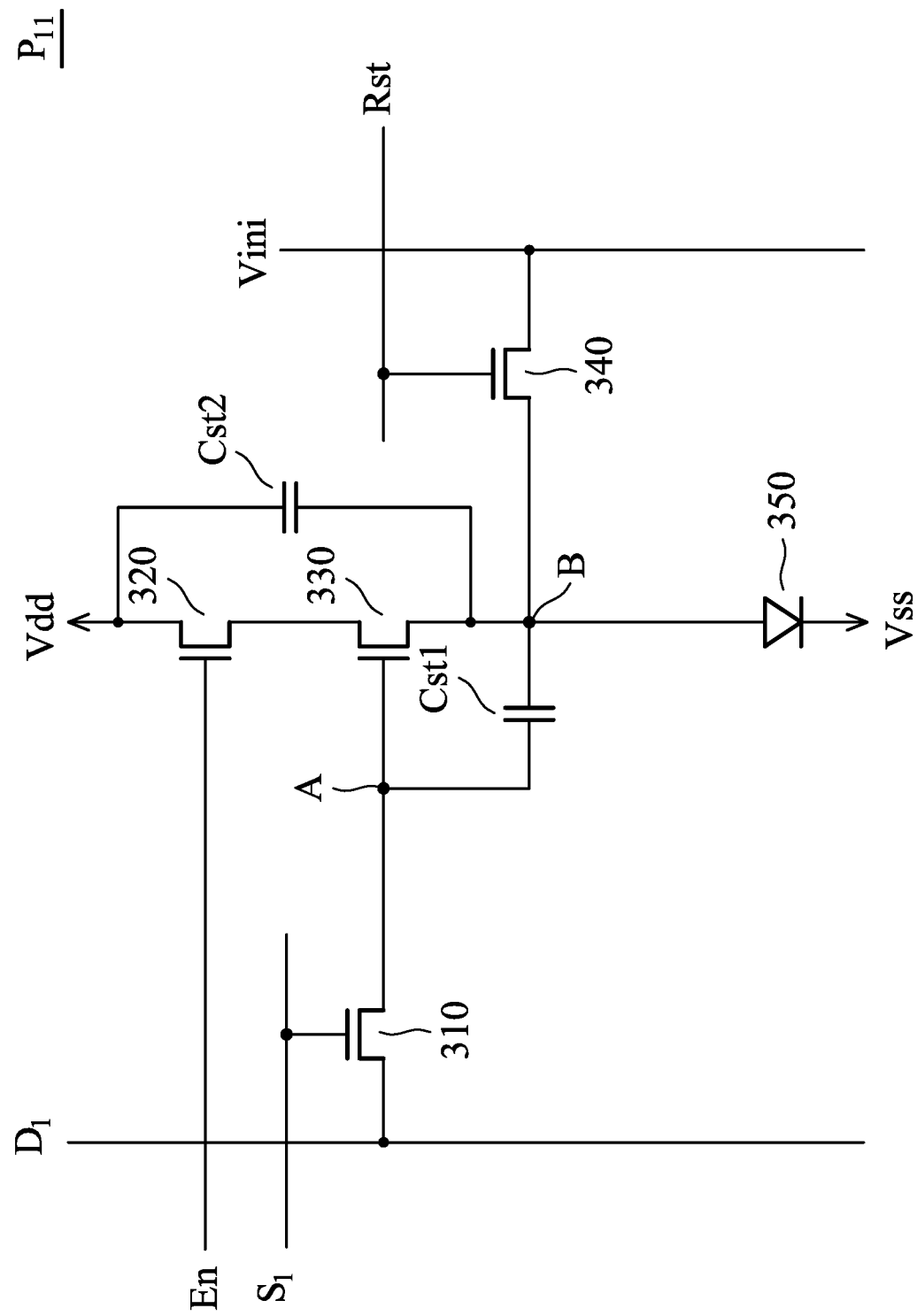
FIG. 3A is a schematic diagram of another exemplary embodiment of the pixel, according to various aspects of the present disclosure.

FIG. 3A is a schematic diagram of another exemplary embodiment of the pixel, according to various aspects of the present disclosure. In this embodiment, the pixel $P_{11}$ comprises a switching transistor 310, an emitting transistor 320, a driving transistor 330, a reset transistor 340, an OLED 350, a storage capacitor Cst1, and a storage capacitor Cst2. The gate of the switching transistor 310 receives the scan signal $S_1$. The drain of the switching transistor 310 receives the data signal $D_1$. The source of the switching transistor 310 is coupled to the node A. The gate of the emitting transistor 320 receives the emitting signal EN. The drain of the emitting transistor 320 receives the operation voltage Vdd. The source of the emitting transistor 320 is coupled to the drain of the driving transistor 330. The gate of the driving transistor 330 is coupled to the node A. The source of the driving transistor 330 is coupled to the node B. The gate of the reset transistor 340 receives the reset signal Rst. The drain of the reset transistor 340 receives an initial voltage Vini. The source of the reset transistor 340 is coupled to the node B. The anode of the OLED 350 is coupled to the node B. The cathode of the OLED 350 receives the operation voltage Vss. The storage capacitor Cst1 is coupled between the node A and the node B. The storage capacitor Cst2 is coupled between the drain of the emitting transistor 320 and the node B. In one embodiment, the pixel $P_{11}$ comprises at least one capacitor electrode. The capacitor electrode is utilized to form the storage capacitor Cst1 or the storage capacitor Cst2 to increase the capacitance of the storage capacitor Cst1.

Figure 3B:
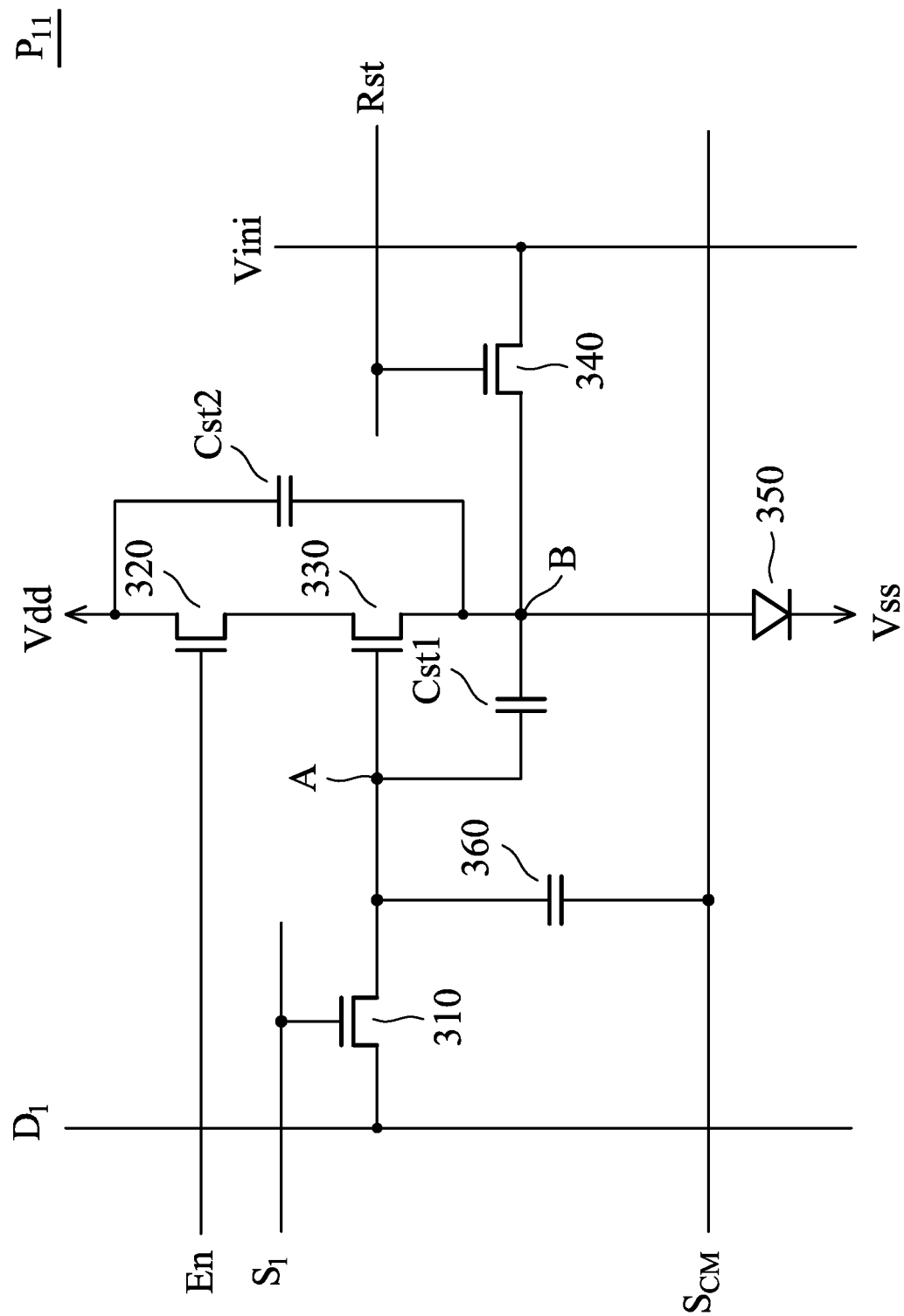
FIG. 3B is a schematic diagram of another exemplary embodiment of the pixel, according to various aspects of the present disclosure.

FIG. 3B is a schematic diagram of another exemplary embodiment of the pixel, according to various aspects of the present disclosure. FIG. 3B is similar to FIG. 3A except for the addition of the auxiliary capacitor 360. One terminal of the auxiliary capacitor 360 receives the predetermined voltage $S_{CM}$. The other terminal of the auxiliary capacitor 360 is coupled to the node A. The auxiliary capacitor 360 is configured to stabilize or adjust the voltage level of the node A. In this embodiment, at least one capacitor electrode is disposed in the pixel $P_{11}$ to form the auxiliary capacitor 360. When the predetermined voltage $S_{CM}$ is provided to the capacitor electrode, the voltage level of the node A can be stabilized or adjusted. In one embodiment, the pixel $P_{11}$ comprises at least one capacitor electrode to form the storage capacitor Cst1, the storage capacitor Cst2 or the auxiliary capacitor 360.

Figure 3C:
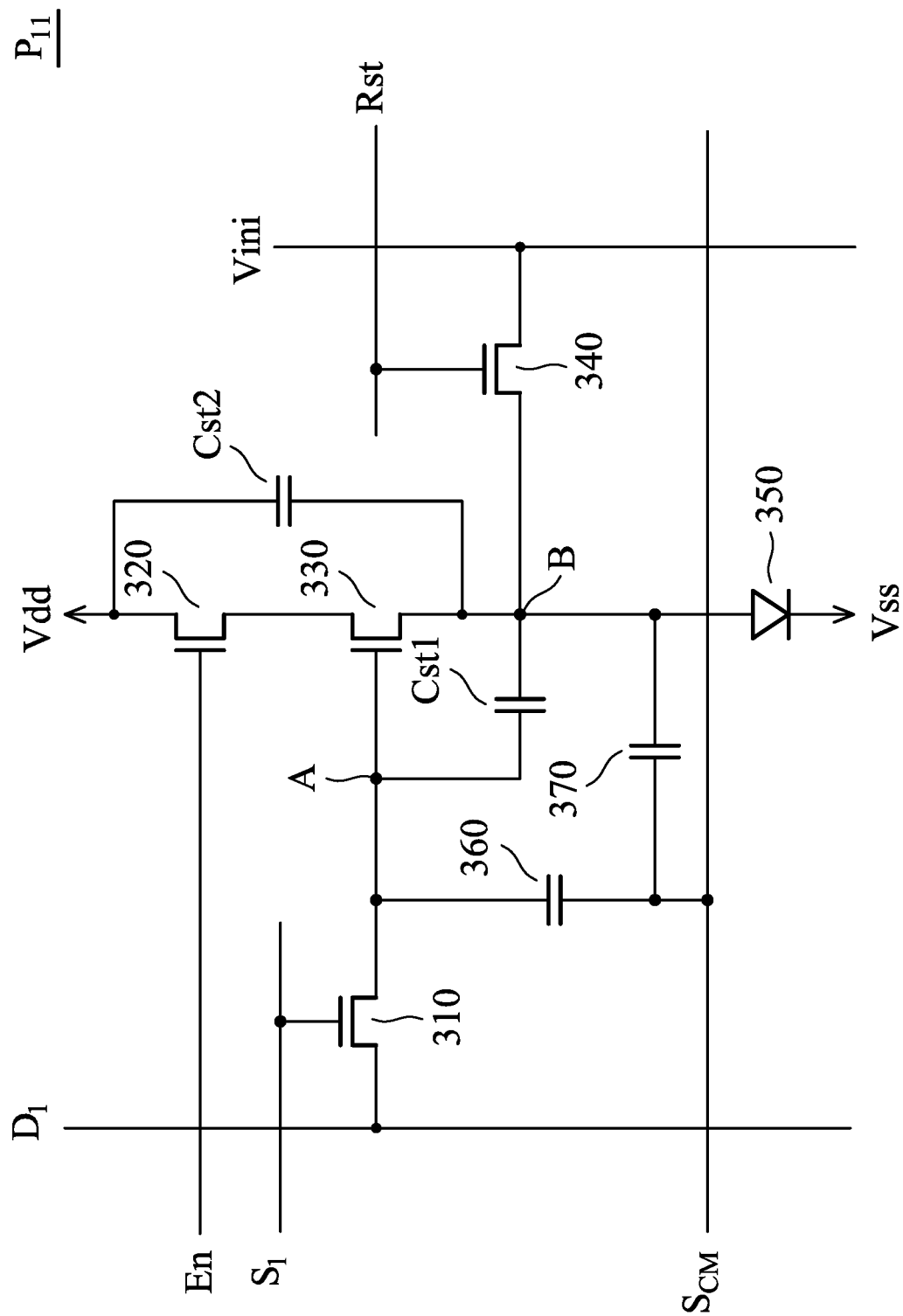
FIG. 3C is a schematic diagram of another exemplary embodiment of the pixel, according to various aspects of the present disclosure.

FIG. 3C is a schematic diagram of another exemplary embodiment of the pixel, according to various aspects of the present disclosure. FIG. 3C is similar to FIG. 3B except for the addition of the auxiliary capacitor 370. One terminal of the auxiliary capacitor 370 receives the predetermined voltage $S_{CM}$. The other terminal of the auxiliary capacitor 370 is coupled to the node B to stabilize or adjust the voltage level of the node B. In this embodiment, at least one capacitor electrode is disposed in the pixel $P_{11}$ to form the auxiliary capacitor 360 and the auxiliary capacitor 370 in the pixel $P_{11}$ or increase the capacitance of at least one of the storage capacitor Cst1 and the storage capacitor Cst2. In one embodiment, if a predetermined voltage $S_{CM}$ is provided to the capacitor electrode, the voltage level of the node B can be stabilized or adjusted.

Figure 3D:
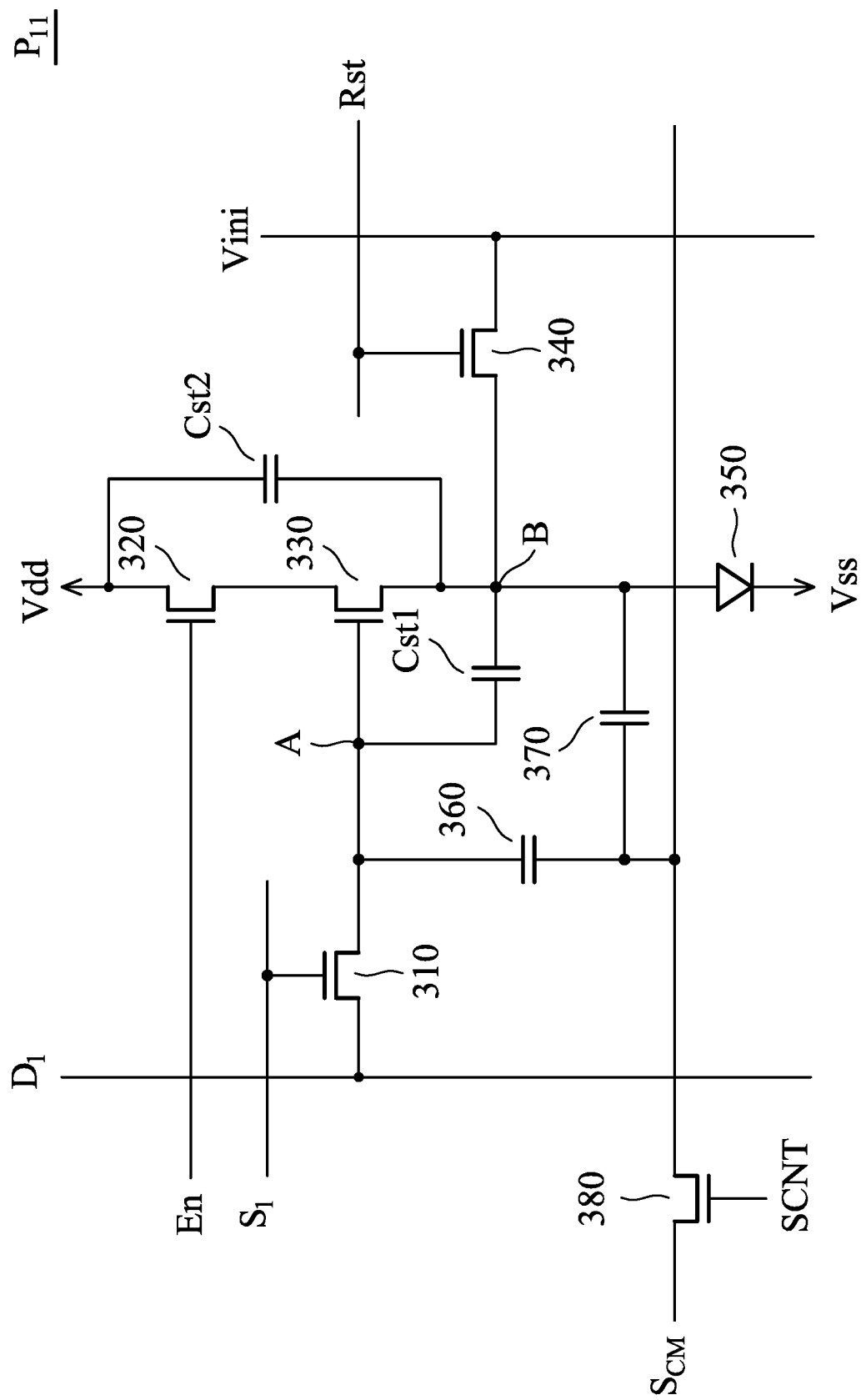
FIG. 3D is a schematic diagram of another exemplary embodiment of the pixel, according to various aspects of the present disclosure.

FIG. 3D is a schematic diagram of another exemplary embodiment of the pixel, according to various aspects of the present disclosure. FIG. 3D is similar to FIG. 3C except for the addition of a control transistor 380 in FIG. 3D. The gate of the control transistor 380 receives a control signal SCNT. The drain of the control transistor 380 receives the predetermined voltage $S_{CM}$. The source of the control transistor 380 is coupled to the auxiliary capacitor 360 and the auxiliary capacitor 370. The control transistor 380 provides the predetermined voltage $S_{CM}$ to the auxiliary capacitor 360 and the auxiliary capacitor 370 according to the control signal SCNT. In other embodiments, the control transistor 380 can be applied to FIG. 2B, FIG. 2C, FIG. 3B, or FIG. 3C.

Figure 4A:
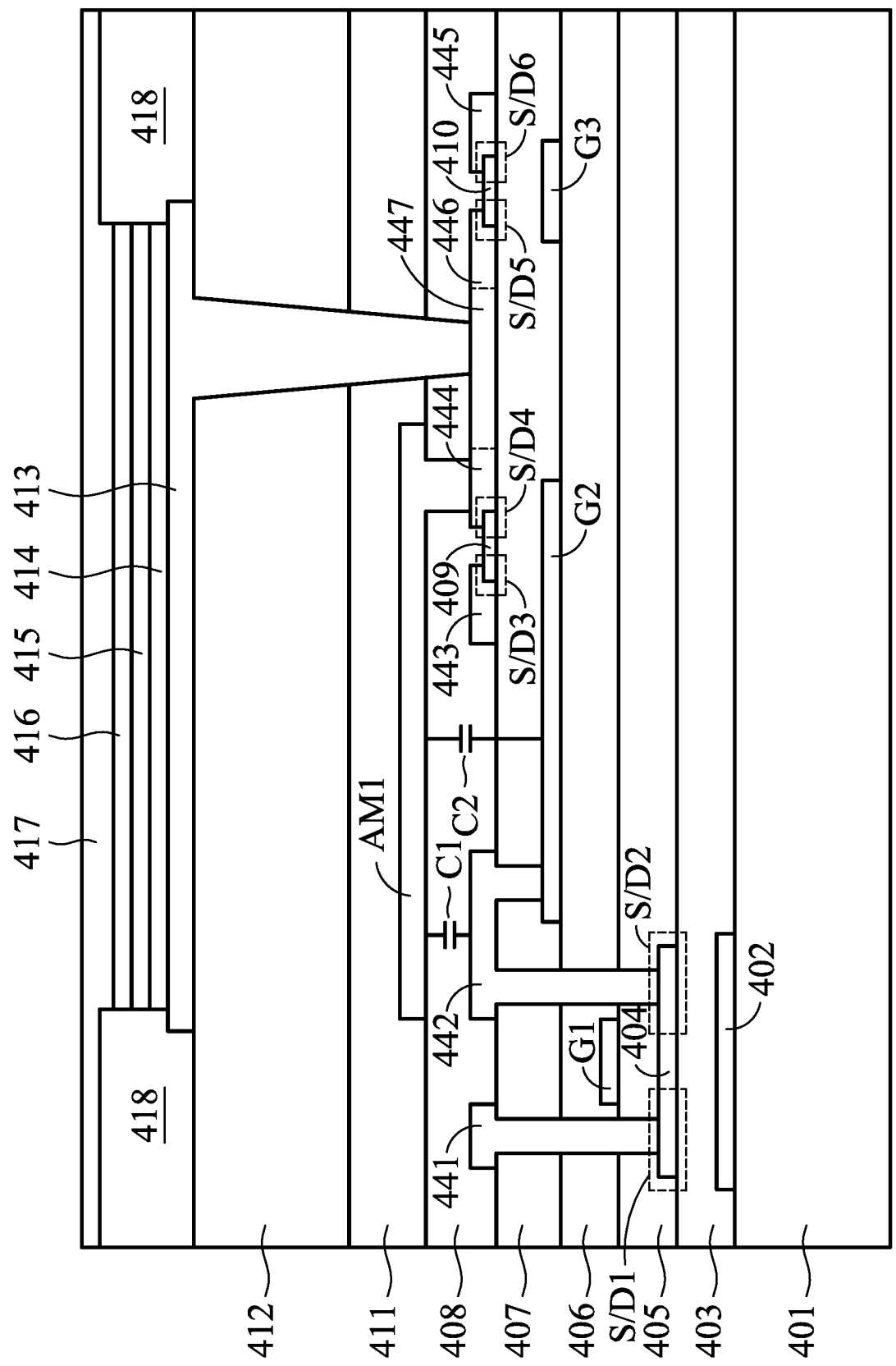
FIG. 4A is a schematic diagram of an exemplary embodiment of the semiconductor structure of the pixel, according to various aspects of the present disclosure.

FIG. 4A is a schematic diagram of an exemplary embodiment of a semiconductor structure of a pixel, according to various aspects of the present disclosure. As shown in FIG. 4A, the blocking layer 402 is formed on the substrate 410. The insulator layer 403 is formed on the blocking layer 402. A semiconductor layer 404 is formed on the insulator layer 403 and overlaps the blocking layer 402. In this embodiment, the area of the blocking layer 402 is greater than the area of the semiconductor layer 404. The semiconductor layer 404 comprises a first source/drain region S/D1 and a second source/drain region S/D2. In one embodiment, the material of the first semiconductor layer 404 is low temperature poly-silicon (LTPS) or amorphous silicon. In such cases, the first semiconductor layer 404 is referred to as a silicon semiconductor layer. The insulator layer 405 is formed on the first semiconductor layer 404.

A first gate electrode G1 is formed on the insulator layer 405 and overlaps the first semiconductor layer 404. The insulator layer 406 is formed on the first gate electrode G1. A second gate electrode G2 and a third gate electrode G3 are formed on the insulator layer 406. The insulator layer 407 is formed on the second gate electrode G2 and the third gate electrode G3. A first source electrode 441, a first drain electrode 442, a second source electrode 443 a second semiconductor layer 409, a second drain electrode 444, a connection electrode 447, a third source electrode 446, a third semiconductor layer 410, and a third drain electrode 445 are formed on the insulator layer 407.

The first source electrode 441 is electrically connected to the first source/drain region S/D1. The first drain electrode 442 is electrically connected to the second source/drain region S/D2 and the second gate electrode G2. In this embodiment, the first gate electrode G1, The first source electrode 441, and the first drain electrode 442 constitute a first transistor. Additionally, since the first gate electrode G1 is disposed above the first semiconductor layer 404, the first transistor is referred to as a top gate structure. In one embodiment, the first source electrode 441 serves as the source of the first transistor. In this case, the first drain electrode 442 serves as the drain of the first transistor. In another embodiment, the first source electrode 441 serves as the drain of the first transistor. In this case, the first drain electrode serves as the source of the first transistor. Furthermore, since the insulator layer 405 insulates the first gate electrode G1 and the first semiconductor layer 404, the insulator layer 405 is referred to as a gate insulator layer.

The second semiconductor layer 409 overlaps the second gate electrode G2 and comprises a third source/drain region S/D3 and a fourth source/drain region S/D4. The second source electrode 443 is electrically connected to the third source/drain region S/D3. The second drain electrode 444 is electrically connected to the fourth source/drain region S/D4. In one embodiment, the material of the second semiconductor layer 409 is indium gallium zinc oxide (IGZO). In such cases, the second semiconductor layer 409 can be referred to as an oxide semiconductor layer. Additionally, the second gate electrode G2, the second source electrode 443, and the second drain electrode 444 constitute a second transistor. In one embodiment, one of the second source electrode 443 and the second drain electrode 444 serves as a source of the second transistor, and the other serves as a drain of the second transistor. Furthermore, since the second gate electrode G2 is located under the second semiconductor layer 409, the second transistor is referred to as a bottom gate structure.

The third semiconductor layer 410 overlaps the third gate electrode G3 and comprises a fifth source/drain region S/D5 and a sixth source/drain region S/D6. The third source electrode 446 is electrically connected to the fifth source/drain region S/D5. In this embodiment, the third source electrode 446 is electrically connected to the second drain electrode 444 via the connection electrode 447. The third drain electrode 445 is electrically connected to the sixth source/drain region S/D6. In one embodiment, the material of the third semiconductor layer 410 is also IGZO. In this embodiment, the third gate electrode G3, the third source electrode 446, and the third drain electrode 445 constitute a third transistor. In one embodiment, one of the third source electrode 446 and the third drain electrode 445 serves as a source of the third transistor and the other serves as a drain of the third transistor. Furthermore, since the third gate electrode G3 is disposed under the third semiconductor layer 410, the third transistor is referred to as a bottom gate structure.

The insulator layer 408 is formed on the first source electrode 441, the first drain electrode 442, the second source electrode 443, the second semiconductor layer 409, the second drain electrode 444, the connection electrode 447, the third source electrode 446, the third semiconductor layer 410, and the third drain electrode 445. A first capacitor electrode AM1 is disposed above the insulator layer 408 and is electrically connected to the second drain electrode 444. The insulator layer 411 is formed on the first capacitor electrode AM1. In this embodiment, the first capacitor electrode AM1, the first drain electrode 442 and the second gate electrode G2 overlap. Therefore, the first capacitor electrode AM1, the insulator layer 408 and the first drain electrode 442 constitute a capacitor C1. Additionally, the first capacitor electrode AM1, the insulator layer 408, the insulator layer 407, and the second gate electrode G2 constitute a capacitor C2. In one embodiment, the capacitor C1 or the capacitor C2 serves as the storage capacitor Cst or an auxiliary capacitor shown in FIG. 2A~FIG. 2D or the storage capacitor Cst1 or an auxiliary capacitor shown in FIG. 3A~FIG. 3D.

The insulator layer 412 is formed on the insulator layer 411. The electrode 413 is formed on the insulator layer 412. In this embodiment, the electrode 413 is electrically connected to the connection electrode 447 to electrically connect to the second drain electrode 444 and the third source electrode 446, but the disclosure is not limited thereto. The electrode 413 serves as the anode of an OLED. The disclosure is not limited by the semiconductor structure of the OLED display device. For brevity, FIG. 4A shows an exemplary embodiment of the semiconductor structure of the OLED display device, but the disclosure is not limited thereto.

As shown in FIG. 4A, a hole transport layer 414 is formed on the electrode 413. An emissive layer 415 is formed on the hole transport layer 414. An electron transport layer 416 is formed on the emissive layer 415. An electrode 417 is formed on the electron transport layer 416. In this embodiment, the electrode 417 serves as a cathode of an OLED. Additionally, a pixel defining layer (PDL) 418 is configured to insulate the neighbor OLEDs.

In one embodiment, assume that the first source electrode 441 receives a data signal (e.g. $D_1$), the second source electrode 443 receives an operation voltage (e.g. Vdd), the first gate electrode G1 and the third gate electrode G3 receive a scan signal (e.g. $S_1$), and the third source electrode 446 receives a reference voltage (e.g. Vref). In such cases, the first transistor is capable of serving as the switching transistor 210 shown in FIG. 2A, the second transistor is capable of serving as the driving transistor 220 shown in FIG. 2A, and the third transistor is capable of serving as the reset transistor 230 shown in FIG. 2A. Additionally, the capacitor C1 or the capacitor C2 can serve as the storage capacitor Cst (Cst1) or an auxiliary capacitor shown in FIG. 2A~FIG. 2D and FIG. 3A~FIG. 3D. In this embodiment, the first capacitor electrode AM1 is disposed between the second source electrode 443 and the electrode 413, but the disclosure is not limited thereto.

Figure 4B:
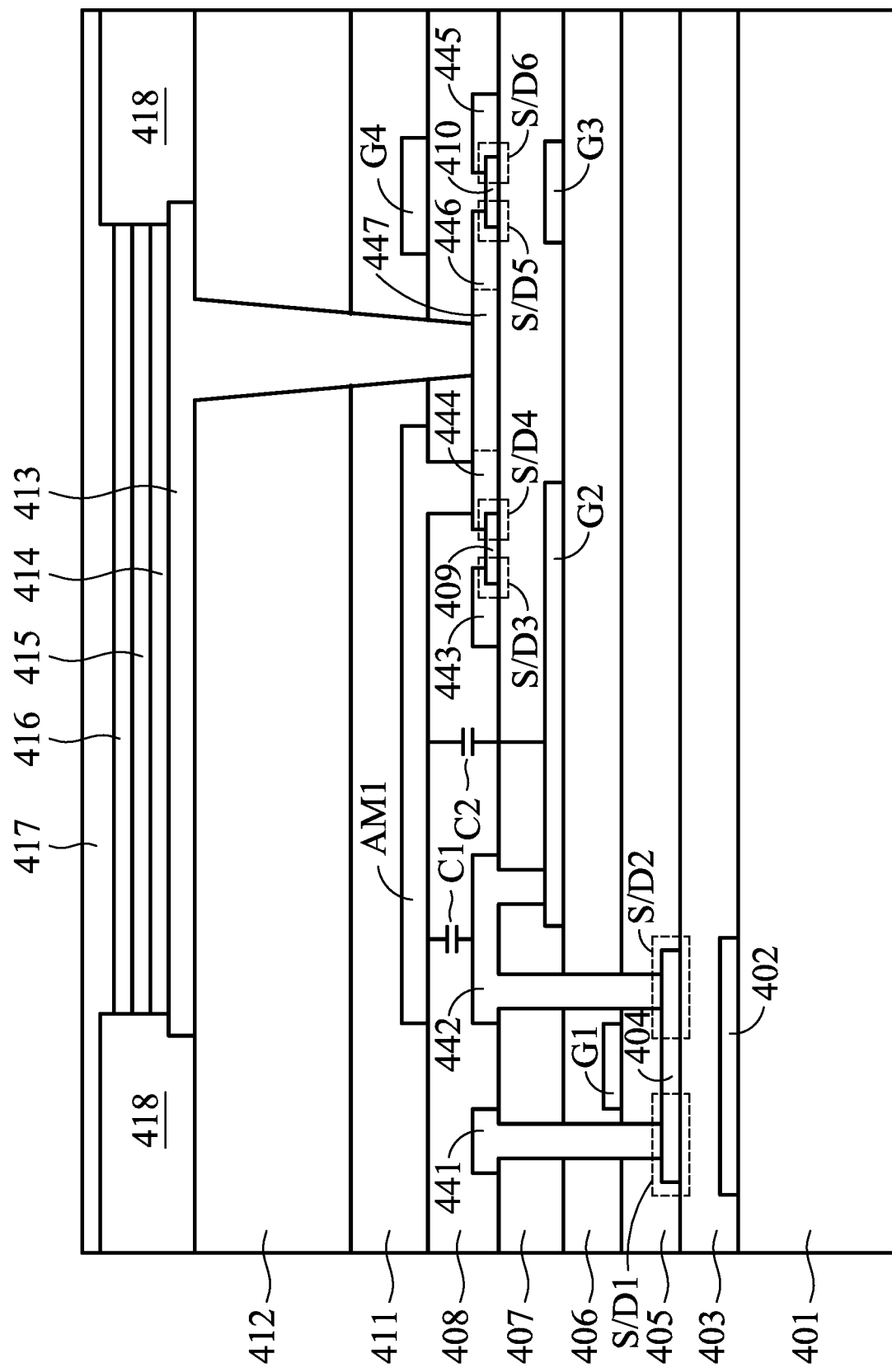
FIG. 4B is a schematic diagram of another exemplary embodiment of the semiconductor structure of the pixel, according to various aspects of the present disclosure.

FIG. 4B is a schematic diagram of another exemplary embodiment of the semiconductor structure of the pixel, according to various aspects of the present disclosure. FIG. 4B is similar to FIG. 4A except for the addition of the fourth gate electrode G4 in FIG. 4B. The fourth gate electrode G4 is disposed above the insulator layer 408 and overlaps the third semiconductor layer 410. In this embodiment, the third transistor comprises two gate electrodes G3 and G4. Therefore, the third transistor is a dual gate structure.

Figure 4C:
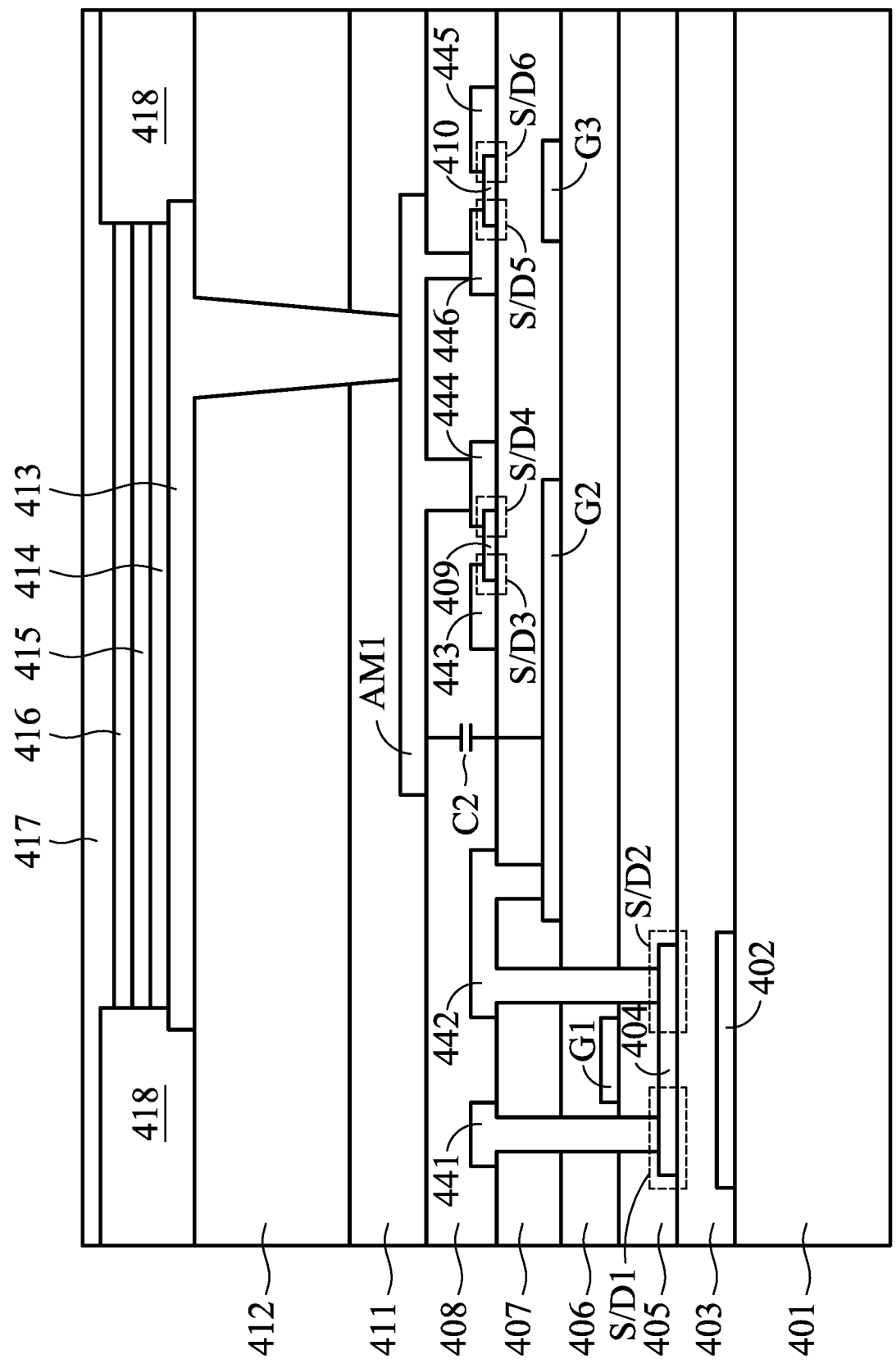
FIG. 4C is a schematic diagram of another exemplary embodiment of the semiconductor structure of the pixel, according to various aspects of the present disclosure.

FIG. 4C is a schematic diagram of another exemplary embodiment of the semiconductor structure of the pixel, according to various aspects of the present disclosure. FIG. 4C is similar to FIG. 4A except that the second drain electrode 444 shown in FIG. 4C is not directly electrically connected to the third source electrode 446. In this embodiment, the first capacitor electrode AM1 is electrically connected to the second drain electrode 444 and the third source electrode 446. Therefore, the second drain electrode 444 is indirectly electrically connected to the third source electrode 446. Furthermore, the electrode 413 is electrically connected to the first capacitor electrode AM1. In this embodiment, the first capacitor electrode AM1 does not overlap the electrode 442, but the disclosure is not limited thereto.

Figure 4D:
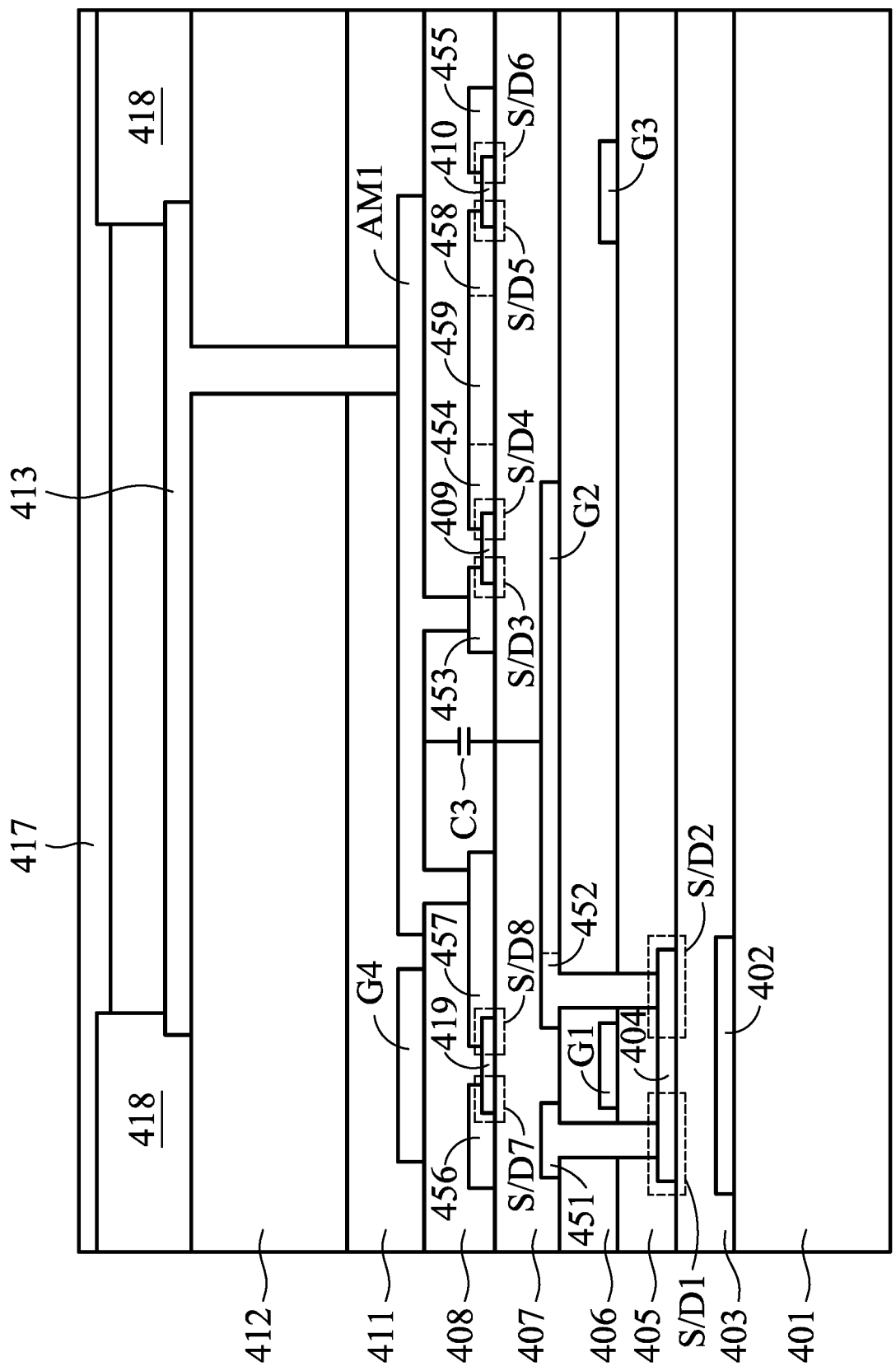
FIG. 4D is a schematic diagram of another exemplary embodiment of the semiconductor structure of the pixel, according to various aspects of the present disclosure.

FIG. 4D is a schematic diagram of another exemplary embodiment of the semiconductor structure of the pixel, according to various aspects of the present disclosure. In this embodiment, the blocking layer 402 is formed on the substrate 401. The insulator layer 403 is formed on the blocking layer 402. The first semiconductor layer 404 is formed on the insulator layer 403. The first semiconductor layer 404 overlaps the insulator layer 402 and comprises a first source/drain region S/D1 and a second source/drain region S/D2. The insulator layer 405 is formed on the semiconductor layer 404. In this embodiment, the material of the first semiconductor layer 404 is LTPS.

The first gate electrode G1 and the third gate electrode G3 are formed on the insulator layer 405. The first gate electrode G1 and the first semiconductor layer 404 overlap. The insulator layer 406 is formed on the first gate electrode G1. The first source electrode 451, the first drain electrode 452, and the second gate electrode G2 are formed on the insulator layer 406. The first source electrode 451 is electrically connected to the first source/drain region S/D1. The first drain electrode 452 is electrically connected to the second source/drain region S/D2. In this embodiment, the first gate electrode G1, the first source electrode 451, and the first drain electrode 452 constitute a first transistor. Since the first gate electrode G1 is formed above the first semiconductor layer 404, the first transistor is a top gate structure.

In this embodiment, the insulator layer 407 is formed on the first source electrode 451, the first drain electrode 452 and the second gate electrode G2. The fourth semiconductor layer 419, the second semiconductor layer 409, and the third semiconductor layer 410 are formed on the insulator layer 407. The second semiconductor layer 409 overlaps the second gate electrode G2 and comprises a third source/drain region S/D3 and a fourth source/drain region S/D4. In this embodiment, the second source electrode 453 and the second drain electrode 454 are formed on the insulator layer 407. The second source electrode 453 is electrically connected to the third source/drain region S/D3. The second drain electrode 454 is electrically connected to the fourth source/drain region S/D4 and the connection electrode 459. The second gate electrode G2, the second source electrode 453, and the second drain electrode 454 constitute a second transistor. Since the second gate electrode G2 is formed under the second semiconductor layer 409, the second transistor is a bottom gate structure. In one embodiment, the second semiconductor layer 409 is IGZO.

The third semiconductor layer 410 overlaps the third gate electrode G3 and comprises a fifth source/drain region S/D5 and a sixth source/drain region S/D6. In this embodiment, the third source electrode 458 and the third drain electrode 455 are formed on the insulator layer 407. The third source electrode 458 is electrically connected to the fifth source/drain region S/D5 and the connection electrode 459. The third drain electrode 455 is electrically connected to the sixth source/drain region S/D6. The third gate electrode G3, the third source electrode 458, and the third drain electrode 455 constitute a third transistor. Since the third gate electrode G3 is disposed under the third semiconductor layer 410, the third transistor is a bottom gate structure. In one embodiment, the material of the third semiconductor layer 410 is IGZO. The fourth semiconductor layer 419 comprises a seventh source/drain region S/D7 and an eighth source/drain region S/D8. In this embodiment, the seventh source/drain electrode 456 and the eighth source/drain electrode 457 are formed on the insulator layer 407. The seventh source/drain electrode 456 is electrically connected to the seventh source/drain region S/D7. The eighth source/drain electrode 457 is electrically connected to the eighth source/drain region S/D8.

The insulator layer 408 is formed on the second semiconductor layer 409, the third semiconductor layer 410, the fourth semiconductor layer 419, the seventh source/drain electrode 456, the eighth source/drain electrode 457, the second source electrode 453, the second drain electrode 454, the connection electrode 459, the third source electrode 458, and the third drain electrode 455. A fourth gate electrode G4 and a first capacitor electrode AM1 are formed on the insulator layer 408. The fourth gate electrode G4 is insulated from the first capacitor electrode AM1. The insulator layer 411 is formed on the fourth gate electrode G4 and the first capacitor electrode AM1.

The fourth gate electrode G4 and the fourth semiconductor layer 419 overlap. In this embodiment, the fourth gate electrode G4, the seventh source/drain electrode 456, and the eighth source/drain electrode 457 constitute a fourth transistor. In one embodiment, one of the seventh source/drain electrode 456 and the eighth source/drain electrode 457 serves as a source of the fourth transistor, and the other of the seventh source/drain electrode 456 and the eighth source/drain electrode 457 serves as a drain of the fourth transistor. Since the fourth gate electrode G4 is disposed above the fourth semiconductor layer 419, the fourth transistor is a top gate structure. In one embodiment, the material of the fourth semiconductor layer 419 is IGZO.

The first capacitor electrode AM1 and the second gate electrode G2 overlap. Therefore, the first capacitor electrode AM1, the insulator layer 408, the insulator layer 407, and the second gate electrode G2 constitute a capacitor C3. In this embodiment, the first capacitor electrode AM1 is electrically connected to the eighth source/drain electrode 457 and the second source electrode 453, but the disclosure is not limited thereto. In another embodiment, the seventh source/drain electrode 456 receives a reference voltage (e.g. Vref), the first source electrode 451 receives a data signal (e.g. $D_1$), the first gate electrode G1 and the fourth gate electrode G4 receive a scan signal (e.g. $S_1$), the third drain electrode 455 receives an operation voltage (e.g. Vdd), the third gate electrode G3 receives an emitting signal (e.g. EN). In such cases, the first transistor constituted by the first gate electrode G1, the first source electrode 451, and the first drain electrode 452 serves as the switching transistor 210 shown in FIG. 2D. In addition, the second transistor constituted by the second gate electrode G2, the second source electrode 453, and the second drain electrode 454 serves as the driving transistor 220 shown in FIG. 2D. The third transistor constituted by the third gate electrode G3, the third source electrode 458, and the third drain electrode 455 serves as the emitting transistor 270 shown in FIG. 2D. The fourth transistor constituted by the fourth gate electrode G4, the seventh source/drain electrode 456, and the eighth source/drain electrode 457 serves as the reset transistor 230 shown in FIG. 2D. In such cases, the capacitor C3 serves as the storage capacitor Cst shown in FIG. 2D. The fourth transistor is also a dual gate structure.

Figure 5:
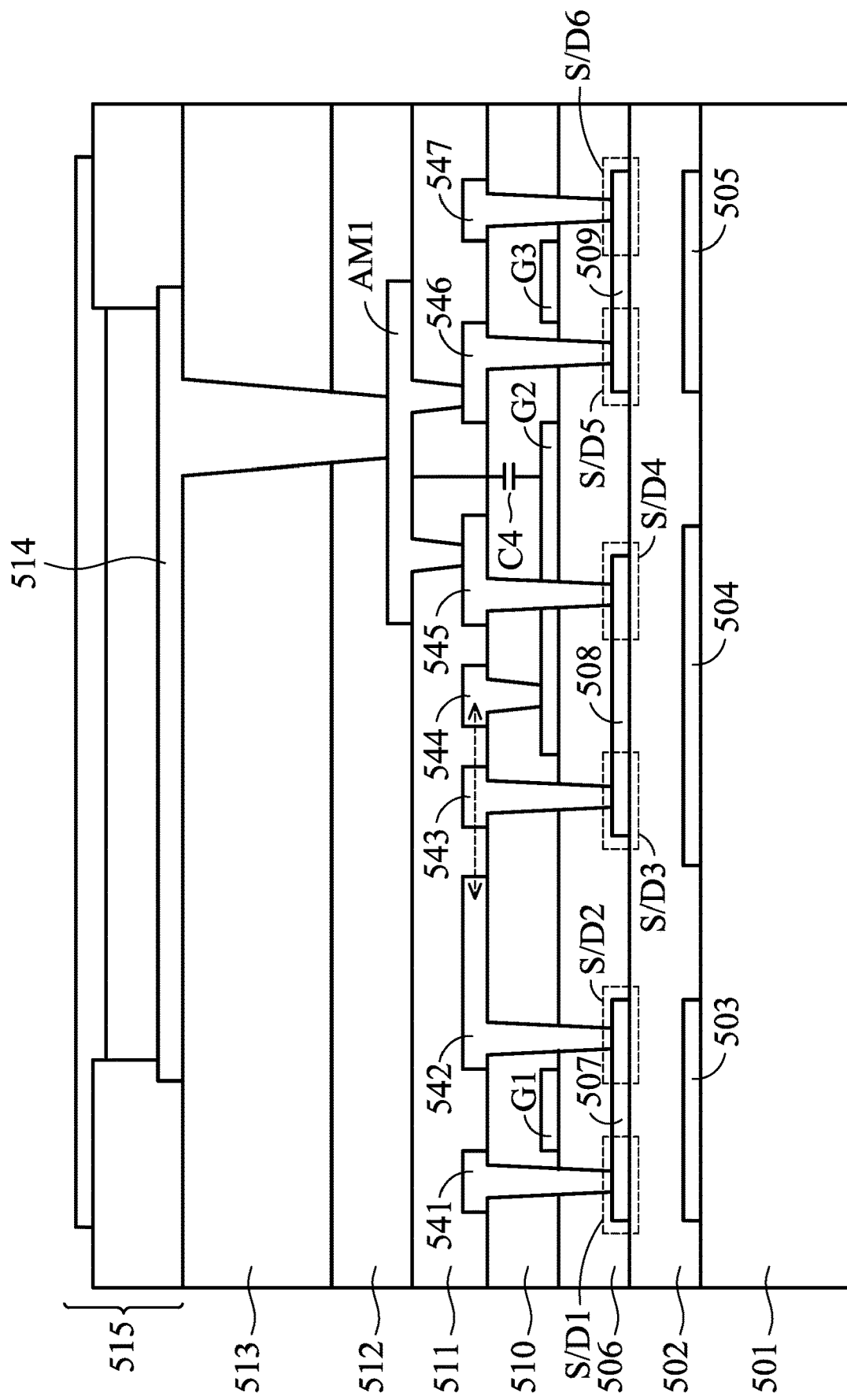
FIG. 5 is a schematic diagram of another exemplary embodiment of the semiconductor structure of the pixel, according to various aspects of the present disclosure.

FIG. 5 is a schematic diagram of another exemplary embodiment of the semiconductor structure of the pixel, according to various aspects of the present disclosure. As shown in FIG. 5, the blocking layer 503, the blocking layer 504, and the blocking layer 505 are formed on the substrate 501. The insulator layer 502 is formed on the blocking layer 503, the blocking layer 504, and the blocking layer 505. The blocking layer 503, the blocking layer 504, and the blocking layer 505 are spaced apart from each other. In another embodiment, the blocking layer 503, the blocking layer 504, and the blocking layer 505 are connected together. The first semiconductor layer 507, the second semiconductor layer 508 and the third semiconductor layer 509 are formed on the insulator layer 502. The first semiconductor layer 507 and the blocking layer 503 overlap. The second semiconductor layer 508 and the blocking layer 504 overlap. The third semiconductor layer 509 and the blocking layer 505 overlap. In one embodiment, the material of the first semiconductor layer 507 is LPTS. In such cases, the material of each of the second semiconductor layer 508 and the third semiconductor layer 509 is IGZO. The first semiconductor layer 507 comprises a first source/drain region S/D1 and a second source/drain region S/D2. The second semiconductor layer 508 comprises a third source/drain region S/D3 and a fourth source/drain region S/D4. The third semiconductor layer 509 comprises a fifth source/drain region S/D5 and a sixth source/drain region S/D6.

The insulator layer 506 is formed on the first semiconductor layer 507, the second semiconductor layer 508 and the third semiconductor layer 509. The first gate electrode G1, the second gate electrode G2, and the third gate electrode G3 are formed on the insulator layer 506. The first gate electrode G1 and the first semiconductor layer 507 overlap. The second gate electrode G2 and the second semiconductor layer 508 overlap. The third gate electrode G3 and the third semiconductor layer 509 overlap. The insulator layer 510 is formed on the first gate electrode G1, the second gate electrode G2, and the third gate electrode G3. The first source electrode 541, the first drain electrode 542, the second source electrode 543, the connection electrode 544, the second drain electrode 545, the third source electrode 546, and the third drain electrode 547 are formed on the insulator layer 510. As shown in FIG. 5, the first source electrode 541 is electrically connected to the first source/drain region S/D1. The first drain electrode 542 is electrically connected to the second source/drain region S/D2. The second source electrode 543 is electrically connected to the third source/drain region S/D3. The connection electrode 544 is electrically connected to the second gate electrode G2. In one embodiment, the connection electrode 544 is electrically connected to the first drain electrode 542. The second drain electrode 545 is electrically connected to the fourth source/drain region S/D4. The third source electrode 546 is electrically connected to the fifth source/drain region S/D5. The third drain electrode 547 is electrically connected to the sixth source/drain region S/D6.

The first gate electrode G1, the first source electrode 541, and the first drain electrode 542 constitute a first transistor. Since the first gate electrode G1 is disposed above the first semiconductor layer 507, the first transistor is a top gate structure. The second gate electrode G2, the second source electrode 543, and the second drain electrode 545 constitute a second transistor. Since the second gate electrode G2 is disposed above the second semiconductor layer 508, the second transistor is also a top gate structure. In this embodiment, the width (extended to a horizontal direction) of the second gate electrode G2 is greater than the width of the first gate electrode G1, but the disclosure is not limited thereto. Furthermore, the third gate electrode G3, the third source electrode 546, and the third drain electrode 547 constitute a third transistor. Since the third gate electrode G3 is disposed above the third semiconductor layer 509, the third transistor is a top gate structure.

The insulator layer 511 is formed on the first source electrode 541, the first drain electrode 542, the second source electrode 543, the connection electrode 544, the second drain electrode 545, the third source electrode 546, and the third drain electrode 547. The first capacitor electrode AM1 is disposed above the insulator layer 511. In this embodiment, the capacitor electrode AM1 is electrically connected to the second drain electrode 545 and the third source electrode 546, but the disclosure is not limited thereto. Since the first capacitor electrode AM1 overlaps the second gate electrode G2, the first capacitor electrode AM1, the insulator layer 511, the insulator layer 510, and the second gate electrode G2 constitute a capacitor C4. In this embodiment, the second drain electrode 545 is electrically connected to the third source electrode 546 via the first capacitor electrode AM1. Therefore, the second drain electrode 545 is indirectly electrically connected to third source electrode 546.

The insulator layer 512 is formed on the first capacitor electrode AM1. The insulator layer 513 is formed on the insulator layer 512. The OLED 515 is formed on the insulator layer 513. The disclosure is not limited by the semiconductor structure of the OLED display device. In this embodiment, the electrode 514 of the OLED 515 is electrically connected to the first capacitor electrode AM1.

In one embodiment, the first gate electrode G1 receives a scan signal, such as $S_1$. The first source electrode 541 receives a data signal, such as $D_1$. The first drain electrode 542 is electrically connected to the connection electrode 544. In such cases, the first transistor constituted by the first gate electrode G1, the first source electrode 541, and the first drain electrode 542 serves as the switching transistor 210 shown in FIG. 2A. Similarly, assume that the connection electrode 544 is electrically connected to the first drain electrode 542, the second source electrode 543 receives an operation voltage (e.g. Vdd), and the second drain electrode 545 is electrically connected to the third source electrode 546. In such cases, the second transistor constituted by the second gate electrode G2, the second source electrode 543, and the second drain electrode 545 is capable of serving as the driving transistor 220 shown in FIG. 2A. Assume that the third gate electrode G3 receives a scan signal, the third source electrode 546 is electrically connected to the anode (e.g. the electrode 514) of the OLED, and the third drain electrode 547 receives a reference voltage (e.g. Vref). In this case, the third transistor constituted by the third gate electrode G3, the third source electrode 546, and the third drain electrode 547 is capable of serving as the reset transistor 230 shown in FIG. 2A. Similarly, the capacitor C4 disposed between the first capacitor electrode AM1 and the second gate electrode G2 is capable of serving as the storage capacitor Cst shown in FIG. 2A, FIG. 2B, FIG. 2C, or FIG. 2D or serving as the storage capacitor Cst1 shown in FIG. 3A, FIG. 3B, FIG. 3C, or FIG. 3D.

Figure 6:
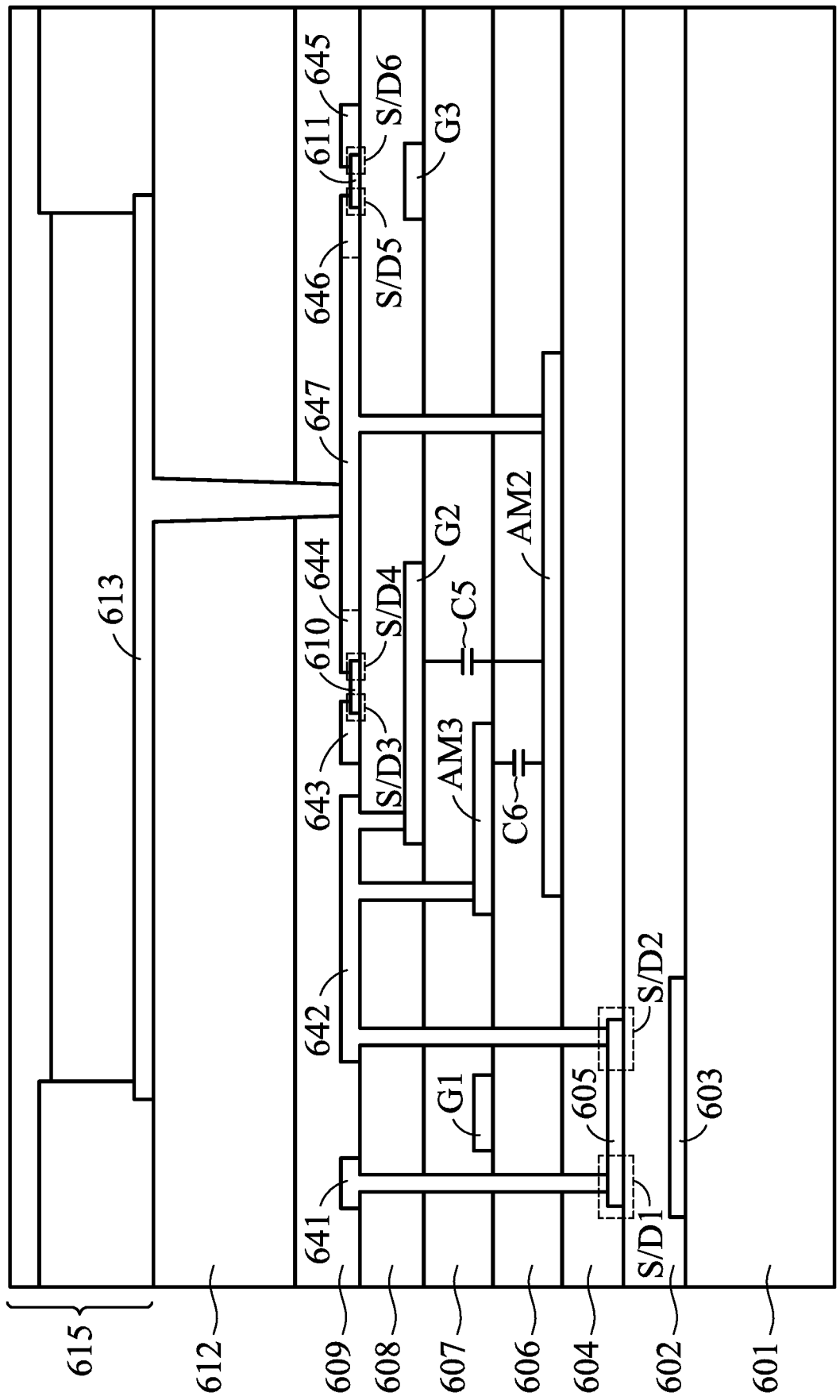
FIG. 6 is a schematic diagram of another exemplary embodiment of the semiconductor structure of the pixel, according to various aspects of the present disclosure.

FIG. 6 is a schematic diagram of another exemplary embodiment of the semiconductor structure of the pixel, according to various aspects of the present disclosure. The blocking layer 603 is formed on the substrate 601. The insulator layer 602 is formed on the blocking layer 603. The first semiconductor layer 605 is disposed above the insulator layer 602. The first semiconductor layer 605 overlaps the blocking layer 603 and comprises a first source/drain region S/D1 and a second source/drain region S/D2. In one embodiment, the material of the first semiconductor layer 605 is LTPS.

The insulator layer 604 is formed on the first semiconductor layer 605. The first capacitor electrode AM2 is formed on the insulator layer 604. The insulator layer 606 is formed on the first capacitor electrode AM2. The first gate electrode G1 and the second capacitor electrode AM3 are formed on the insulator layer 606. The first gate electrode G1 and the first semiconductor layer 605 overlap. The second capacitor electrode AM3 and the first capacitor electrode AM2 overlap. Therefore, the second capacitor electrode AM3, the insulator layer 606, and the first capacitor electrode AM2 constitute a capacitor C6. Furthermore, the first capacitor electrode AM2 is disposed between the first gate electrode G1 and the first semiconductor layer 605.

The insulator layer 607 is formed on the first gate electrode G1 and the second capacitor electrode AM3. The second gate electrode G2 and the third gate electrode G3 are disposed above the insulator layer 607. In this embodiment, the second gate electrode G2 and the first capacitor electrode AM2 overlap. Therefore, the second gate electrode G2, the insulator layer 607, the insulator layer 606, and the first capacitor electrode AM2 constitute a capacitor C5.

The insulator layer 608 is formed on the second gate electrode G2 and the third gate electrode G3. The second semiconductor layer 610 and the third semiconductor layer 611 are formed on the insulator layer 608. In one embodiment, the material of each of the second semiconductor layer 610 and the third semiconductor layer 611 is IGZO. As shown in FIG. 6, the second semiconductor layer 610 overlaps the second gate electrode G2 and comprises a third source/drain region S/D3 and a fourth source/drain region S/D4. The third semiconductor layer 611 overlaps the third gate electrode G3 and comprises a fifth source/drain region S/D5 and a sixth source/drain region S/D6.

In this embodiment, the first source electrode 641, the first drain electrode 642, the second source electrode 643, the second drain electrode 644, the connection electrode 647, the third source electrode 646, and the third drain electrode 645 are formed on the insulator layer 608. As shown in FIG. 6, the first source electrode 641 is electrically connected to the first source/drain region S/D1. The first drain electrode 642 is electrically connected to the second source/drain region S/D2, the second capacitor electrode AM3, and the second gate electrode G2. The second source electrode 643 is electrically connected to the third source/drain region S/D3. The second drain electrode 644 is electrically connected to the fourth source/drain region S/D4. The third source electrode 646 is electrically connected to the fifth source/drain region S/D5. In this embodiment, the connection electrode 647 is electrically connected to the second drain electrode 644, the first capacitor electrode AM2, and the third source electrode 646. The third drain electrode 645 is electrically connected to the sixth source/drain region S/D6. In this embodiment, the first gate electrode G1 the first source electrode 641, and the first drain electrode 642 constitute a first transistor. The second gate electrode G2, the second source electrode 643, and the second drain electrode 644 constitute a second transistor. The third gate electrode G3, the third source electrode 646, and the third drain electrode 645 constitute a third transistor.

The insulator layer 609 is formed on the first source electrode 641, the first drain electrode 642, the second source electrode 643, the second semiconductor layer 610, the second drain electrode 644, the connection electrode 647, the third source electrode 646, the third semiconductor layer 611, and the third drain electrode 645. The insulator layer 612 is formed on the insulator layer 609. The OLED 615 is formed on the insulator layer 612. The disclosure is not limited by the semiconductor structure of the OLED display device. In one embodiment, the OLED 615 may comprise a hole injection layer, a hole transport layer, an emissive layer, and an electron transport layer. In this embodiment, the electrode 613 of the OLED 615 is electrically connected to the connection electrode 647.

Since the first gate electrode G1 is disposed above the first semiconductor layer 605, the first transistor is a top gate structure. Additionally, the second gate electrode G2 and the third gate electrode G3 are disposed under the second semiconductor layer 610 and the third semiconductor layer 611, respectively. The second transistor and the third transistor are bottom gate structures. Furthermore, in this embodiment, the insulator layer 606 is disposed above the first capacitor electrode AM2 and between the first gate electrode G1 and the first semiconductor layer 605.

Figure 7:
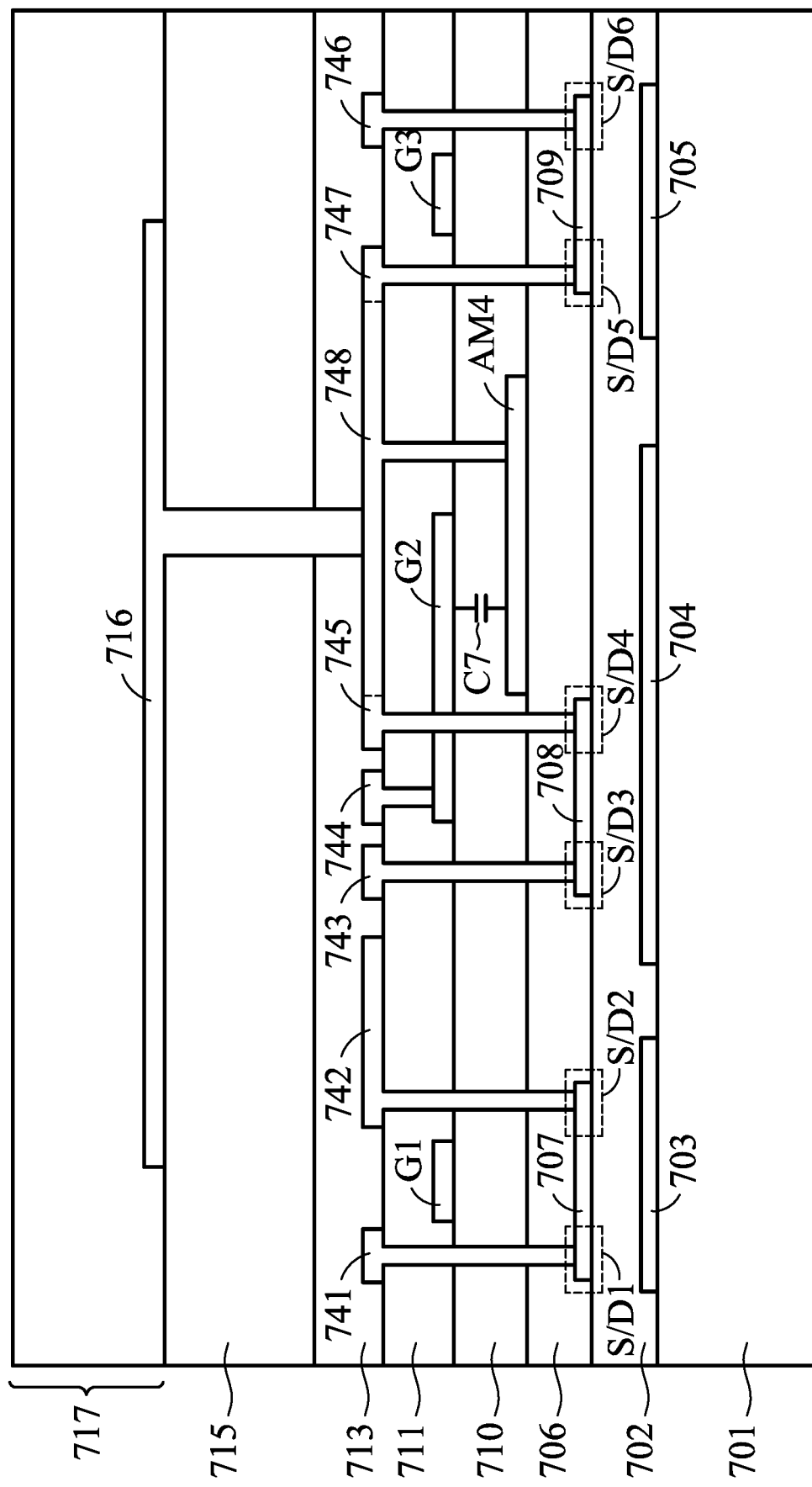
FIG. 7 is a schematic diagram of another exemplary embodiment of the semiconductor structure of the pixel, according to various aspects of the present disclosure.

FIG. 7 is a schematic diagram of another exemplary embodiment of the semiconductor structure of the pixel, according to various aspects of the present disclosure. The blocking layer 703, the blocking layer 704, and the blocking layer 705 are formed on the substrate 701. The insulator layer 702 is formed on the blocking layer 703, the blocking layer 704, and the blocking layer 705. The first semiconductor layer 707, the second semiconductor layer 708, and the third semiconductor layer 709 are formed on the insulator layer 702. The first semiconductor layer 707 overlaps the blocking layer 703 and comprises the first source/drain region S/D1 and the second source/drain region S/D2. In one embodiment, the material of the first semiconductor layer 707 is LTPS. The second semiconductor layer 708 overlaps the blocking layer 704 and comprises the third source/drain region S/D3 and the fourth source/drain region S/D4. The third semiconductor layer 709 overlaps the blocking layer 705 and comprises the fifth source/drain region S/D5 and the sixth source/drain region S/D6. In one embodiment, the material of each of the second semiconductor layer 708 and the third semiconductor layer 709 is IGZO.

The insulator layer 706 is formed on the first semiconductor layer 707, the second semiconductor layer 708, and the third semiconductor layer 709. The first capacitor electrode AM1 is disposed above the insulator layer 706. The insulator layer 710 is formed on the first capacitor electrode AM4. The first gate electrode G1, the second gate electrode G2, and the third gate electrode G3 are disposed above the insulator layer 710. The first gate electrode G1 and the first semiconductor layer 707 overlap. The second gate electrode G2 and the second semiconductor layer 708 overlap. The third gate electrode G3 and the third semiconductor layer 709 overlap. Additionally, the second gate electrode G2 and the first capacitor electrode AM4 overlap. Therefore, the second gate electrode G2, the insulator layer 710 and the first capacitor electrode AM4 constitute a capacitor C7. In one embodiment, the capacitor C7 serves as the storage capacitor Cst shown in at least one of FIG. 2A~FIG. 2D or serves as the storage capacitor Cst1 shown in at least one of FIG. 3A~FIG. 3D.

The insulator layer 711 is formed on the first gate electrode G1, the second gate electrode G2, and the third gate electrode G3. The first source electrode 741, the first drain electrode 742, the second source electrode 743, the connection electrode 744, the second drain electrode 745, the connection electrode 748, the third source electrode 747, and the third drain electrode 746 are formed on the insulator layer 711. The first source electrode 741 is electrically connected to the first source/drain region S/D1. The first drain electrode 742 is electrically connected to the second source/drain region S/D2. In this embodiment, the first gate electrode G1, the first source electrode 741, and the first drain electrode 742 constitute a first transistor. The second source electrode 743 is electrically connected to the third source/drain region S/D3. The connection electrode 744 is electrically connected to the second gate electrode G2. In another embodiment, the connection electrode 744 is further electrically connected to the first drain electrode 742. The second drain electrode 745 is electrically connected to the fourth source/drain region S/D4. In this embodiment, the second gate electrode G2, the second source electrode 743, and the second drain electrode 745 constitute a second transistor. The connection electrode 748 is electrically connected to the second drain electrode 745, the first capacitor electrode AM4, and the third source electrode 747. The third source electrode 747 is electrically connected to the fifth source/drain region S/D5. The third drain electrode 746 is electrically connected to the sixth source/drain region S/D6. In this embodiment, the third gate electrode G3, the third source electrode 747, and the third drain electrode 746 constitute a third transistor.

The insulator layer 713 is formed on the first source electrode 741, the first drain electrode 742, the second source electrode 743, the connection electrode 744, the second drain electrode 745, the connection electrode 748, the third source electrode 747, and the third drain electrode 746. The insulator layer 715 is formed on the insulator layer 713. The OLED 717 is formed on the insulator layer 715. The disclosure is not limited by the semiconductor structure of the OLED display device. Any semiconductor structure of an OLED display device can be applied to FIG. 7. In this embodiment, the electrode 716 of the OLED 717 is electrically connected to the connection electrode 748, but the disclosure is not limited thereto.

In this embodiment, the first gate electrode G1 is disposed above the first semiconductor layer 707, the second gate electrode G2 is disposed above the second semiconductor layer 708, and the third gate electrode G3 is disposed above the third semiconductor layer 709. Therefore, the first transistor, the second transistor, and the third transistor are top gate structures. Additionally, in this embodiment, the first capacitor electrode AM4 is disposed between the second gate electrode G2 and the second semiconductor layer 708, but the disclosure is not limited thereto.

Figure 8A:
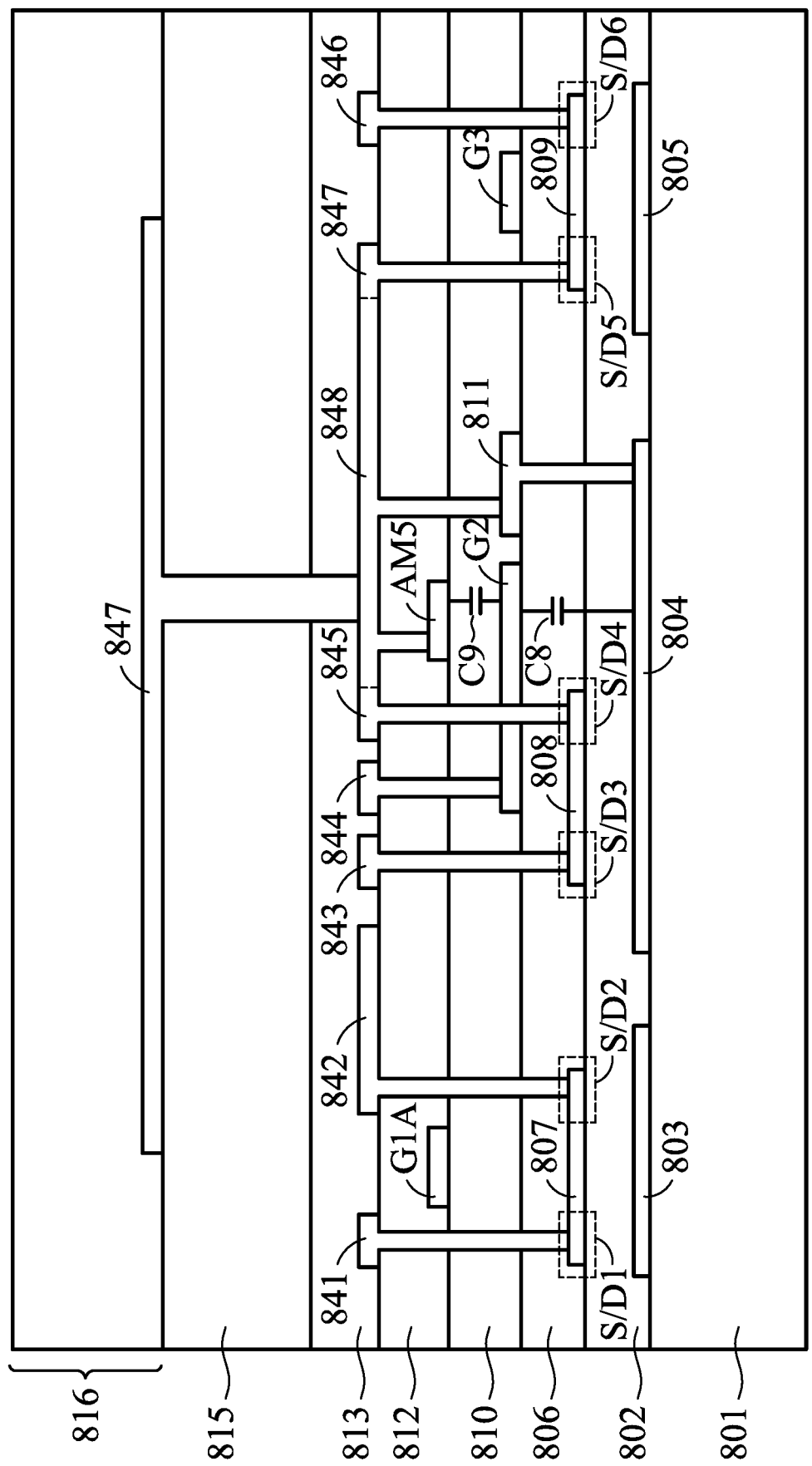
FIG. 8A is a schematic diagram of another exemplary embodiment of the semiconductor structure of the pixel, according to various aspects of the present disclosure.

FIG. 8A is a schematic diagram of another exemplary embodiment of the semiconductor structure of the pixel, according to various aspects of the present disclosure. the blocking layer 803, the blocking layer 804, and the blocking layer 805 are formed on the substrate 801. The insulator layer 802 is formed on the blocking layer 803, the blocking layer 804, and the blocking layer 805. The first semiconductor layer 807, the second semiconductor layer 808, and the third semiconductor layer 809 are disposed above the insulator layer 802. The first semiconductor layer 807 overlaps the blocking layer 803 and comprises the first source/drain region S/D1 and the second source/drain region S/D2. The second semiconductor layer 808 overlaps the blocking layer 804 and comprises the third source/drain region S/D3 and the fourth source/drain region S/D4. The third semiconductor layer 809 overlaps the blocking layer 805 and comprises the fifth source/drain region S/D5 and the sixth source/drain region S/D6. In one embodiment, the material of the first semiconductor layer 807 is LTPS, and the material of each of the second semiconductor layer 808 and the third semiconductor layer 809 is IGZO. In another embodiment, the material of the first semiconductor layer 807 is IGZO, and the material of each of the second semiconductor layer 808 and the third semiconductor layer 809 is LTPS.

The insulator layer 806 is formed on the first semiconductor layer 807, the second semiconductor layer 808, and the third semiconductor layer 809. The second gate electrode G2, the connection electrode 811, and the third gate electrode G3 are formed on the insulator layer 806. The second gate electrode G2 and the second semiconductor layer 808 overlap. The connection electrode 811 is electrically connected to the blocking layer 804. The third gate electrode G3 and the third semiconductor layer 809 overlap. Additionally, the second gate electrode G2, the insulator layer 806, the insulator layer 802, and the blocking layer 804 constitute a capacitor C8. In this embodiment, the blocking layer 804 serves as one terminal of the capacitor C8. Therefore, the blocking layer 804 serves as a capacitor electrode. In such cases, the material of the capacitor electrode is the same as the material of the blocking layer 803 and the blocking layer 805.

The insulator layer 810 is formed on the second gate electrode G2, the connection electrode 811, and the third gate electrode G3. The first gate electrode G1A and the first capacitor electrode AM5 are disposed above the insulator layer 810. The first gate electrode G1A and the first semiconductor layer 807 overlap. The first capacitor electrode AM5 and the second gate electrode G2 overlap. Therefore, the first capacitor electrode AM5, the insulator layer 810, and the second gate electrode G2 constitute a capacitor C9. In one embodiment, the capacitor C8 and the capacitor C9 serve as the storage capacitor Cst shown in FIG. 2A, FIG. 2B, FIG. 2C or FIG. 2D or serve as the storage capacitor Cst1 shown in FIG. 3A, FIG. 3B, FIG. 3C or FIG. 3D.

The insulator layer 812 is formed on the first gate electrode G1A and the first capacitor electrode AMS. The first source electrode 841, the first drain electrode 842, the second source electrode 843, the connection electrode 844, the second drain electrode 845, the connection electrode 848, the third source electrode 847, and the third drain electrode 846 are formed on the insulator layer 812. In this embodiment, the first source electrode 841 is electrically connected to the first source/drain region S/D1, and the first drain electrode 842 is electrically connected to the second source/drain region S/D2. Therefore, the first gate electrode G1, the first source electrode 841, and the first drain electrode 842 constitute a first transistor. The second source electrode 843 is electrically connected to the third source/drain region S/D3. The connection electrode 844 is electrically connected to the second gate electrode G2. The second drain electrode 845 is electrically connected to the fourth source/drain region S/D4. In this embodiment, the second gate electrode G2, the second source electrode 843, and the second drain electrode 845 constitute a second transistor. The connection electrode 848 is electrically connected to the second drain electrode 845, the first capacitor electrode AMS, the connection electrode 811, and the third source electrode 847. The third source electrode 847 is electrically connected to the fifth source/drain region S/D5. The third drain electrode 846 is electrically connected to the sixth source/drain region S/D6. In this embodiment, the third gate electrode G3, the third source electrode 847, and the third drain electrode 846 constitute a third transistor.

The insulator layer 813 is formed on the first source electrode 841, the first drain electrode 842, the second source electrode 843, the connection electrode 844, the second drain electrode 845, the connection electrode 848, the third source electrode 847, and the third drain electrode 846. The insulator layer 815 is formed on the insulator layer 813. The OLED 816 is formed on the insulator layer 815. The disclosure is not limited by the semiconductor structure of the OLED display device. In this embodiment, the anode 818 of the OLED 816 is electrically connected to the connection electrode 848 and overlaps the first capacitor electrode AMS, but the disclosure is not limited thereto. In other embodiments, the OLED 816 may be coupled to other electrodes.

Figure 8B:
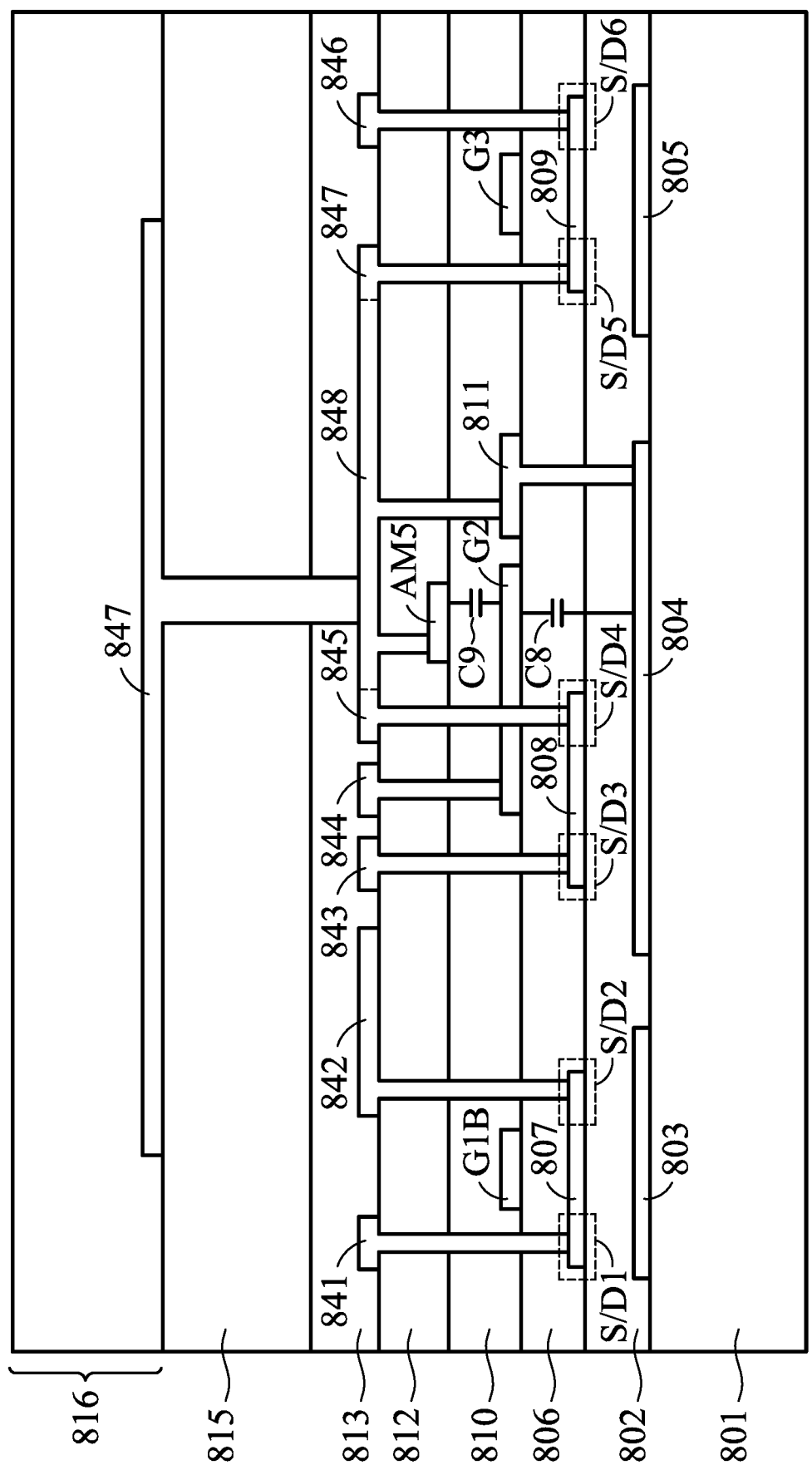
FIG. 8B is a schematic diagram of another exemplary embodiment of the semiconductor structure of the pixel, according to various aspects of the present disclosure.

FIG. 8B is a schematic diagram of another exemplary embodiment of the semiconductor structure of the pixel, according to various aspects of the present disclosure. FIG. 8B is similar to FIG. 8A except that the first gate electrode G1B of the first transistor shown in FIG. 8B is disposed above the insulator layer 806. The insulator layer 810 is formed on the first gate electrode G1B. The insulator layer 810 is disposed between the insulator layer 812 and the insulator layer 806. Since the properties of the first gate electrode G1B are the same as those of the first gate electrode G1A shown in FIG. 8A, a description of the properties of the first gate electrode G1B is omitted. Additionally, the first gate electrode G1A and the first capacitor electrode AM5 are formed in the same insulator layer (e.g. 812) in FIG. 8A. In FIG. 8B, the first gate electrode G1A and the first capacitor electrode AM5 are formed in different insulator layers. Furthermore, the first transistor, the second transistor, and the third transistor in FIG. 8A or FIG. 8B are top gate structures.

Figure 9:
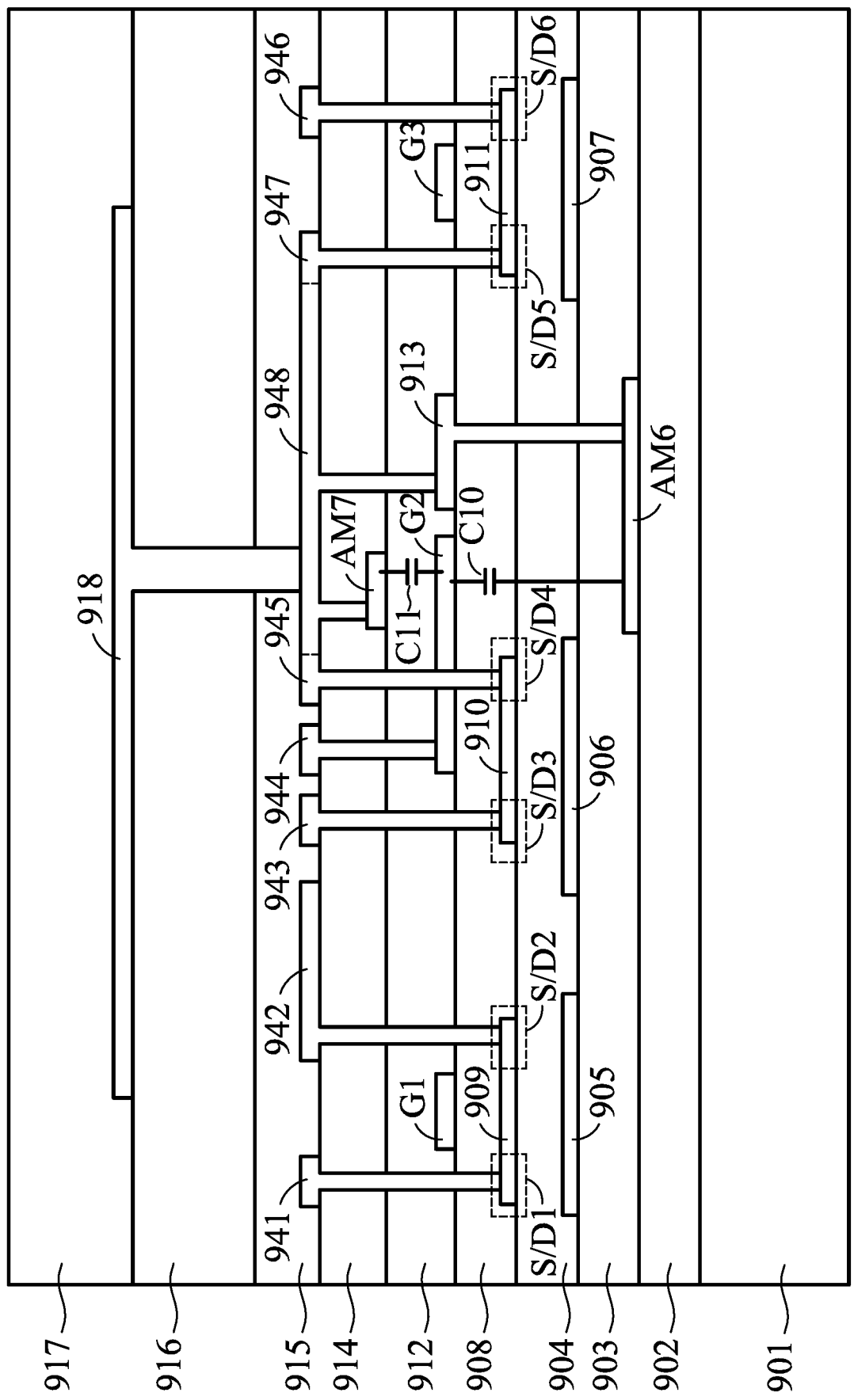
FIG. 9 is a schematic diagram of another exemplary embodiment of the semiconductor structure of the pixel, according to various aspects of the present disclosure.

FIG. 9 is a schematic diagram of another exemplary embodiment of the semiconductor structure of the pixel, according to various aspects of the present disclosure. the insulator layer 902 is formed on the substrate 901. In this embodiment, the insulator layer 902 serves as a buffer layer. The first capacitor electrode AM6 is disposed above the insulator layer 902. The insulator layer 903 is formed on the first capacitor electrode AM6. The blocking layer 905, the blocking layer 906, and the blocking layer 907 are formed on the insulator layer 903. In one embodiment, the material of the first capacitor electrode AM6 is the same as the material of the blocking layer 905. In another embodiment, the first capacitor electrode AM6 and the blocking layer 905 are formed in the same insulator layer. In this embodiment, the first capacitor electrode AM6 is located under the blocking layer 906.

The insulator layer 904 is formed on the blocking layer 905, the blocking layer 906, and the blocking layer 907. The first semiconductor layer 909, the second semiconductor layer 910, and the third semiconductor layer 911 are disposed above the insulator layer 904. The first semiconductor layer 909 overlaps the blocking layer 905 and comprises first source/drain region S/D1 and the second source/drain region S/D2. In one embodiment, the material of the first semiconductor layer 909 is LTPS. The second semiconductor layer 910 overlaps the blocking layer 906 and comprises the third source/drain region S/D3 and the fourth source/drain region S/D4. The third semiconductor layer 911 overlaps the blocking layer 907 and comprises the fifth source/drain region S/D5 and the sixth source/drain region S/D6. In one embodiment, the material of each of the second semiconductor layer 910 and the third semiconductor layer 911 is IGZO.

The insulator layer 908 is formed on the first semiconductor layer 909, the second semiconductor layer 910, and the third semiconductor layer 911. The first gate electrode G1, the second gate electrode G2, the connection electrode 913, and the third gate electrode G3 are disposed above the insulator layer 908. The first gate electrode G1 and the first semiconductor layer 909 overlap. In this embodiment, since the insulator layer 908 insulates the first gate electrode G1 and the first semiconductor layer 909, the insulator layer 908 is referred to as a gate insulator layer. In this embodiment, the first semiconductor layer 909, the second semiconductor layer 910, and the third semiconductor layer 911 are disposed above the first capacitor electrode AM6. The second gate electrode G2 and the second semiconductor layer 910 overlap. Furthermore, the second gate electrode G2 and the first capacitor electrode AM6 overlap. Therefore, the second gate electrode G2, the insulator layer 908, the insulator layer 904, the insulator layer 903, and the first capacitor electrode AM6 constitute a capacitor C10. Additionally, the third gate electrode G3 and the third semiconductor layer 911 overlap. The connection electrode 913 is electrically connected to the first capacitor electrode AM6.

The insulator layer 912 is formed on the first gate electrode G1, the second gate electrode 2, the connection electrode 913, and the third gate electrode G3. The second capacitor electrode AM7 is formed on the insulator layer 912. In this embodiment, the second capacitor electrode AM7 and the second gate electrode G2 overlap. Therefore, the second capacitor electrode AM7, the insulator layer 912, and the second gate electrode G2 constitute a capacitor C11. In one embodiment, the capacitor C11 or the capacitor C10 is capable of serving as the storage capacitor Cst shown in FIG. 2A, FIG. 2B, FIG. 2C or FIG. 2D or serves as the storage capacitor Cst1 shown in FIG. 3A, FIG. 3B, FIG. 3C or FIG. 3D.

The insulator layer 914 is formed on the second capacitor electrode AM7. The first source electrode 941, the first drain electrode 942, the second source electrode 943, the connection electrode 944, the second drain electrode 945, the connection electrode 948, the third source electrode 947, and the third drain electrode 946 are formed on the insulator layer 914. In this embodiment, the first source electrode 941 is electrically connected to the first source/drain region S/D1. The first drain electrode 942 is electrically connected to the second source/drain region S/D2. In one embodiment, the first gate electrode G1, the first source electrode 941, and the first drain electrode 942 constitute a first transistor. The second source electrode 943 is electrically connected to the third source/drain region S/D3. The connection electrode 944 is electrically connected to the second gate electrode G2. The second drain electrode 945 is electrically connected to the fourth source/drain region S/D4. In this embodiment, the second gate electrode G2, the second source electrode 943, and the second drain electrode 945 constitute a second transistor. The connection electrode 948 is electrically connected to the second drain electrode 945, the second capacitor electrode AM7, the connection electrode 913, and the third source electrode 947. The third source electrode 947 is electrically connected to the fifth source/drain region S/D5. The third drain electrode 946 is electrically connected to the sixth source/drain region S/D6. In this embodiment, the third gate electrode G3, the third source electrode 947, and the third drain electrode 946 constitute a third transistor.

The insulator layer 915 is formed on the first source electrode 941, the first drain electrode 942, the second source electrode 943, the connection electrode 944, the second drain electrode 945, the connection electrode 948, the third source electrode 947, and the third drain electrode 946. The insulator layer 916 is formed on the insulator layer 915. The OLED 917 is formed on the insulator layer 916. The disclosure is not limited by the semiconductor structure of the OLED 917. Any semiconductor structure of an OLED display device can be applied to FIG. 9. In this embodiment, the electrode 918 is electrically connected to the connection electrode 948, but the disclosure is not limited thereto. Furthermore, the electrode 918 and the first capacitor electrode AM6 overlap.

Figure 10A:
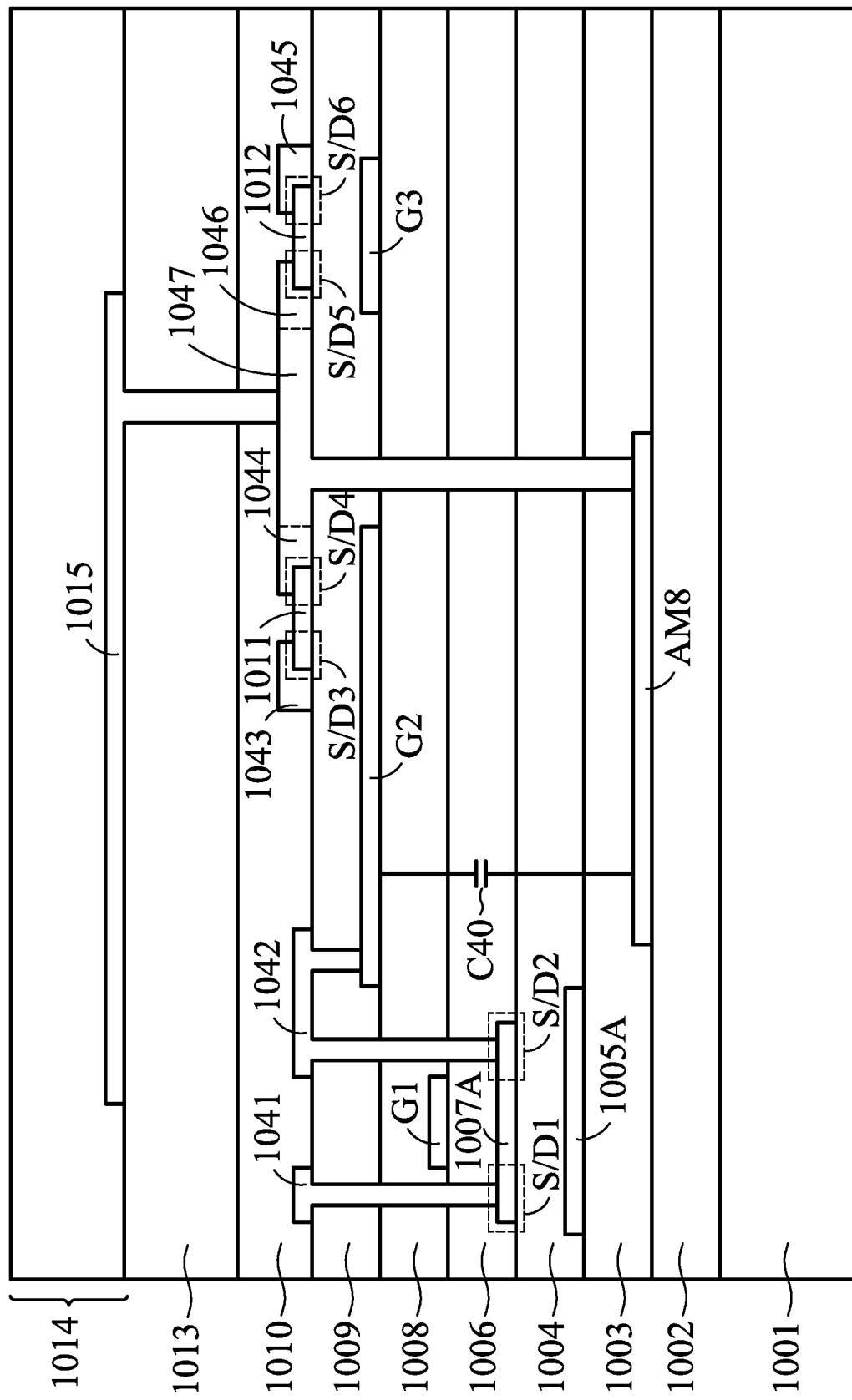
FIG. 10A is a schematic diagram of another exemplary embodiment of the semiconductor structure of the pixel, according to various aspects of the present disclosure.

FIG. 10A is a schematic diagram of another exemplary embodiment of the semiconductor structure of the pixel, according to various aspects of the present disclosure. The insulator layer 1002 is formed on the substrate 1001. The first capacitor electrode AM8 is disposed above the insulator layer 1002. The insulator layer 1003 is formed on the first capacitor electrode AM8. The blocking layer 1005A is disposed above the insulator layer 1003. The insulator layer 1004 is formed on the blocking layer 1005A. The first semiconductor layer 1007A is disposed above the insulator layer 1004. The first semiconductor layer 1007A overlaps the blocking layer 1005A and comprises the first source/drain region S/D1 and the second source/drain region S/D2. In one embodiment, the material of the first semiconductor layer 1007A is LTPS, but the disclosure is not limited thereto.

The insulator layer 1006 is formed on the first semiconductor layer 1007A. The first gate electrode G1 is disposed above the insulator layer 1006. The first gate electrode G1 and the first semiconductor layer 1007A overlap. The insulator layer 1008 is formed on the first gate electrode G1. The second gate electrode G2 and the third gate electrode G3 are disposed above the insulator layer 1008. In this embodiment, the second gate electrode G2 and a portion of the first capacitor electrode AM8 overlap. Therefore, the second gate electrode G2, the insulator layer 1008, the insulator layer 1006, the insulator layer 1004, the insulator layer 1003, and the first capacitor electrode AM8 constitute a capacitor C40. Additionally, the first capacitor electrode AM8 is disposed between the blocking layer 1005A and the substrate 1001. Furthermore, the insulator layer 1002 serves as a buffer layer, and the first capacitor electrode AM8 is disposed above the buffer layer.

The insulator layer 1009 is formed on the second gate electrode G2 and the third gate electrode G3. The second semiconductor layer 1011 and the third semiconductor layer 1012 are disposed above the insulator layer 1009. The second semiconductor layer 1011 overlaps the second gate electrode G2 and comprises the third source/drain region S/D3 and the fourth source/drain region S/D4. In one embodiment, the material of the second semiconductor layer 1011 is IGZO. The third semiconductor layer 1012 overlaps the third gate electrode G3 and comprises the fifth source/drain region S/D5 and the sixth source/drain region S/D6. In one embodiment, the material of the third semiconductor layer 1012 is IGZO.

In this embodiment, the first source electrode 1041, the first drain electrode 1042, the second source electrode 1043, the second drain electrode 1044, the connection electrode 1047, the third source electrode 1046, and the third drain electrode 1045 are formed on the insulator layer 1009. As shown in FIG. 10A, the first source electrode 1041 is electrically connected to the first source/drain region S/D1. In one embodiment, the first source electrode 1041 receives a data signal, such as $D_1$. The first drain electrode 1042 is electrically connected to the second source/drain region S/D2 and the second gate electrode G2. In this embodiment, the first gate electrode G1, the first source electrode 1041, and the first drain electrode 1042 constitute a first transistor. The second source electrode 1043 is electrically connected to the third source/drain region S/D3. In one embodiment, the second source electrode 1043 receives an operation voltage, such as Vdd. The second drain electrode 1044 is electrically connected to the fourth source/drain region S/D4. In this embodiment, the second gate electrode G2, the second source electrode 1043, and the second drain electrode 1044 constitute a second transistor. The connection electrode 1047 is electrically connected to the second drain electrode 1044, the first capacitor electrode AM8, and the third source electrode 1046. The third source electrode 1046 is electrically connected to the fifth source/drain region S/D5. The third drain electrode 1045 is electrically connected to the sixth source/drain region S/D6. In one embodiment, the third drain electrode 1045 receives a reference voltage, such as Vref. In this embodiment, the third gate electrode G3, the third source electrode 1046, and the third drain electrode 1045 constitute a third transistor.

The insulator layer 1010 is formed on the first source electrode 141, the first drain electrode 1042, the second source electrode 1043, the second semiconductor layer 1011, the second drain electrode 1044, the connection electrode 1047, the third source electrode 1046, the third semiconductor layer 1012, and the third drain electrode 1045. The insulator layer 1013 is formed on the insulator layer 1010. The OLED 1014 is formed on the insulator layer 1013. The disclosure is not limited by the semiconductor structure of the OLED display device. Any semiconductor structure of an OLED display device can be applied to FIG. 10. In this embodiment, the electrode 1015 of the OLED 1014 is electrically connected to the electrode 1047.

In this embodiment, the first capacitor electrode AM 8 is disposed under the blocking layer 1005A. Additionally, since the first gate electrode G1 is disposed above the first semiconductor layer 1007A, the first transistor is referred to as a top gate structure. Since the second gate electrode G2 is disposed under the second semiconductor layer 1011, the second transistor is referred to as a bottom gate structure. Similarly, since the third gate electrode G3 is disposed under the third semiconductor layer 1012, the third transistor is also referred to as a bottom gate structure.

Figure 10B:
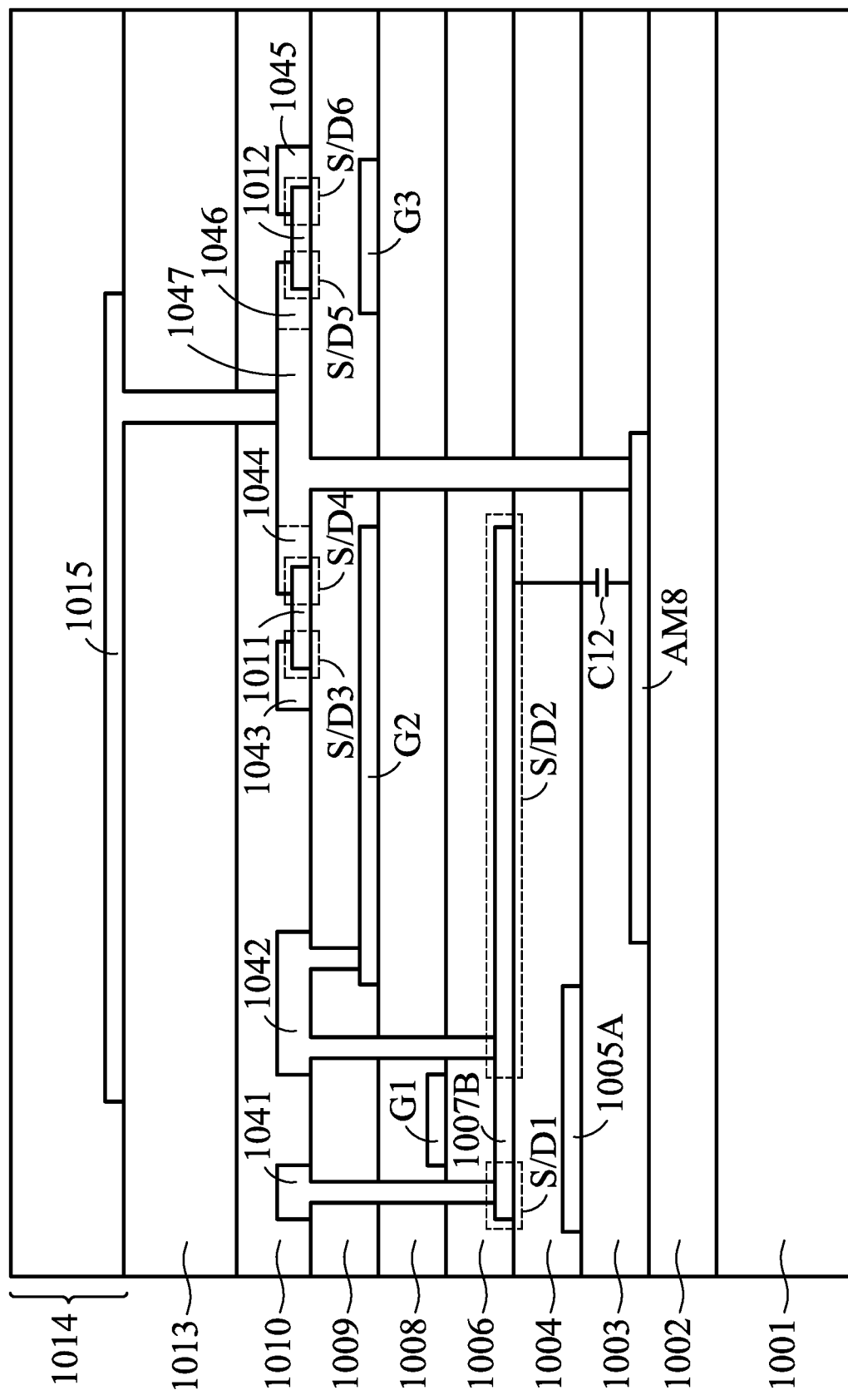
FIG. 10B is a schematic diagram of another exemplary embodiment of the semiconductor structure of the pixel, according to various aspects of the present disclosure.

FIG. 10B is a schematic diagram of another exemplary embodiment of the semiconductor structure of the pixel, according to various aspects of the present disclosure. FIG. 10B is similar to FIG. 10A except that the second source/drain region S/D2 of the first semiconductor layer 1007B and the first capacitor electrode AM8 overlap. Therefore, the second source/drain region S/D2, the insulator layer 1004, the insulator layer 1003, and the first capacitor electrode AM8 constitute a capacitor C12.

Figure 10C:
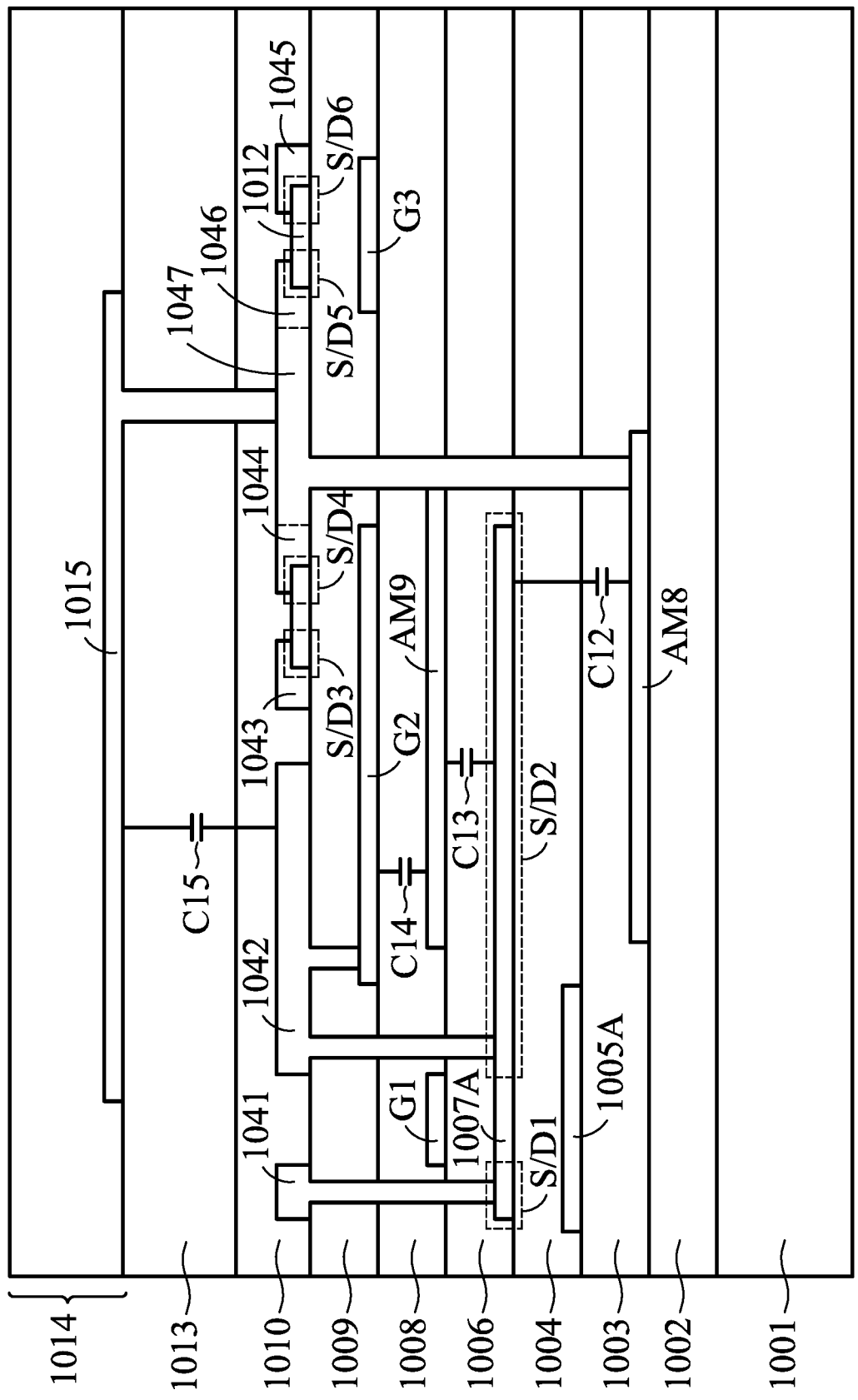
FIG. 10C is a schematic diagram of another exemplary embodiment of the semiconductor structure of the pixel, according to various aspects of the present disclosure.

FIG. 10C is a schematic diagram of another exemplary embodiment of the semiconductor structure of the pixel, according to various aspects of the present disclosure. FIG. 10C is similar to FIG. 10B except for the addition of the second capacitor electrode AM9 in FIG. 10C. The second capacitor electrode AM9 is disposed above the insulator layer 1006. The second capacitor electrode AM9 and the second gate electrode G2 overlap. Therefore, the second capacitor electrode AM9, the insulator layer 1008, and the second gate electrode G2 constitute a capacitor C14. Furthermore, the second capacitor electrode AM9 and the second source/drain region S/D2 overlap. Therefore, the second capacitor electrode AM9, the insulator layer 1006, and the second source/drain region S/D2 constitute a capacitor C13. In this embodiment, the first drain electrode 1042 extends to the second source electrode 1043 and does not electrically connect to the second source electrode 1043. In this case, the first drain electrode 1042, the insulator layer 1010, the insulator layer 1013, and the electrode 1015 constitute a capacitor C15.

Figure 10D:
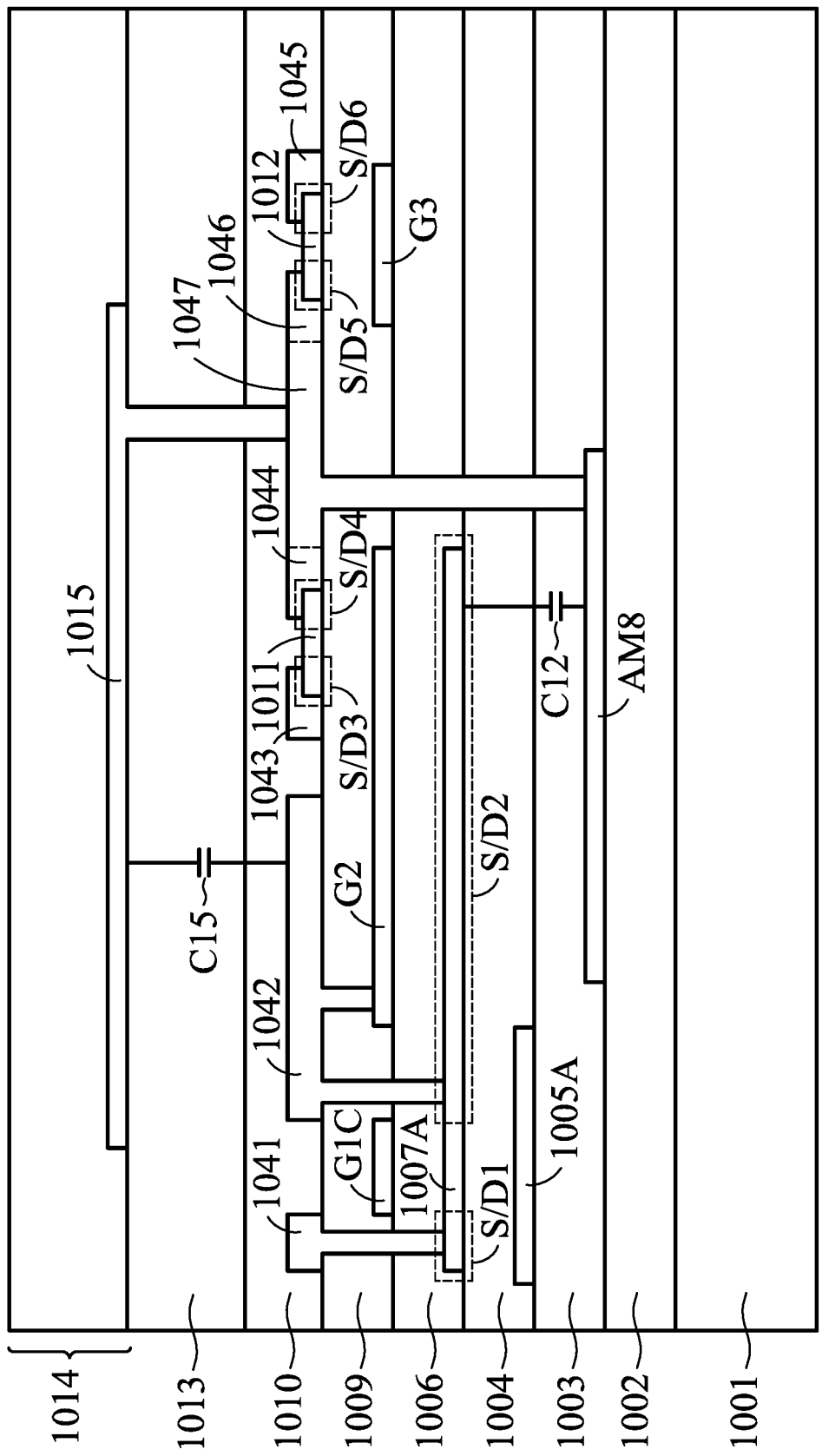
FIG. 10D is a schematic diagram of another exemplary embodiment of the semiconductor structure of the pixel, according to various aspects of the present disclosure.

FIG. 10D is a schematic diagram of another exemplary embodiment of the semiconductor structure of the pixel, according to various aspects of the present disclosure. FIG. 10D is similar to FIG. 10B except that the first gate electrode G1C and the second gate electrode G2 are disposed in the same insulator layer (e.g. 1009) in FIG. 10D. Additionally, the first drain electrode 1042 extends to the second source electrode 1043 in FIG. 10D. In such cases, the first drain electrode 1042, the insulator layer 1010, the insulator layer 1013, and the electrode 1015 constitute a capacitor C15.

Figure 10E:
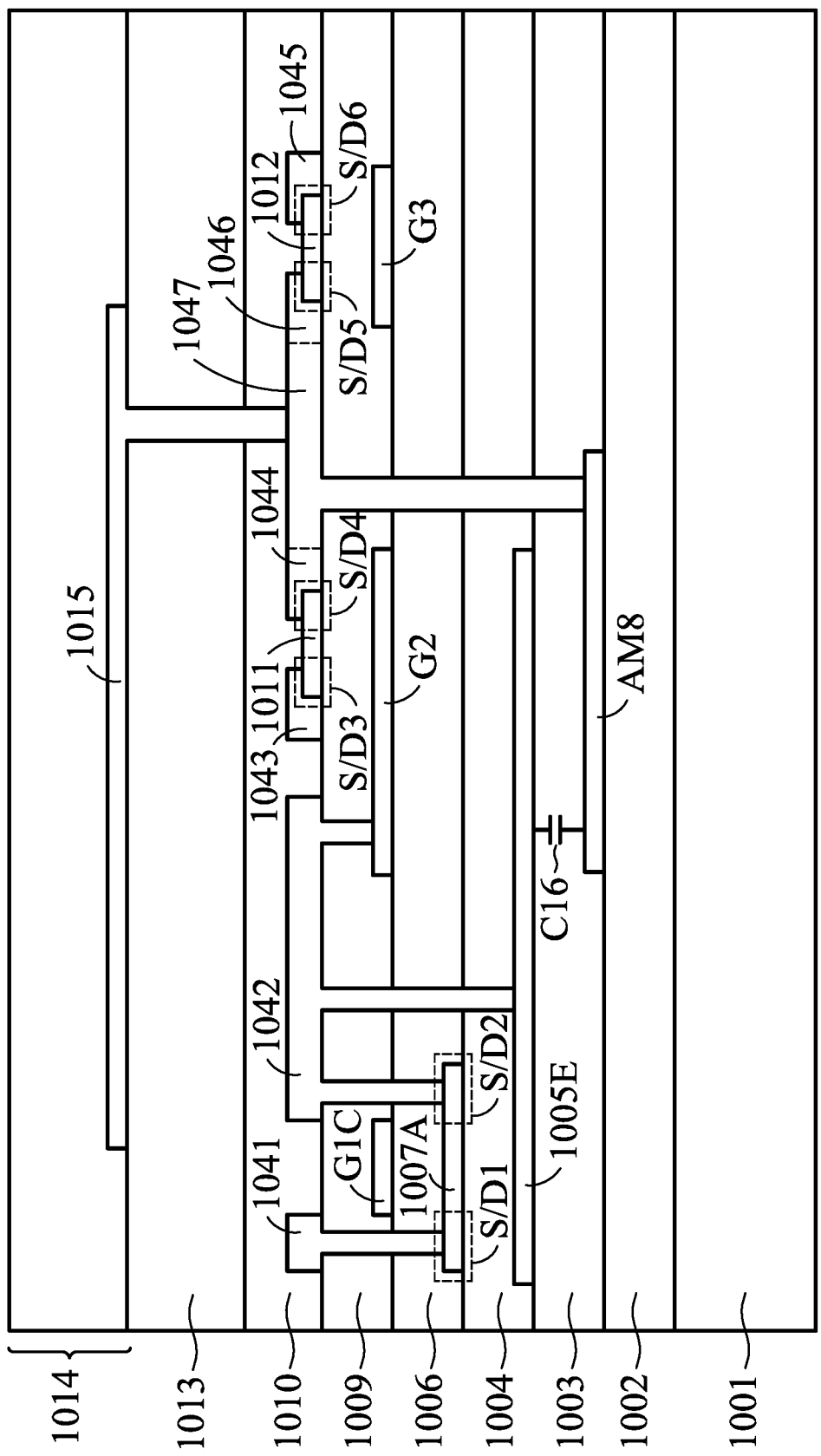
FIG. 10E is a schematic diagram of another exemplary embodiment of the semiconductor structure of the pixel, according to various aspects of the present disclosure.

FIG. 10E is a schematic diagram of another exemplary embodiment of the semiconductor structure of the pixel, according to various aspects of the present disclosure. FIG. 10E is similar to FIG. 10A except that the first gate electrode G1C and the second gate electrode G2 are disposed in the same insulator layer (e.g. 1009) in FIG. 10E. Additionally, the blocking layer 1005E and the first capacitor electrode AM8 overlap. Therefore, the blocking layer 1005E, the insulator layer 1003, and the first capacitor electrode AM8 constitute a capacitor C16. In this embodiment, the first drain electrode 1042 is electrically connected to the second source/drain region S/D2, the blocking layer 1005E and the second gate electrode G2.

Figure 10F:
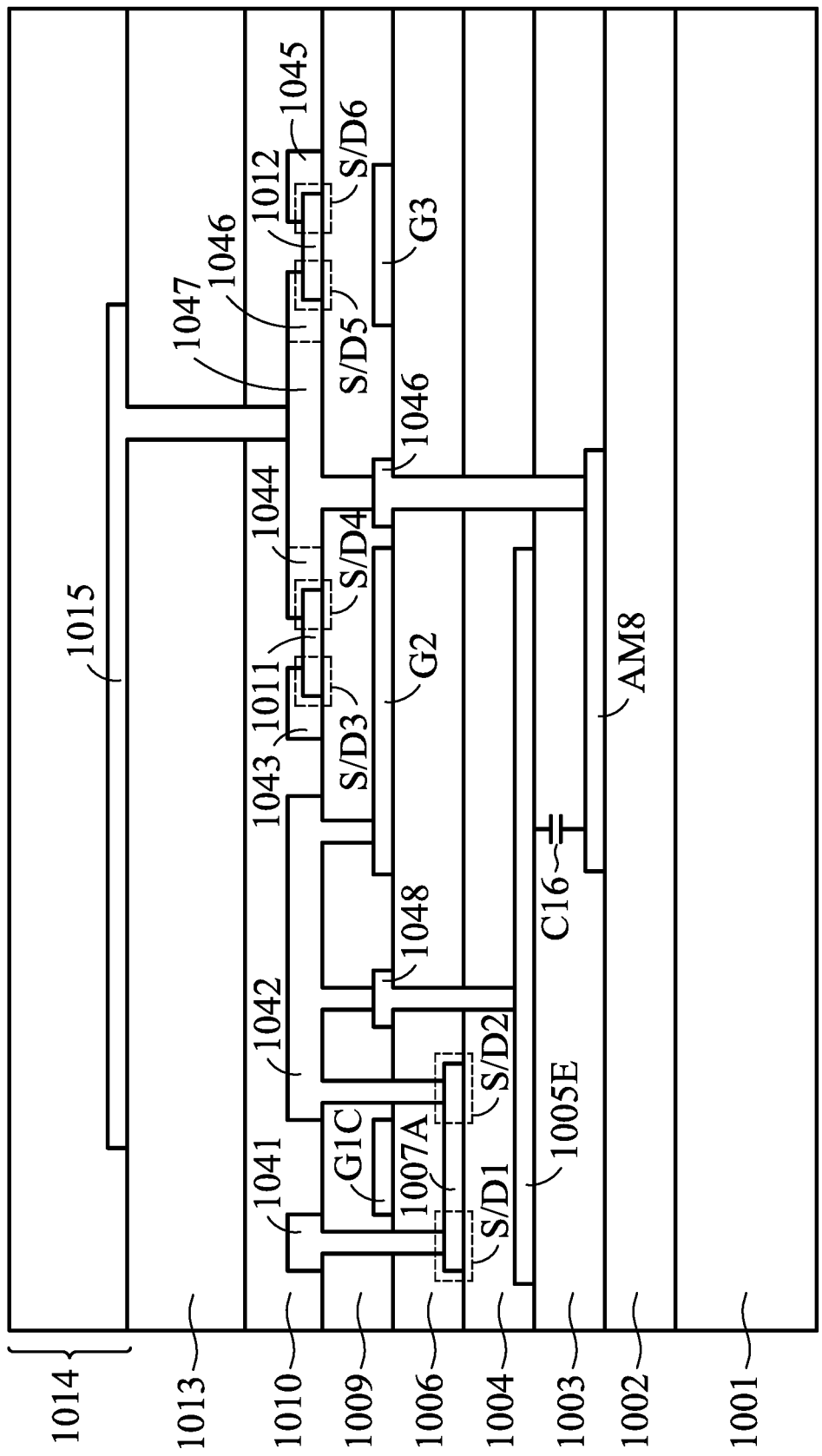
FIG. 10F is a schematic diagram of another exemplary embodiment of the semiconductor structure of the pixel, according to various aspects of the present disclosure.

FIG. 10F is a schematic diagram of another exemplary embodiment of the semiconductor structure of the pixel, according to various aspects of the present disclosure. FIG. 10F is similar to FIG. 10E except for the addition of the connection electrode 1049 and the connection electrode 1048 in FIG. 10F. The connection electrode 1049 and the connection electrode 1048 are disposed above the insulator layer 1006. The connection electrode 10469 is electrically connected to the first capacitor electrode AM8. In such cases, the connection electrode 1047 is electrically connected to the connection electrode 1049. Therefore, the connection electrode 1047 is indirectly electrically connected to the capacitor electrode AM8. Additionally, the first drain electrode 1042 utilizes the connection electrode 1048 to indirectly electrically connect to the blocking layer 1005E.

Figure 11A:
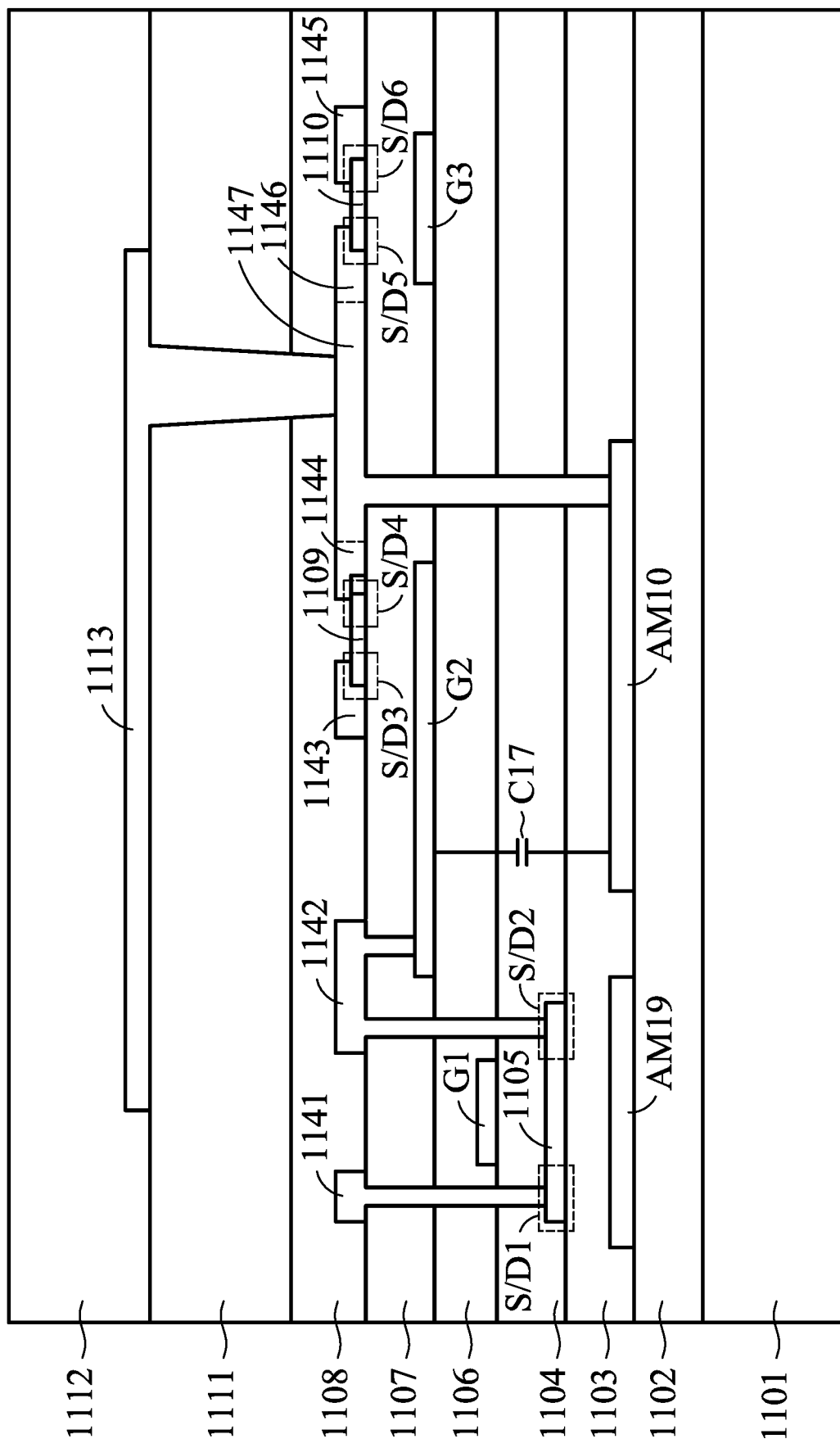
FIG. 11A is a schematic diagram of another exemplary embodiment of the semiconductor structure of the pixel, according to various aspects of the present disclosure.

FIG. 11A is a schematic diagram of another exemplary embodiment of the semiconductor structure of the pixel, according to various aspects of the present disclosure. The insulator layer 1102 is formed on the substrate 1101. The first capacitor electrode AM19 and the second capacitor electrode AM10 are disposed above the insulator layer 1102. In this embodiment, the first capacitor electrode AM19 does not electrically connect to the second capacitor electrode AM10. The insulator layer 1103 is formed on the first capacitor electrode AM19 and the second capacitor electrode AM10.

The first semiconductor layer 1105 is disposed above the insulator layer 1103. The first semiconductor layer 1105 overlaps the first capacitor electrode AM9 and comprises the first source/drain region S/D1 and the second source/drain region S/D2. In one embodiment, the material of the first semiconductor layer 1105 is LTPS. The insulator layer 1104 is formed on the first semiconductor layer 1105. The first gate electrode G1 is disposed above the insulator layer 1104. The first gate electrode G1 and the first semiconductor layer 1105 overlap. The insulator layer 1106 is formed on the first gate electrode G1.

The second gate electrode G2 and the third gate electrode G3 are disposed above the insulator layer 1106. In this embodiment, the second gate electrode G2 and the second capacitor electrode AM10 overlap. Therefore, the second gate electrode G2, the insulator layer 1106, the insulator layer 1104, the insulator layer 1103, and the second capacitor electrode AM10 constitute a capacitor C17. The insulator layer 1107 is formed on the second gate electrode G2 and the third gate electrode G3.

The second semiconductor layer 1109 and the third semiconductor layer 1110 are disposed above the insulator layer 1107. The second semiconductor layer 1109 overlaps the second gate electrode G2 and comprises the third source/drain region S/D3 and the fourth source/drain region S/D4. The third semiconductor layer 1110 overlaps the third gate electrode G3 and comprises the fifth source/drain region S/D5 and the sixth source/drain region S/D6. In one embodiment, the material of each of the second semiconductor layer 1109 and the third semiconductor layer 1110 is IGZO.

The first source electrode 1141, the first drain electrode 1142, the second source electrode 1143, the second drain electrode 1144, the connection electrode 1147, the third source electrode 1146, and the third drain electrode 1145 are disposed above the insulator layer 1107. As shown in FIG. 11A, the first source electrode 1141 is electrically connected to the first source/drain region S/D1. The first drain electrode 1142 is electrically connected to the second source/drain region S/D2 and the second gate electrode G2. In this embodiment, the first gate electrode G1, the first source electrode 1141, and the first drain electrode 1142 constitute a first transistor. In such cases, the first capacitor electrode AM19 serves as a blocking layer of the first transistor.

The second source electrode 1143 is electrically connected to the third source/drain region S/D3. The second drain electrode 1144 is electrically connected to the fourth source/drain region S/D4. In this embodiment, the second gate electrode G2, the second source electrode 1143, and the second drain electrode 1144 constitute a second transistor. The connection electrode 1147 is electrically connected to the second drain electrode 1144, the third source electrode 1146, and the second capacitor electrode AM10. The third source electrode 1146 is electrically connected to the fifth source/drain region S/D5. The third drain electrode 1145 is electrically connected to the sixth source/drain region S/D6. In this embodiment, the third gate electrode G3, the third source electrode 1146, and the third drain electrode 1145 constitute a third transistor.

The insulator layer 1108 is formed on the first source electrode 1141, the first drain electrode 1142, the second source electrode 1143, the second semiconductor layer 1109, the second drain electrode 1144, the connection electrode 1147, the third source electrode 1146, the third semiconductor layer 1110, and the third drain electrode 1145. The insulator layer 1111 is formed on the insulator layer 1108. The OLED 1122 is formed on the insulator layer 1111. The disclosure is not limited by the semiconductor structure of the OLED display device. Any semiconductor structure of an OLED display device can be applied to FIG. 11A. In this embodiment, the electrode 1113 of the OLED is electrically connected to the connection electrode 1147, but the disclosure is not limited thereto.

Figure 11B:
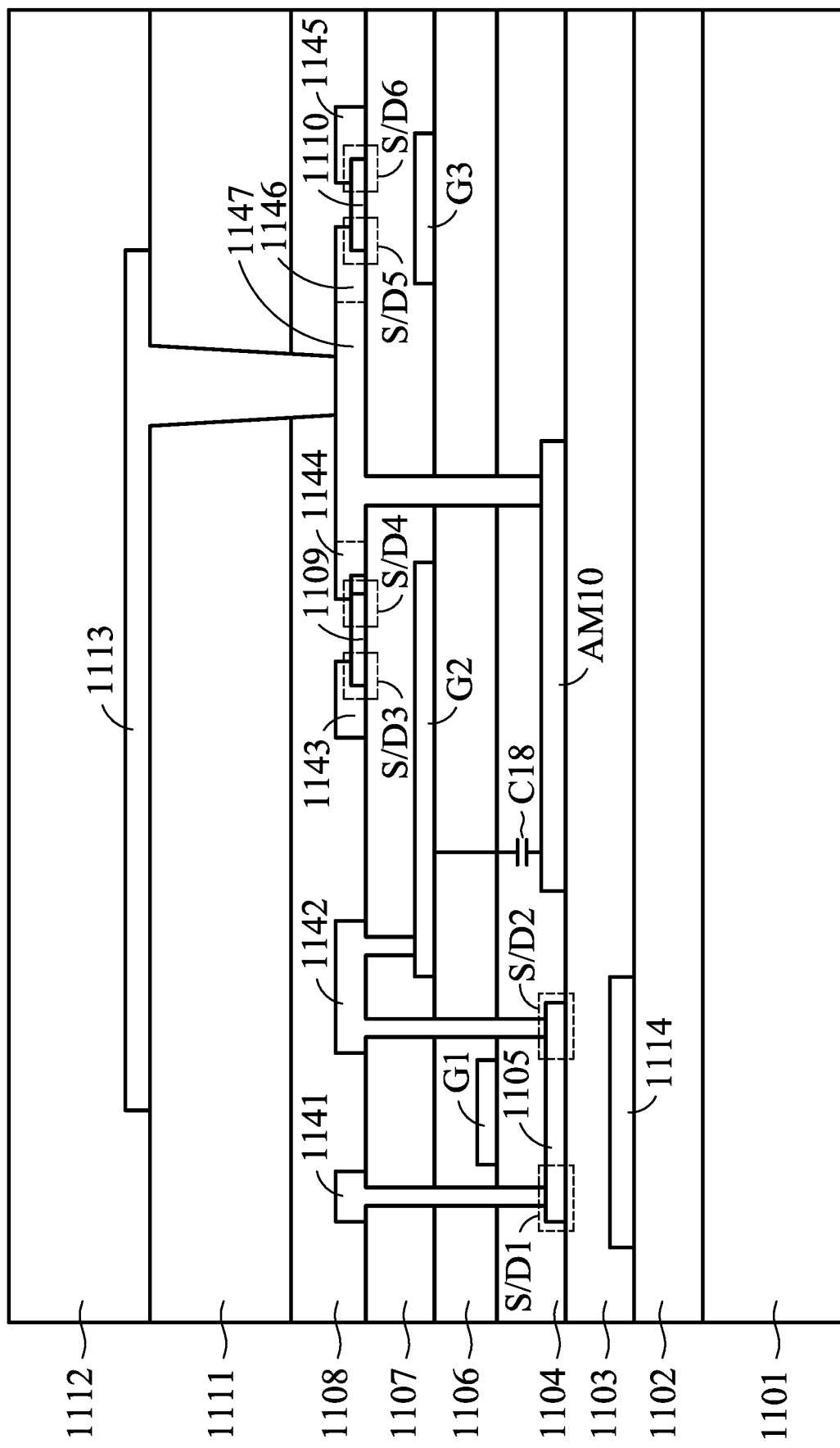
FIG. 11B is a schematic diagram of another exemplary embodiment of the semiconductor structure of the pixel, according to various aspects of the present disclosure.

FIG. 11B is a schematic diagram of another exemplary embodiment of the semiconductor structure of the pixel, according to various aspects of the present disclosure. FIG. 11B is similar to FIG. 11A except for the addition of the blocking layer 1114 in FIG. 11B. The blocking layer 1114 is formed on the insulator layer 1102 and overlaps the first semiconductor layer 1105. Additionally, in this embodiment, the second capacitor electrode AM10 and the first semiconductor layer 1105 are disposed in the same insulator layer, such as 1104. In this embodiment, the second gate electrode G2, the insulator layer 1106, the insulator layer 1104, and the second capacitor electrode AM10 constitute a capacitor C18.

Figure 11C:
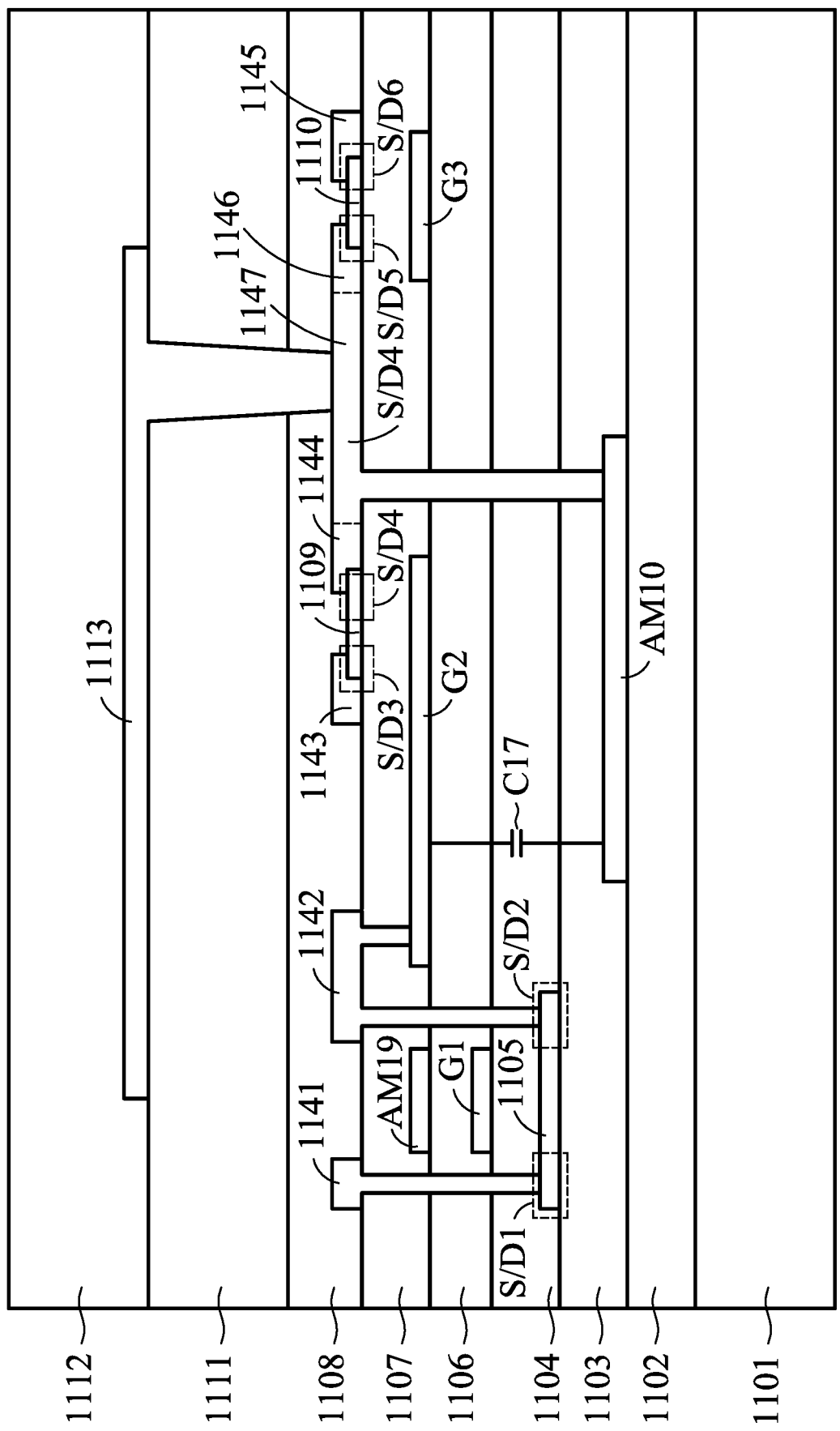
FIG. 11C is a schematic diagram of another exemplary embodiment of the semiconductor structure of the pixel, according to various aspects of the present disclosure.

FIG. 11C is a schematic diagram of another exemplary embodiment of the semiconductor structure of the pixel, according to various aspects of the present disclosure. FIG. 11C is similar to FIG. 11A except that the first capacitor electrode AM19 shown in FIG. 11C is disposed between the first gate electrode G1 and at least one of the first source electrode 1141 and the first drain electrode 1142. In this embodiment, the first capacitor electrode AM19 overlaps the first gate electrode G1 and the electrode 1113. In one embodiment, the material of the first capacitor electrode AM19 is the same as the material of the second gate electrode G2. In another embodiment, the absolute value of the voltage level of the first capacitor electrode AM19 is greater than 0.

Figure 12:
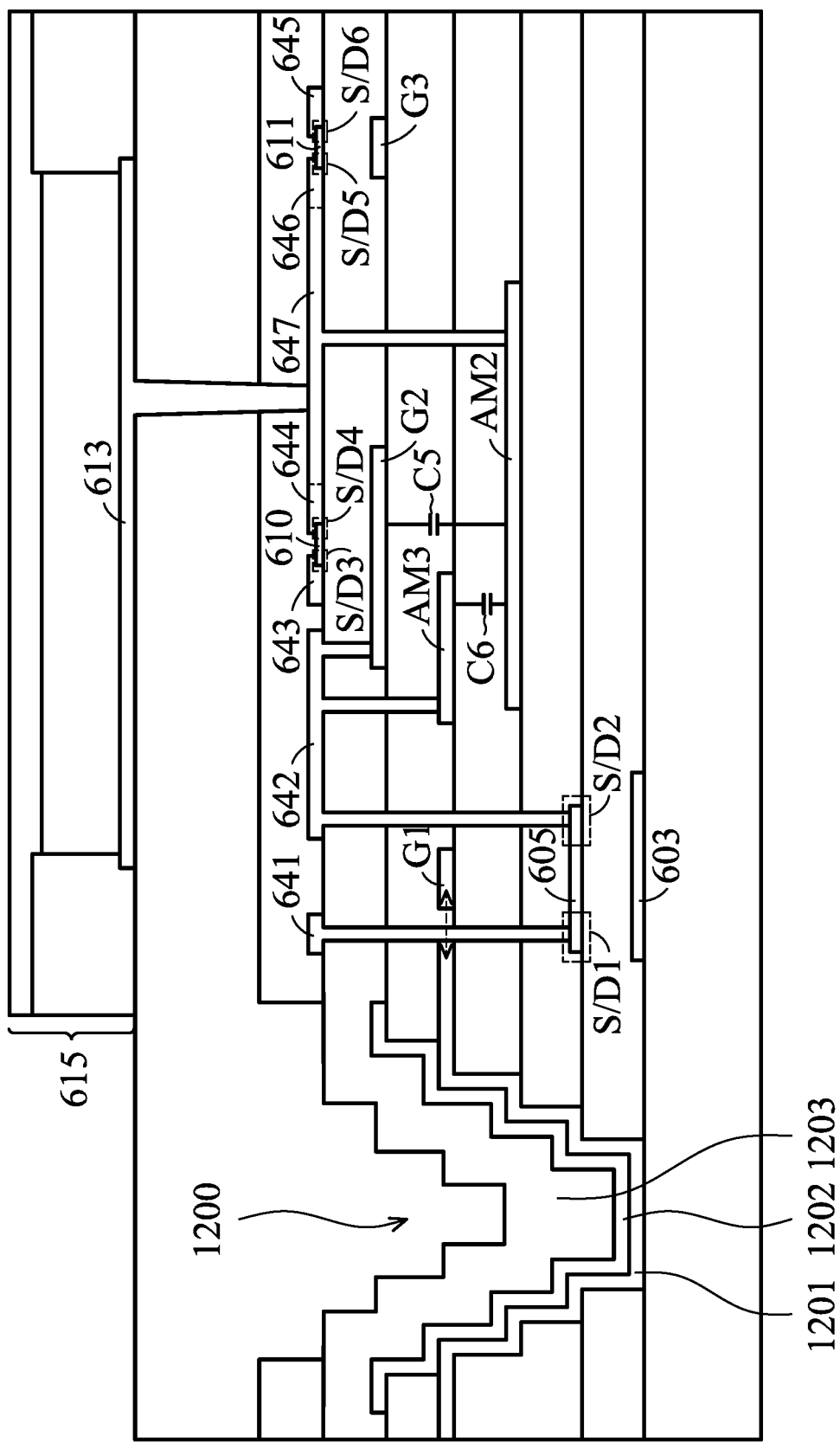
FIG. 12 is a schematic diagram of another exemplary embodiment of the semiconductor structure of the pixel, according to various aspects of the present disclosure.

FIG. 12 is a schematic diagram of another exemplary embodiment of the semiconductor structure of the pixel, according to various aspects of the present disclosure. FIG. 12 is similar to FIG. 6 except for the addition of the electrode 1201, the electrode 1202, and the electrode 1203 in FIG. 12. As shown in FIG. 12, the electrode 1201, the electrode 1202, and the electrode 1203 are electrically connected together, wherein the electrode 1202 is electrically connected to the first gate electrode G1. In one embodiment, the electrode 1202 is coupled to a gate driver, such as the gate driver 110 shown in FIG. 1. Many electrodes are electrically connected to the electrode 1202 to avoid that the electrode 1202 cannot normally transmit scan signal to the first gate electrode G1 when the electrode 1202 is broken. In this embodiment, the electrode 1201, the electrode 1202, and the electrode 1203 are located in a notch 1200. The notch 1200 is configured to increase the flexibility of the semiconductor structure shown in FIG. 12.

Figure 13:
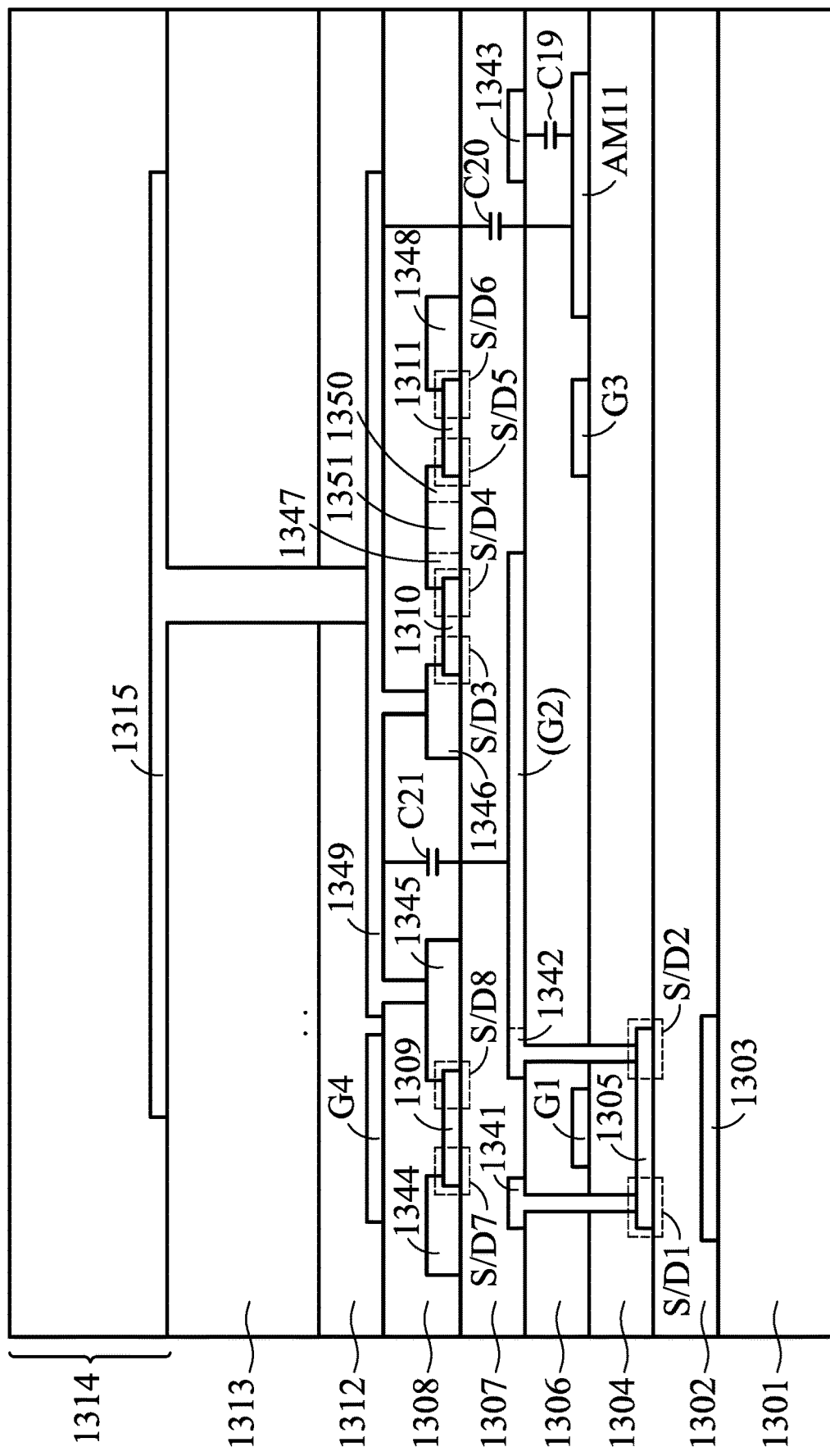
FIG. 13 is a schematic diagram of another exemplary embodiment of the semiconductor structure of the pixel, according to various aspects of the present disclosure.

FIG. 13 is a schematic diagram of another exemplary embodiment of the semiconductor structure of the pixel, according to various aspects of the present disclosure. The blocking layer 1303 is disposed above the substrate 1301. The insulator layer 1302 is formed on the blocking layer 1303. The first semiconductor layer 1305 is disposed above the insulator layer 1302. The first semiconductor layer 1305 overlaps the blocking layer 1303 and comprises the first source/drain region S/D1 and the second source/drain region S/D2. In one embodiment, the material of the first semiconductor layer 1305 is LTPS. The insulator layer 1304 is formed on the first semiconductor layer 1305.

The first gate electrode G1, the third gate electrode G3, and the first capacitor electrode AM11 are formed on the insulator layer 1304. The first gate electrode G1 and the first semiconductor layer 1305 overlap. The insulator layer 1306 is formed on the first gate electrode G1, the third gate electrode G3, and the first capacitor electrode AM11. The first source electrode 1341, the first drain electrode 1342, the second gate electrode G2, and the connection electrode 1343 are disposed above the insulator layer 1306. The first source electrode 1341 is electrically connected to the first source/drain region S/D1. The first drain electrode 1342 is electrically connected to the second source/drain region S/D2. In this embodiment, the first gate electrode G1, the first source electrode 1341, and the first drain electrode 1342 constitute a first transistor. The connection electrode 1343 and the first capacitor electrode AM11 overlap. Therefore, the connection electrode 1343, the insulator layer 1306, and the first capacitor electrode AM11 constitute a capacitor C19. In one embodiment, the capacitor C19 is capable of serving as the auxiliary capacitor 250 shown in FIG. 2B or FIG. 2C or serving as the auxiliary capacitor 360 shown in FIG. 3B, FIG. 3C or FIG. 3D. In such cases, the absolute value of the electrical potential of the first capacitor electrode AM11 may be greater than 0. In another embodiment, the connection electrode 1343 is electrically connected to the second gate electrode G2.

The insulator layer 1307 is formed on the first source electrode 1341, the first drain electrode 1342, the second gate electrode G2, and the connection electrode 1343. The second semiconductor layer 1310, the third semiconductor layer 1311, and the fourth semiconductor layer 1309 are disposed above the insulator layer 1307. The fourth semiconductor layer 1309 comprises the seventh source/drain region S/D7 and the eighth source/drain region S/D8. In one embodiment, the material of the fourth semiconductor layer 1309 is IGZO. The second semiconductor layer 1310 overlaps the second gate electrode G2 and comprises the third source/drain region S/D3 and the fourth source/drain region S/D4. In one embodiment, the material of the second semiconductor layer 1310 is IGZO. The third semiconductor layer 1311 overlaps the third gate electrode G3 and comprises the fifth source/drain region S/D5 and the sixth source/drain region S/D6. In one embodiment, the material of the third semiconductor layer 1311 is IGZO.

The second source electrode 1346, the second drain electrode 1347, the connection electrode 1351, the third source electrode 1350, the third drain electrode 1348, the seventh source/drain electrode 1344, and the eighth source/drain electrode 1345 are disposed above the insulator layer 1307. In this embodiment, the seventh source/drain electrode 1344 is electrically connected to the seventh source/drain region S/D7. The eighth source/drain electrode 1345 is electrically connected to the eighth source/drain region S/D8. The second source electrode 1346 is electrically connected to the third source/drain region S/D3. The second drain electrode 1347 is electrically connected to the fourth source/drain region S/D4. In this embodiment, the second gate electrode G2, the second source electrode 1346, and the second drain electrode 1347 constitute a second transistor. The connection electrode 1351 is electrically connected to the second drain electrode 1347 and the third source electrode 1350. The third source electrode 1350 is electrically connected to the fifth source/drain region S/D5. The third drain electrode 1348 is electrically connected to the sixth source/drain region S/D6. In this embodiment, the third gate electrode G3, the third source electrode 1350, and the third drain electrode 1348 constitute a third transistor.

The insulator layer 1308 is formed on the seventh source/drain electrode 1344, the fourth semiconductor layer 1309, the eighth source/drain electrode 1345, the second source electrode 1346, the second semiconductor layer 1310, the second drain electrode 1347, the connection electrode 1351, the third source electrode 1350, the third semiconductor layer 1311, and the third drain electrode 1348. The fourth gate electrode G4 and the connection electrode 1349 are disposed above the insulator layer 1308. The fourth gate electrode G4 and the fourth semiconductor layer 1309 overlap. In this embodiment, the fourth gate electrode G4, the seventh source/drain electrode 1344, and the eighth source/drain electrode 1345 constitute a fourth transistor. The connection electrode 1349 is electrically connected to the eighth source/drain electrode 1345 and the second source electrode 1346. Since the connection electrode 1349 and the first capacitor electrode AM11 overlap, the connection electrode 1349, the insulator layer 1308, the insulator layer 1307, the insulator layer 1306, and the first capacitor electrode AM11 constitute a capacitor C20. In one embodiment, the capacitor C20 is capable of serving as the auxiliary capacitor 260 shown in FIG. 2C or serving as the auxiliary capacitor C370 shown in FIG. 3C or FIG. 3D. In such cases, the electrical potential of the capacitor electrode AM11 is controlled to stabilize the electrical potentials of the connection electrode 1349 and the connection electrode 1343. Furthermore, the connection electrode 1349, the insulator layer 1308, the insulator layer 1307, and the first drain electrode 1342 constitute a capacitor C21. In one embodiment, the capacitor C21 is capable of serving as the storage capacitor Cst shown in FIG. 2A, FIG. 2B, FIG. 2C, or FIG. 2D or serving as the storage capacitor Cst1 shown in FIG. 3A, FIG. 3B, FIG. 3C, or FIG. 3D.

The insulator layer 1312 is formed on the fourth gate electrode G4 and the connection electrode 1349. The insulator layer 1313 is formed on the insulator layer 1312. The OLED 1349 is formed on the insulator layer 1313. The disclosure is not limited by the semiconductor layer of the OLED display device. Any semiconductor layer of an OLED display device can be applied in FIG. 13. In this embodiment, the electrode 1315 of the OLED 1314 is electrically connected to the connection electrode 1349, but the disclosure is not limited thereto.

Figure 14:
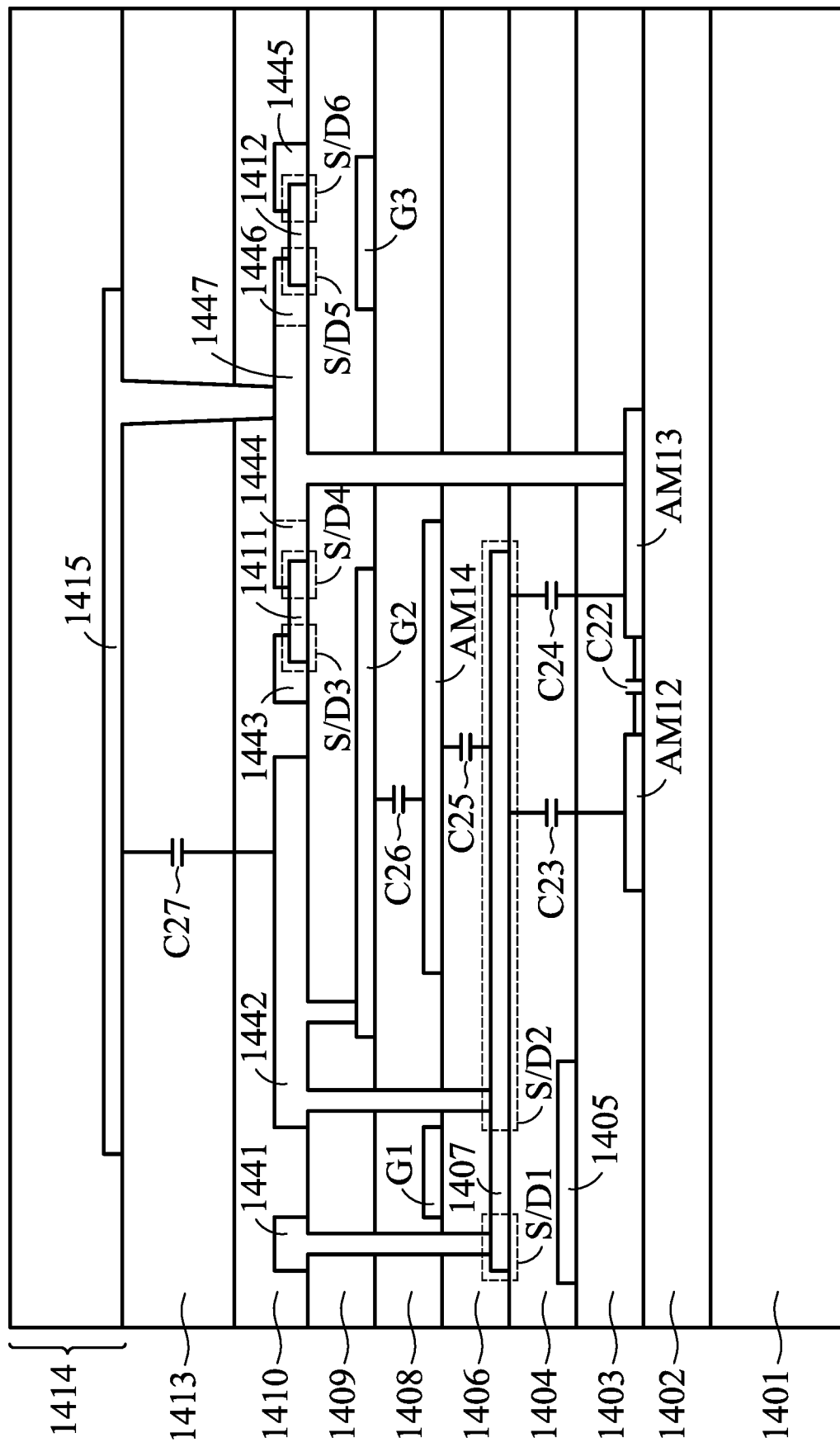
FIG. 14 is a schematic diagram of another exemplary embodiment of the semiconductor structure of the pixel, according to various aspects of the present disclosure.

FIG. 14 is a schematic diagram of another exemplary embodiment of the semiconductor structure of the pixel, according to various aspects of the present disclosure. The insulator layer 1402 is formed on the substrate 1401. The first capacitor electrode AM12 and the second capacitor electrode AM13 are disposed above the insulator layer 1402. The insulator layer 1403 is formed on the first capacitor electrode AM12 and the second capacitor electrode AM13. In this embodiment, the first capacitor electrode AM12, the insulator layer 1403, and the second capacitor electrode AM13 constitute a capacitor C22. In one embodiment, the capacitor C22 serves as the auxiliary capacitor 250 shown in FIG. 2B or FIG. 2C or serves as the auxiliary capacitor 360 shown in FIG. 3B, FIG. 3C, or FIG. 3D.

The blocking layer 1405 is disposed above the insulator layer 1403. The insulator layer 1404 is formed on the blocking layer 1405. The first semiconductor layer 1407 is formed on the insulator layer 1404. The first semiconductor layer 1407 overlaps the blocking layer 1405 and comprises the first source/drain region S/D1 and the second source/drain region S/D2. In this embodiment, the second source/drain region S/D2 overlaps the blocking layer 1405, the first capacitor electrode AM12 and the second capacitor electrode AM13. Therefore, the second source/drain region S/D2, the insulator layer 1404, the insulator layer 1403, and the first capacitor electrode AM12 constitute a capacitor C23. In one embodiment, the capacitor C23 serves as the auxiliary capacitor 260 shown in FIG. 2C or serves as the auxiliary capacitor 370 shown in FIG. 3C or FIG. 3D. Additionally, the second source/drain region S/D2, the insulator layer 1404, the insulator layer 1403, and the second capacitor electrode AM13 constitute a capacitor C24.

The insulator layer 1406 is formed on the first semiconductor layer 1407. The first gate electrode G1 and the third capacitor electrode AM14 are disposed above the insulator layer 1406. The first gate electrode G1 and the first semiconductor layer 1407 overlap. Since the third capacitor electrode AM14 overlaps the second source/drain region S/D2, the third capacitor electrode AM14, the insulator layer 1406, and the second source/drain region S/D2 constitute a capacitor C25.

The insulator layer 1408 is formed on the first gate electrode G1 and the third capacitor electrode AM14. The second gate electrode G2 and the third gate electrode G3 are disposed above the insulator layer 1408. Since the second gate electrode G2 overlaps the third capacitor electrode AM14, the second gate electrode G2, the insulator layer 1408, and the third capacitor electrode AM14 constitute a capacitor C26. The insulator layer 1409 is formed on the second gate electrode G2 and the third gate electrode G3.

The second semiconductor layer 1411 and the third semiconductor layer 1412 are disposed above the insulator layer 1409. The second semiconductor layer 1411 overlaps the second gate electrode G2 and comprises the third source/drain region S/D3 and the fourth source/drain region S/D4. In one embodiment, the material of the second semiconductor layer 1411 is IGZO. The third semiconductor layer 1412 overlaps the third gate electrode G3 and comprises the fifth source/drain region S/D5 and the sixth source/drain region S/D6. In one embodiment, the material of the third semiconductor layer 1412 is IGZO.

The first source electrode 1441, the first drain electrode 1442, the second source electrode 1443, the second drain electrode 1444, the connection electrode 1447, the third source electrode 1446, and the third drain electrode 1445 are disposed above the insulator layer 1409. In this embodiment, the first source electrode 1441 is electrically connected to the first source/drain region S/D1. The first drain electrode 1442 is electrically connected to the second source/drain region S/D2 and the second gate electrode G2. In this embodiment, the first gate electrode G1, the first source electrode 1441, and the first drain electrode 1442 constitute a first transistor. The second source electrode 1443 is electrically connected to the third source/drain region S/D3. The second drain electrode 1444 is electrically connected to the fourth source/drain region S/D4. In this embodiment, the second gate electrode G2, the second source electrode 1443, and the second drain electrode 1444 constitute a second transistor. The connection electrode 1447 is electrically connected to the second drain electrode 1444, the second capacitor electrode AM13, and the third source electrode 1446. The third source electrode 1446 is electrically connected to the fifth source/drain region S/D5. The third drain electrode 1445 is electrically connected to the sixth source/drain region S/D6. In this embodiment, the third gate electrode G3, the third source electrode 1446, and the third drain electrode 1445 constitute a third transistor.

The insulator layer 1410 is formed on the first source electrode 1441, the first drain electrode 1442, the second source electrode 1443, the second semiconductor layer 1411, the second drain electrode 1444, the connection electrode 1447, the third source electrode 1446, the third semiconductor layer 1412, and the third drain electrode 1445. The insulator layer 1413 is formed on the insulator layer 1410. The OLED is formed on the insulator layer 1413. The disclosure is not limited by the semiconductor layer of the OLED display device. Any semiconductor layer of an OLED display device can be applied in FIG. 14. In this embodiment, the electrode 1415 of the OLED 1414 is electrically connected to the connection electrode 1447, but the disclosure is not limited thereto. Additionally, the electrode 1415, the insulator layer 1413, the insulator layer 1410, and the first drain electrode 1442 constitute a capacitor C27. In one embodiment, the capacitor C24, the capacitor C25, the capacitor C26, or the capacitor C27 serves as the storage capacitor Cst shown in FIG. 2A, FIG. 2B, FIG. 2C, or FIG. 2D or serves as the storage capacitor Cst1 shown in FIG. 3A, FIG. 3B, FIG. 3C, or FIG. 3D.

Figure 15:
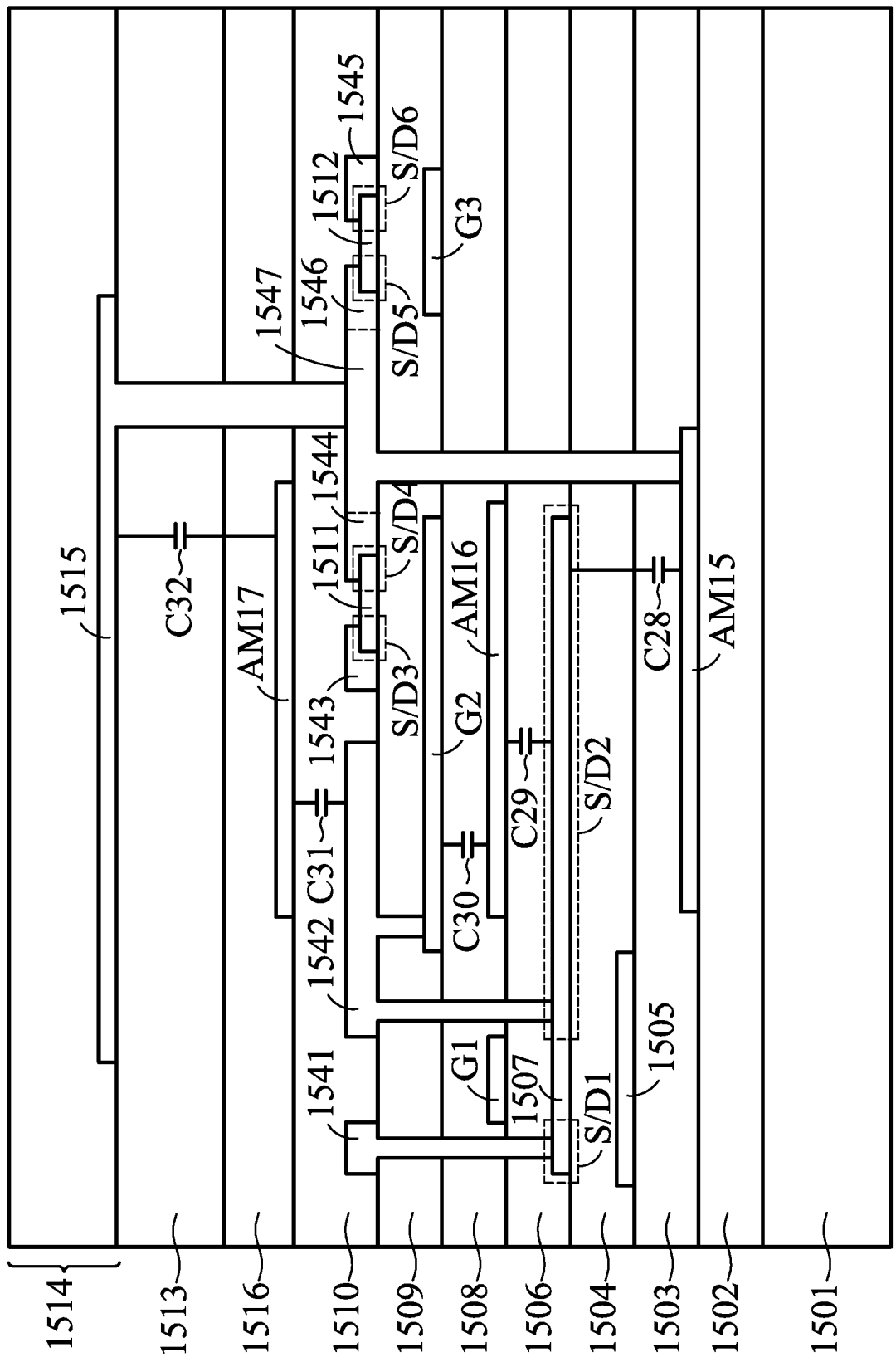
FIG. 15 is a schematic diagram of another exemplary embodiment of the semiconductor structure of the pixel, according to various aspects of the present disclosure.

FIG. 15 is a schematic diagram of another exemplary embodiment of the semiconductor structure of the pixel, according to various aspects of the present disclosure. In this embodiment, the insulator layer 1502 is formed on the substrate 1501. The first capacitor electrode AM 15 is disposed above the insulator layer 1502. The insulator layer 1503 is formed on the first capacitor electrode AM15. The blocking layer 1505 is disposed above the insulator layer 1503. The insulator layer 1504 is formed on the blocking layer 1505. The first semiconductor layer 1507 is disposed above the insulator layer 1504. The first semiconductor layer 1507 overlaps the blocking layer 1505 and comprises the first source/drain region S/D1 and the second source/drain region S/D2. In this embodiment, the second source/drain region S/D2 and the first capacitor electrode AM15 overlap. Therefore, the second source/drain region S/D2, the insulator layer 1504, the insulator layer 1503, and the first capacitor electrode AM 15 constitute a capacitor C28.

The insulator layer 1506 is disposed above the first semiconductor layer 15070 the first gate electrode G1 and the second capacitor electrode AM16 are disposed above the insulator layer 1506. The first gate electrode G1 and the first semiconductor layer 1507 overlap. The second capacitor electrode AM16 and the second source/drain region S/D2 overlap. Therefore, a capacitor C29 is formed between the second capacitor electrode AM16 and the second source/drain region S/D2. The insulator layer 1508 is disposed above the first gate electrode G1 and the second capacitor electrode AM16.

The second gate electrode G2 and the third gate electrode G3 are disposed above the insulator layer 1508. The second gate electrode G2 and the second capacitor electrode AM16 overlap. Therefore, a capacitor C30 is formed between the second gate electrode G2 and the second capacitor electrode AM16. The insulator layer 1509 is disposed above the second gate electrode G2 and the third gate electrode G3.

The second semiconductor layer 1511 and the third semiconductor layer 1512 are disposed above the insulator layer 1509. The second semiconductor layer 1511 overlaps the second gate electrode G2 and comprises the third source/drain region S/D3 and the fourth source/drain region S/D4. The third semiconductor layer 1512 overlaps the third gate electrode G3 and comprises the fifth source/drain region S/D5 and the sixth source/drain region S/D6.

The first source electrode 1541, the first drain electrode 1542, the second source electrode 1543, the second drain electrode 1544, the connection electrode 1547, the third source electrode 1546, and the third drain electrode 1545 are disposed above the insulator layer 1509. The first source electrode 1541 is electrically connected to the first source/drain region S/D1. The first drain electrode 1542 is electrically connected to the second source/drain region S/D2 and the second gate electrode G2. In this embodiment, the first gate electrode G1, the first source electrode 1541, and the first drain electrode 1542 constitute a first transistor. The second source electrode 1543 is electrically connected to the third source/drain region S/D3. The second drain electrode 1544 is electrically connected to the fourth source/drain region S/D4. In this embodiment, the second gate electrode G2, the second source electrode 1543, and the second drain electrode 1544 constitute a second transistor. The connection electrode 1547 is electrically connected to the second drain electrode 1544, the first capacitor electrode AM 15, and the third source electrode 1546. The third source electrode 1546 is electrically connected to the fifth source/drain region S/D5. The third drain electrode 1545 is electrically connected to the sixth source/drain region S/D6. In this embodiment, the third gate electrode G3, the third source electrode 1546, and the third drain electrode 1545 constitute a third transistor.

The insulator layer 1510 is disposed above the first source electrode 1541, the first drain electrode 1542, the second source electrode 1543, the second drain electrode 1544, the connection electrode 1547, the third source electrode 1546, and the third drain electrode 1545. The third capacitor electrode AM 17 is disposed above the insulator layer 1510. In this embodiment, the third capacitor electrode AM17 and the first drain electrode 1542 overlap. Therefore, the third capacitor electrode AM17, the insulator layer 1510, and the first drain electrode 1542 constitute a capacitor C31. The insulator layer 1516 is disposed above the third capacitor electrode AM17. The insulator layer 1513 is formed on the insulator layer 1516. The OLED 1514 is formed on the insulator layer 1513. The disclosure is not limited by the semiconductor layer of the OLED display device. Any semiconductor layer of an OLED display device can be applied in FIG. 15. In this embodiment, the electrode 1515 of the OLED 1514 is electrically connected to the connection electrode 1547, but the disclosure is not limited thereto. Additionally, a capacitor C32 is formed between the electrode 1515 and the third capacitor electrode AM17.

In one embodiment, the capacitor C28, the capacitor C29, or the capacitor C30 serves as the storage capacitor Cst shown in FIG. 2A, FIG. 2B, FIG. 2C, or FIG. 2D or serves as the storage capacitor Cst1 shown in FIG. 3A, FIG. 3B, FIG. 3C, or FIG. 3D. additionally, the capacitor C31 is capable of serving as the auxiliary capacitor 250 shown in FIG. 2B or FIG. 2D or serving as the auxiliary capacitor 360 shown in FIG. 3B, FIG. 3C, or FIG. 3D. The capacitor C232 is capable of serving as the auxiliary capacitor 260 shown in FIG. 2C or serving as the auxiliary capacitor 370 shown in FIG. 3C, or FIG. 3D.

Figure 16A:
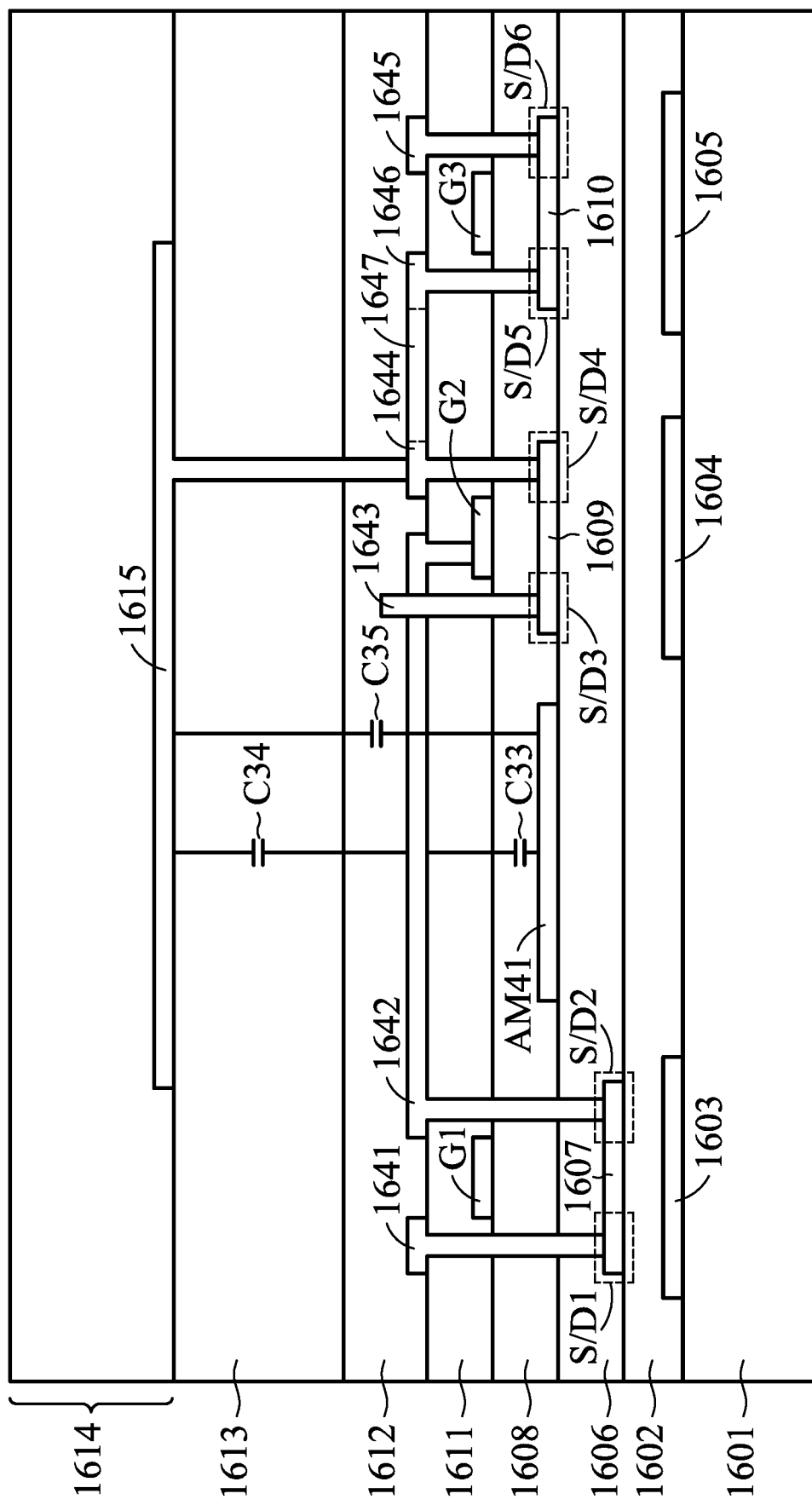
FIG. 16A is a schematic diagram of another exemplary embodiment of the semiconductor structure of the pixel, according to various aspects of the present disclosure.

FIG. 16A is a schematic diagram of another exemplary embodiment of the semiconductor structure of the pixel, according to various aspects of the present disclosure. In this embodiment, the blocking layer 1603, the blocking layer 1604, and the blocking layer 1605 are formed on the substrate 1601. The insulator layer 1602 is disposed above the blocking layer 1603, the blocking layer 1604, and the blocking layer 1605. The first semiconductor layer 1607 is disposed above the insulator layer 1602. The first semiconductor layer 1607 overlaps the blocking layer 1603 and comprises the first source/drain region S/D1 and the second source/drain region S/D2. The insulator layer 1606 is disposed above the first semiconductor layer 1607.

The first capacitor electrode AM41, the second semiconductor layer 1609, and the third semiconductor layer 1610 are disposed above the insulator layer 1606. The second semiconductor layer 1609 overlaps the blocking layer 1604 and comprises the third source/drain region S/D3 and the fourth source/drain region S/D4. The third semiconductor layer 1610 overlaps the blocking layer 1605 and comprises the fifth source/drain region S/D5 and the third drain region S/D6. The insulator layer 1608 is disposed above the first capacitor electrode AM41, the second semiconductor layer 1609, and the third semiconductor layer 1610.

The first gate electrode G1, the second gate electrode G2, and the third gate electrode G3 are disposed above the insulator layer 1608. In one embodiment, the material of the first gate electrode G1 is the same as the material of the first capacitor electrode AM41, but the disclosure is not limited thereto. In this embodiment, the first gate electrode G1 overlaps the first semiconductor layer 1607, the second gate electrode G2 overlaps the second semiconductor layer 1609, and the third gate electrode G3 overlaps the third semiconductor layer 1610. The insulator layer 1611 is disposed above the first gate electrode G1, the second gate electrode G2, and the third gate electrode G3.

The first source electrode 1641, the first drain electrode 1642, the second source electrode 1643, the second drain electrode 1644, the connection electrode 1647, the third source electrode 1646, and the third drain electrode 1645 are disposed above the insulator layer 1611. In this embodiment, the first source electrode 1641 is electrically connected to the first source/drain region S/D1. In one embodiment, the first source electrode 1641 receives a data signal, such as $D_1$. The first drain electrode 1642 is electrically connected to the second source/drain region S/D2 and the second gate electrode G2. In this embodiment, the first gate electrode G1, the first source electrode 1641, and the first drain electrode 1642 constitute a first transistor. Additionally, the first drain electrode 1642 and the first capacitor electrode AM41 overlap. Therefore, the first drain electrode 1642, the insulator layer 1611, the insulator layer 1608, and the first capacitor electrode AM41 constitute a capacitor C33. In one embodiment, the capacitor C33 is capable of serving as the auxiliary capacitor 250 shown in FIG. 2B or serving as the auxiliary capacitor 360 shown in FIG. 3B. The second source electrode 1643 is electrically connected to the third source/drain region S/D3. In one embodiment, the second source electrode 1643 receives an operation voltage, such as Vdd. The second drain electrode 1644 is electrically connected to the fourth source/drain region S/D4. In this embodiment, the second gate electrode G2, the second source electrode 1643, and the second drain electrode 1644 constitute a second transistor. The connection electrode 1647 is electrically connected to the second drain electrode 1644 and the third source electrode 1646. The third source electrode 1646 is electrically connected to the fifth source/drain region S/D5. The third drain electrode 1645 is electrically connected to the sixth source/drain region S/D6. In this embodiment, the third gate electrode G3, the third source electrode 1646, and the third drain electrode 1645 constitute a third transistor. In one embodiment, the third drain electrode 1645 receives a reference voltage, such as Vref.

The insulator layer 1612 is formed on the first source electrode 1641, the first drain electrode 1642, the second source electrode 1643, the second drain electrode 1644, the connection electrode 1647, the third source electrode 1646, and the third drain electrode 1645. The insulator layer 1613 is disposed above the insulator layer 1612. The OLED 1614 is formed on the insulator layer 1613. The disclosure is not limited by the semiconductor layer of the OLED display device. Any semiconductor layer of an OLED display device can be applied in FIG. 16. In this embodiment, the electrode 1615 of the OLED 1614 is electrically connected to the second drain electrode 1644, but the disclosure is not limited thereto.

The electrode 1615, the insulator layer 1612, and the first drain electrode 1642 constitute a capacitor C34. In one embodiment, the capacitor C34 is capable of serving as the storage capacitor Cst shown in FIG. 2A, FIG. 2B, FIG. 2C, or FIG. 2D or serving as the storage capacitor Cst1 shown in FIG. 3A, FIG. 3B, FIG. 3C, or FIG. 3D. Additionally, the electrode 1615, the insulator layer 1613, the insulator layer 1612, the insulator layer 1611, the insulator layer 1618, and the first capacitor electrode AM41 constitute a capacitor C35. In one embodiment, the capacitor C35 is capable of serving as the auxiliary capacitor 260 shown in FIG. 2C or serving as the auxiliary capacitor 370 shown in FIG. 3C, or FIG. 3D. In this embodiment, the first capacitor electrode AM41 is disposed in the insulator layer 1608 disposed between the first gate electrode G1 and the first semiconductor layer 1607.

Figure 16B:
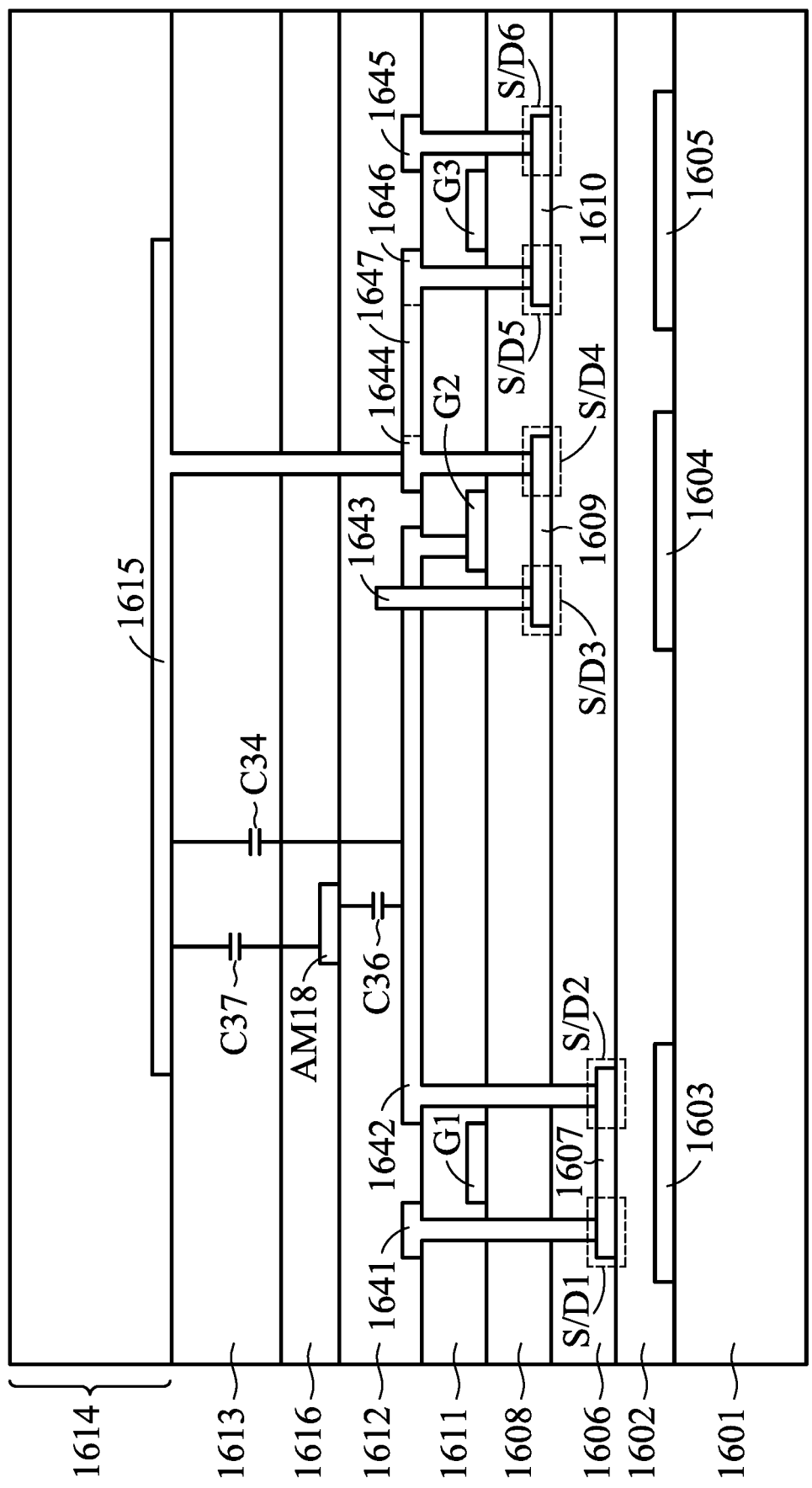
FIG. 16B is a schematic diagram of another exemplary embodiment of the semiconductor structure of the pixel, according to various aspects of the present disclosure.

FIG. 16B is a schematic diagram of another exemplary embodiment of the semiconductor structure of the pixel, according to various aspects of the present disclosure. FIG. 16B is similar to FIG. 16A except for the addition of the first capacitor electrode AM18 in FIG. 16B. The first capacitor electrode AM18 is disposed above the insulator layer 1612. In this embodiment, the first capacitor electrode AM18, the insulator layer 1612, and the first drain electrode 1642 constitute a capacitor C36. In one embodiment, the capacitor C36 is capable of serving as the auxiliary capacitor 250 shown in FIG. 2B or FIG. 2C or serving as the auxiliary capacitor 360 shown in FIG. 3B, FIG. 3C, or FIG. 3D. Additionally, the electrode 1615, the insulator layer 1613, the insulator layer 1616, and the first capacitor electrode AM18 constitute a capacitor C37. In one embodiment, the capacitor C37 is capable of serving as the auxiliary capacitor 260 shown in FIG. 2C or serving as the auxiliary capacitor 370 shown in FIG. 3B, FIG. 3C, or FIG. 3D.

According to the above description, any of the above structures will increase the capacitance of the storage capacitor Cst shown in FIG. 2A, FIG. 2B, FIG. 2C, or FIG. 2D, or form auxiliary capacitor 250 or auxiliary capacitor 260, shown in FIG. 2A, FIG. 2B, FIG. 2C, or FIG. 2D. Similarly, any of the above structures will increase the capacitance of the storage capacitor Cst1 or the storage capacitor Cst2 shown in FIG. 3A, FIG. 3B, FIG. 3C, or FIG. 3D, or form auxiliary capacitor 360 or auxiliary capacitor 370, shown in FIG. 3A, FIG. 3B, FIG. 3C, or FIG. 3D. Taking FIG. 3C as an example, the voltage level of the node A may easily interfere with the data signal $D_1$ to generate crosstalk. However, any of the above structures may be utilized to form auxiliary capacitor 360 and auxiliary capacitor 370 to stabilize the voltage level of the node A to avoid the problem of crosstalk.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

While the disclosure has been described by way of example and in terms of the preferred embodiments, it should be understood that the disclosure is not limited to the disclosed embodiments. On the contrary, it is intended to cover various modifications and similar arrangements (as would be apparent to those skilled in the art). For example, it should be understood that the system, device and method may be realized in software, hardware, firmware, or any combination thereof. Therefore, the scope of the appended claims should be accorded the broadest interpretation so as to encompass all such modifications and similar arrangements.

What is claimed is:

1. A display device, comprising:
   a substrate having a surface;

a first transistor disposed above the surface of the substrate and comprising:
a first semiconductor comprising a silicon semiconductor; and
a first gate electrode overlapping the first semiconductor in view of the normal direction of the surface;
a second transistor disposed above the surface of the substrate and comprising:
a second semiconductor comprising an oxide semiconductor layer;
a capacitor electrode disposed above the first semiconductor; and
a third transistor electrically connected to the capacitor electrode and comprising:
a third semiconductor comprising an oxide semiconductor; and
a third gate electrode overlapping the third semiconductor in view of the normal direction of the surface,
wherein the capacitor electrode overlaps the first gate electrode in view of the normal direction of the surface.

2. The display device as claimed in claim 1, further comprising:
a blocking element, wherein the blocking element and the first semiconductor overlap.

3. The display device as claimed in claim 2, wherein a material of the capacitor electrode is the same as a material of the blocking element.

4. The display device as claimed in claim 1, comprising:
an organic light-emitting diode comprising an anode, wherein the capacitor electrode and the anode overlap.

5. The display device as claimed in claim 4, wherein the capacitor electrode is electrically connected to the anode.

6. The display device as claimed in claim 1, wherein the second transistor comprises:
a second gate electrode overlapping the second semiconductor in view of the normal direction of the surface.

7. The display device as claimed in claim 1, wherein the capacitor electrode is electrically connected to the first semiconductor.

8. The display device as claimed in claim 1, wherein a width of the first gate electrode is greater than a width of the second gate electrode.

* * * * *